United States Patent
Chern et al.

(10) Patent No.: US 6,444,036 B2
(45) Date of Patent: Sep. 3, 2002

(54) CONSTRUCTION OF A FILM ON A SEMICONDUCTOR WAFER

(75) Inventors: Chyi Chern, Saratoga; Michal Danek, Sunnyvale, both of CA (US); Marvin Liao, Singapore (SG); Roderick C. Mosely, Pleasanton; Karl Littau, Palo Alto, both of CA (US); Ivo Raaijmakers, Phoenix, AZ (US); David C. Smith, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/737,681

(22) Filed: Dec. 15, 2000

Related U.S. Application Data

(60) Division of application No. 08/810,221, filed on Feb. 28, 1997, which is a continuation-in-part of application No. 08/339,521, filed on Nov. 14, 1994, now abandoned, and a continuation-in-part of application No. 08/498,990, filed on Jul. 6, 1995, now abandoned, and a continuation-in-part of application No. 08/567,461, filed on Dec. 5, 1995, now abandoned, and a continuation-in-part of application No. 08/677,185, filed on Jul. 9, 1996, now Pat. No. 6,155,198, and a continuation-in-part of application No. 08/677,218, filed on Jul. 9, 1996, now abandoned, and a continuation-in-part of application No. 08/680,913, filed on Jul. 12, 1996, now abandoned.

(51) Int. Cl.[7] .......................... B05C 11/00; H01L 2/144
(52) U.S. Cl. ....................... 118/697; 438/882; 438/627; 438/628; 118/715; 118/719; 118/723
(58) Field of Search ................................. 118/697, 715, 118/719, 723; 438/582, 627, 628

(56) References Cited

U.S. PATENT DOCUMENTS 6,211,065 B1 * 4/2001 Xi et al. ...................... 438/627
6,217,658 B1 * 4/2001 Orczyk et al. .............. 118/697

* cited by examiner

*Primary Examiner*—Hoai V. Ho
*Assistant Examiner*—Reneé Berry
(74) *Attorney, Agent, or Firm*—Moser, Patterson & Sheridan LLP

(57) ABSTRACT

The construction of a film on a wafer, which is placed in a processing chamber, may be carried out through the following steps. A layer of material is deposited on the wafer. Next, the layer of material is annealed. Once the annealing is completed, the material may be oxidized. Alternatively, the material may be exposed to a silicon gas once the annealing is completed. The deposition, annealing, and either oxidation or silicon gas exposure may all be carried out in the same chamber, without need for removing the wafer from the chamber until all three steps are completed. A semiconductor wafer processing chamber for carrying out such an in-situ construction may include a processing chamber, a showerhead, a wafer support and a rf signal means. The showerhead supplies gases into the processing chamber, while the wafer support supports a wafer in the processing chamber. The rf signal means is coupled to the showerhead and the wafer support for providing a first rf signal to the showerhead and a second rf signal to the wafer support.

11 Claims, 49 Drawing Sheets

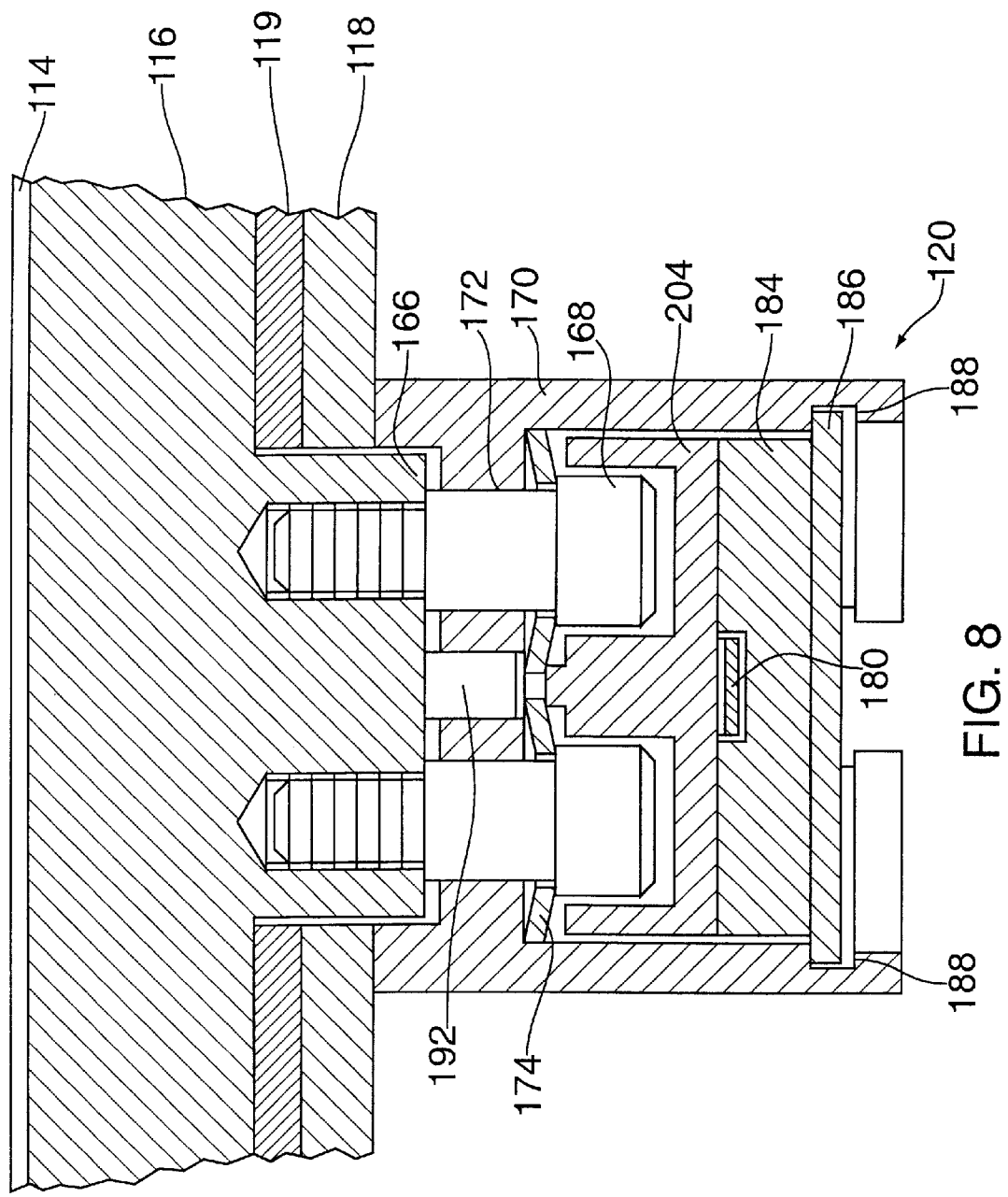

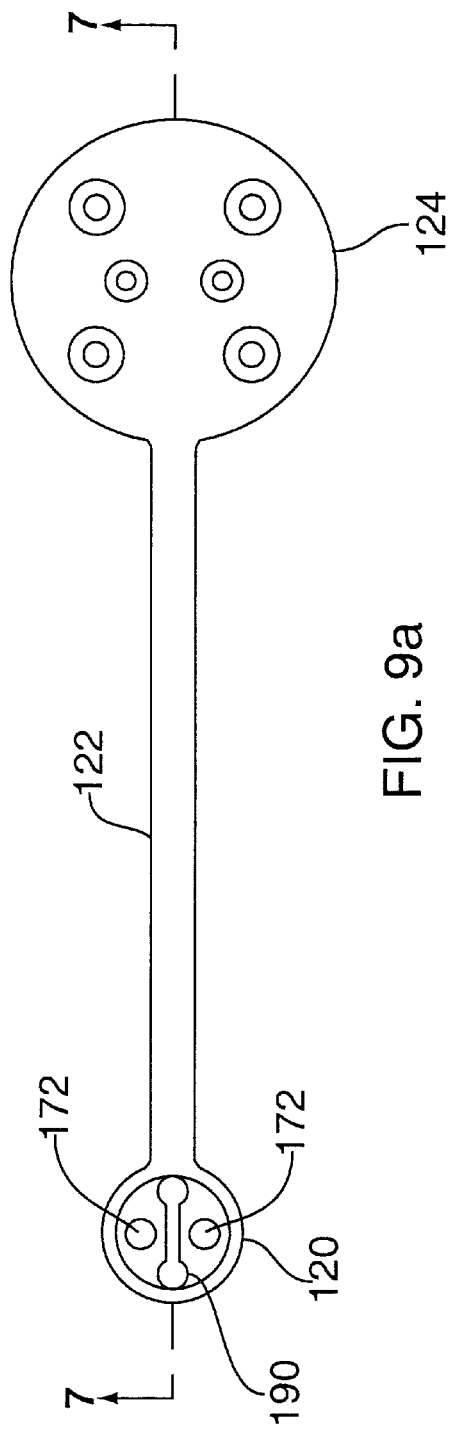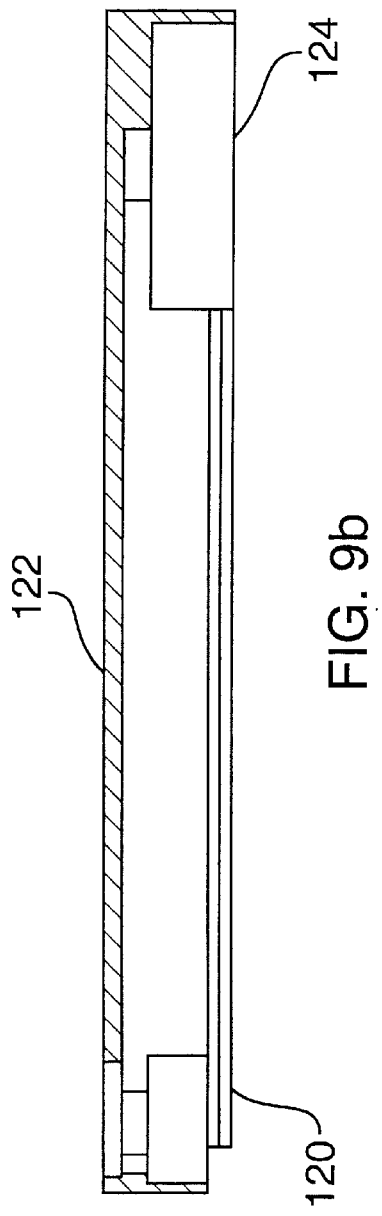
FIG. 9a
FIG. 9b

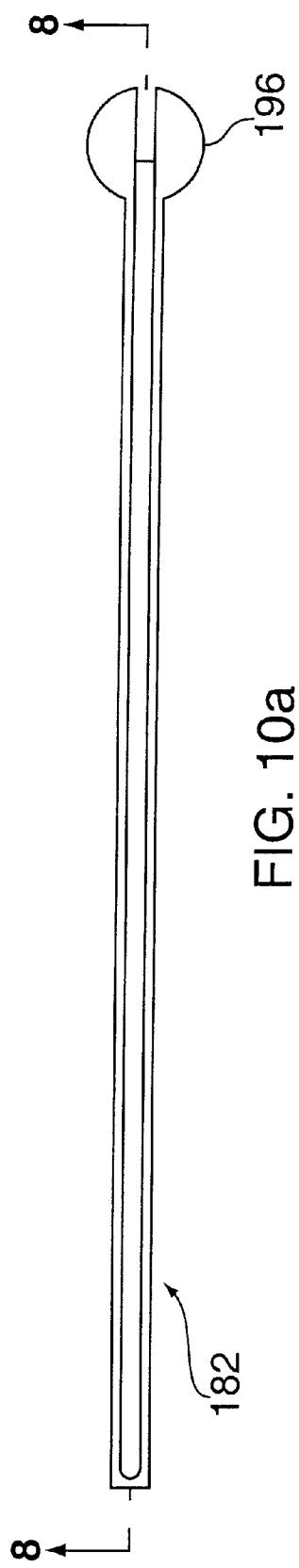
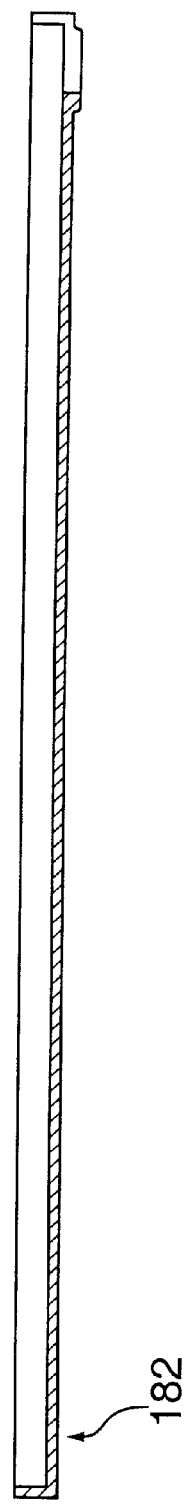
FIG. 10a
FIG. 10b

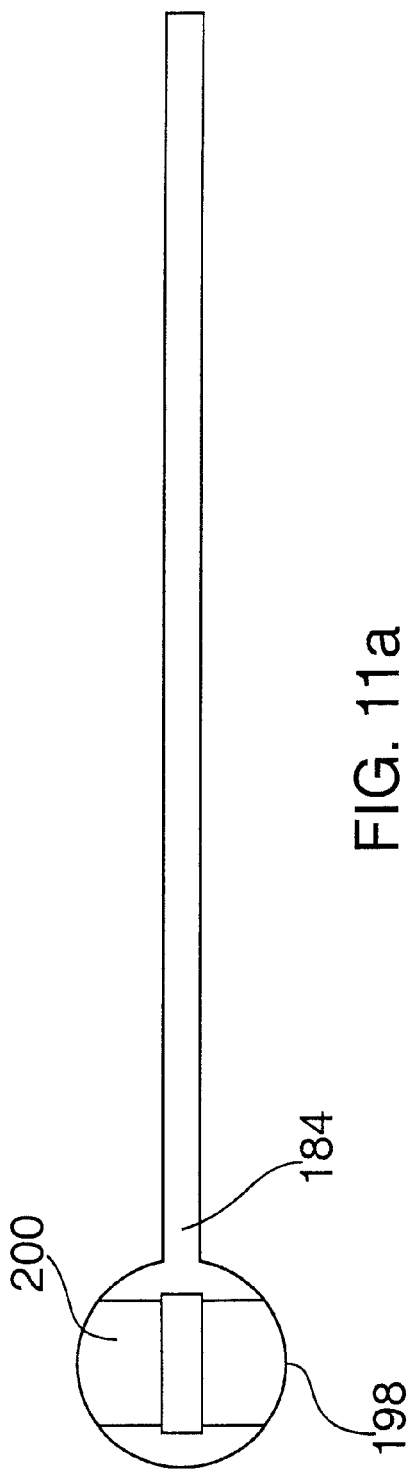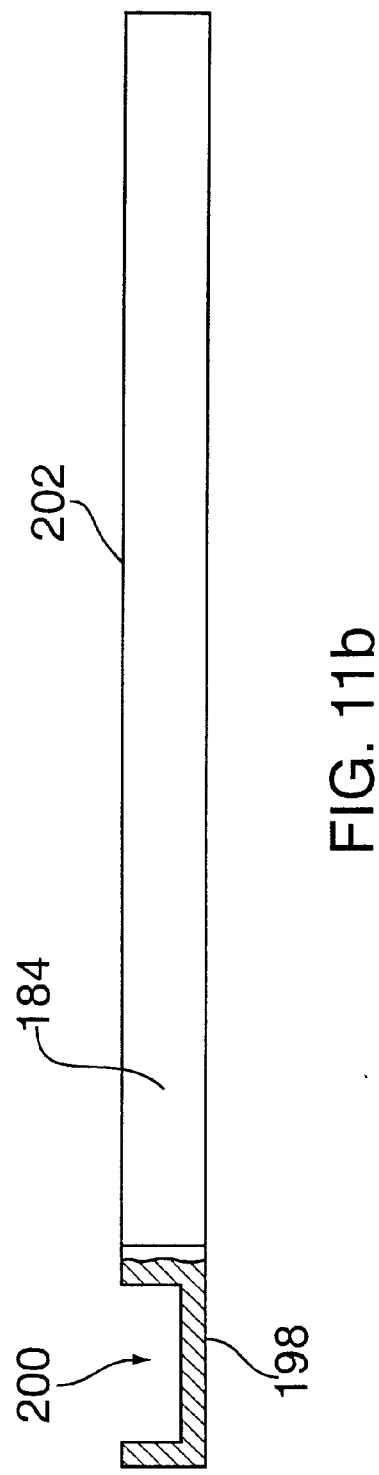

TABLE I

| Example | Description | Thickness Å | Resistivity, μΩ-cm |
|---|---|---|---|
| Control | | ~500 | 16,000 |
| C1 | H$_2$ added | ~500 | 81,200 |
| C2 | NF$_3$ added | ~200 | 2,200 |
| C3 | H$_2$/NF$_3$ added | ~400 | 1x10$^6$ |
| C4 | mixed H$_2$N$_2$ added | ~500 | 39,500 |

Fig. 20

TABLE II

| Sample | Description | Thickness, Å | Resistivity, μΩ-cm |
|---|---|---|---|
| C5 | H₂Plasma Pre/Post | ~500 | 13,500 |
| C6 | N₂Plasma Pre/Post | ~500 | 15,500 |
| C7 | NF₃ Flow Prior to Deposition | ~500 | 16,500 |

FIG. 21

Table III

| Sample | Number of Cycles | Thickness per cycle, Å | Power, Watts | Time, Sec | Total Thickness, Å | Resistivity, μΩ-cm | | Percent Change |
|---|---|---|---|---|---|---|---|---|
| | | | | | | Initial | 24 Hours | |
| Control | 5 | 100 | ---- | ---- | 226 | 11,020 | 25,385 | 130 |
| Ex. 1 | 2 | 500 | 100 | 30 | 731 | 4,620 | 6,623 | 43 |
| Ex. 2 | 3 | 333 | 100 | 30 | 707 | 2,870 | 3,627 | 26 |
| Ex. 3 | 4 | 250 | 100 | 30 | 654 | 2,027 | 2,662 | 31 |
| Ex. 4 | 2 | 500 | 100 | 60 | 579 | 2,762 | 3,827 | 39 |
| Ex. 5 | 3 | 333 | 100 | 60 | 604 | 2,150 | 2,549 | 19 |
| Ex. 6 | 4 | 250 | 100 | 60 | 606 | 1,630 | 1,915 | 17 |
| Ex. 7 | 5 | 100 | 100 | 30 | 376 | 1,154 | 1,203 | 4 |
| Ex. 8 | 5 | 50 | 100 | 30 | 220 | 913 | 933 | 2 |

Fig. 22

Table IV

| Depth, Å | $O_2$, % | $N_2$, % | C, % |
|---|---|---|---|
| 42 | 9.8 | 32.4 | 18.1 |
| 188 | 17.2 | 20.0 | 20.9 |
| 397 | 8.2 | 32.6 | 18.6 |
| 543 | 14.3 | 22.8 | 21.9 |

Fig. 25

Table V

| | |
|---|---|
| Control | $3.48 \times 10^{22}$ cm$^{-3}$ |
| Example 7 | $3.96 \times 10^{22}$ cm$^{-3}$ |
| Example 8 | $3.94 \times 10^{22}$ cm$^{-3}$ |

Fig. 32

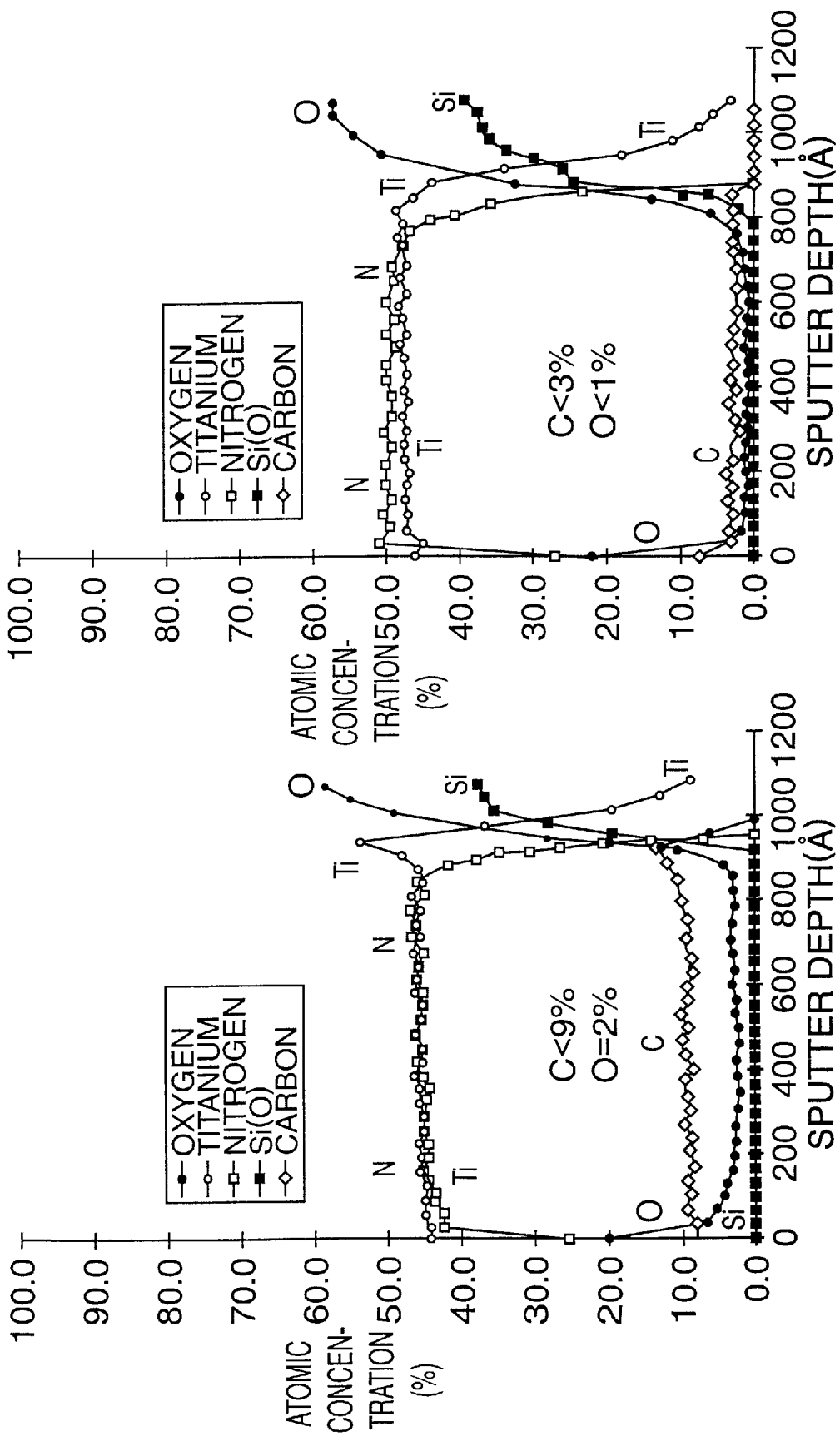

Table VI

| Gas | 2x100 Resistivity (μΩ-cm) | Resistivity Aging @ 50 Hours (%) | Oxygen Concentration (%) | Carbon Concentration (%) |
|---|---|---|---|---|
| $N_2/H_2$ | 570-630 | 11-12 | 12 | 8 |
| $N_2/H_2 + N_2$ | 450-500 | 7-8 | 10.8 | 12 |
| $N_2/He$ | 440-480 | 3-7 | 9.1 | 10.5 |
| $N_2/H_2 + N_2 + N_2/H_2$ | 540-600 | 11-12 | 10.5 | 12.3 |

Fig. 42

| Film Thickness | Sheet Resistance | Sheet Resistance Uniformity Standard Deviation | Substrate Defects |
|---|---|---|---|
| 200 Å (No Oxidation) | 410 Ω/sq. | 2.2 % | Severe |
| 300 Å (No Oxidation) | 235 Ω/sq. | 2.0 % | Severe |
| 200 Å (20 Seconds Oxidation) | 630 Ω/sq. | 3.7 % | Minor |
| 300 Å (30 Seconds Oxidation) | 250 Ω/sq. | 2.7 % | None |

Fig. 44

| Characterization Of Stuffing Versus Deposition | | | | | |
|---|---|---|---|---|---|
| Sample | Resistivity, μΩ-cm | Composition, Atomic Percent | | | |
| | | Titanium (Ti) | Nitrogen (N) | Silicon (Si) | Hydrogen (H) |
| Silicon Stuffed TiN | ~520 | 35.2 | 52.8 | 5 | 7 |
| Deposited TiSiCN | ~2400 | 25.3 | 49.7 | 15 | 10 |

Fig. 47

CONSTRUCTION OF A FILM ON A SEMICONDUCTOR WAFER

CROSS-REFERENCE TO RELATED APPLICATIONS

This application is divisional of co-pending U.S. patent application Ser. No. 08/810,221, filed Feb. 28, 1997, which is a continuation-in-part of the following U.S. Patent Applications:

U.S. patent application Ser. No. 08/339,521, entitled IMPROVED TITANIUM NITRIDE LAYERS DEPOSITED BY CHEMICAL VAPOR DEPOSITION AND METHOD OF MAKING and filed on Nov. 14, 1994; abandoned U.S. patent application Ser. No. 08/498,990, entitled BIASED PLASMA ANNEALING OF THIN FILMS and filed on Jul. 6, 1995; abandoned U.S. patent application Ser. No. 08/567,461, entitled PLASMA ANNEALING OF THIN FILMS and filed on Dec. 5, 1995; abandoned U.S. patent application Ser. No. 08/677,185, entitled CHAMBER FOR CONSTRUCTING AN OXIDIZED FILM ON A SEMICONDUCTOR WAFER and filed on Jul. 9, 1996; U.S. Pat. No. 6,155,198

U.S. patent application Ser. No. 08/677,218, entitled IN-SITU CONSTRUCTION OF AN OXIDIZED FILM ON A SEMICONDUCTOR WAFER and filed on Jul. 9, 1996; abandoned and U.S. patent application Ser. No. 08/680,913, entitled PLASMA BOMBARDING OF THIN FILMS and filed on Jul. 12, 1996. abandoned Each of the aforementioned related patent applications in hereby incorporated by reference.

BACKGROUND OF THE INVENTION

A. Field of the Invention

The present invention is directed toward the field of manufacturing integrated circuits.

B. Description of the Related Art

When manufacturing integrated circuits, deposition processes are employed to deposit thin layers of insulative material and conductive material onto wafers. Deposition has been performed through various well known processes, such as chemical vapor deposition ("CVD") and physical vapor deposition ("PVD" or "sputtering").

In a CVD process, a wafer is loaded into a chemical vapor deposition chamber. Conventional CVD processes supply reactive gases to the wafer surface where heat-induced chemical reactions take place to form a thin film layer over the surface of the wafer being processed. One particular CVD application is the deposition of a titanium containing compound, such as titanium nitride, over a wafer from a process gas that includes a metallo-organic compound. One such compound is tetrakis(dialkylamido)titanium $(Ti(NR_2)_4)$ having the following structural formula:

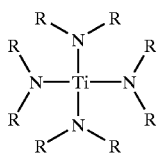

wherein R at each occurrence independently is in an alkyl group, of, for example, 1–5 carbon atoms. For example, it is common to use tetrakis(dimethylamido)titaniu (TDMAT), which has the formula $Ti(N(CH_3)_2)_4$.

A carrier gas, such as helium, argon, nitrogen, or hydrogen brings the compound into the chamber, so that it may be infused with energy. The energy may be generated through a thermal heat source, in the case of thermal CVD, or a radio frequency ("rf") signal source, in the case of plasma enhanced CVD. The energized chemical vapor reacts with the wafer's surface to form a thin layer of material on the wafer. When the TDMAT chemical vapor is used, a titanium nitride film is deposited on the wafer's surface.

In a sputtering process, a wafer is placed in a physical vapor deposition ("PVD") chamber, and the chamber is filled with a gas, such as argon. A plasma containing positively charged ions is generated from the gas, by creating an electrical field in the chamber. The positively charged ions accelerate and collide into a target material, which is mounted in the chamber. Atoms of the target material are thereby separated from the target and deposited on the wafer to form a layer of target material on the surface of the wafer.

In a traditional sputtering process, the bombardment of the target material by the positively charged ions is enhanced by providing a negative bias to the target material. This is achieved by providing a radio frequency signal to an electrode that supports the target material.

A separate rf signal may be inductively coupled to the chamber for generating positively charged ions in a high density plasma PVD chamber. A high density plasma PVD chamber may include another rf signal coupled to a wafer support for improving the attraction of the target material to the wafer.

A deposition chamber, such as a CVD chamber or a PVD chamber, may be used to deposit diffusion barriers in an integrated circuit. Diffusion barriers inhibit the diffusion of a contact metal, such as aluminum and copper, into the active region of a semiconductor device that is built on a silicon substrate. This prevents the interdiffusion of a contact metal into the substrate. Unlike an insulative layer of material, a diffusion barrier forms a conductive path through which current may flow. For example, a diffusion barrier may be employed to overlie a silicon substrate at the base of a contact hole.

A severe interdiffusion between a contact metal and a silicon substrate can begin to take place when the integrated circuit is heated to temperatures in excess of 450° C. If an interdiffusion is allowed to occur, the contact metal penetrates into the silicon substrate. This causes an open contact in the integrated circuit and renders the integrated circuit defective.

In the fabrication of integrated circuits, there has been an increased use of aluminum and copper metalization processes operating at high temperatures, in excess of 450° C. Therefore, it desirable to have diffusion barriers with a greater ability to inhibit the diffusion of contact metals, such as aluminum and copper.

Traditionally, diffusion barriers have been made thicker to accommodate such a desire. However, smaller geometries are being employed in the fabrication of integrated circuits. The smaller geometries decrease the dimensions of contact holes, thereby making it desirable for diffusion barriers to become thinner and more conformal.

FIG. 1 illustrates a diffusion barrier 100 that resides between a conductive region 105 of a silicon substrate 101 and a contact plug 102. A contact hole 103 is formed in an insulative layer of material 104, such as silicon dioxide, which overlies the substrate 101. The diffusion barrier 100 is ideally formed so that it is thin and substantially conforms to the contours of the surface of the contact hole 103.

If the diffusion barrier 100 is thin and highly conformal, the contact metal 102 is able to. form a sufficiently conductive ohmic contact with the silicon substrate's conductive region 105. If the diffusion barrier 100 is too thick or poorly formed, as shown in FIG. 2, it will prevent the contact metal 102 from forming a sufficiently conductive ohmic contact with the substrate region 105.

In FIG. 2, the poorly formed diffusion barrier 100 severely narrows the opening of the contact hole 103. The narrow opening causes the contact metal 102 to form so that it does not reach the base of the contact hole 103. As a result, a void 106 is formed.

In order to ensure a good ohmic contact between the contact metal 102 and the substrate region 105, it is desirable for the resistance of the diffusion barrier 100 to be minimal. Typically, a resistivity value of 1,000 $\mu\Omega$-cm or less is acceptable. One material that has been successfully employed as a diffusion barrier is titanium nitride (TiN).

However, some deposition processes, such as those using TDMAT, provide an unstable barrier layer having high resistivity. In the case of TDMAT, this is partly due to a significant fraction of the deposited barrier material being composed of a carbon (hydrocarbons, carbides, etc.). Further, the titanium, a chemically reactive metal, may not be completely reacted in the film. It would be desirable to treat such a layer of barrier material with a post-deposition processing, so that its resistivity is reduced and stabilized.

In manufacturing an integrated circuit, it is desirable to perform successive steps of the manufacturing process, such as deposition and post-deposition processing, in the same chamber ("in-situ"). In-situ operations reduce the amount of contamination that a wafer is exposed to by decreasing the number of times that the wafer is required to be transferred between different pieces of manufacturing equipment. In-situ operations also lead to a reduction in the number of expensive pieces of manufacturing equipment that an integrated circuit manufacturer must purchase and maintain.

Accordingly, it would be desirable to construct a highly conformal thin diffusion barrier with an increased ability to inhibit the diffusion of contact metals, such as aluminum or copper. Additionally, it is desirable for such a diffusion barrier to have a resistance that allows the diffusion barrier to form a good path for current flow. It would also be desirable to construct such a diffusion barrier in-situ.

SUMMARY OF THE INVENTION

An apparatus and method in accordance with the present invention provides for carrying out the in-situ construction of a highly conformal diffusion barrier with improved resistivity. By practicing aspects of the present invention, the diffusion barrier's ability to impede the diffusion of contact metals, such as aluminum or copper, may be enhanced. Such an enhancement of the diffusion barrier will not significantly enlarge its thickness or resistivity beyond acceptable limits.

A semiconductor processing apparatus, which enables practicing embodiments of the present invention, may include a processing chamber, showerhead, wafer support, and rf signal means. In one embodiment of the present invention, the semiconductor wafer processing apparatus is capable of performing chemical vapor deposition.

The showerhead is adapted to supply gases in the processing chamber. The wafer support provides for supporting a wafer in the processing chamber. The rf signal means may be coupled to both the showerhead and the wafer support for providing a first rf signal to the showerhead and a second rf signal to the wafer support. Alternatively, the rf signal means may only be coupled to provide a rf signal to the wafer support.

The wafer support is supported in the processing chamber by a support arm. The support arm couples the rf signal means to the wafer support. The support arm also couples a thermocouple housed in the wafer support to a temperature determination device for measuring the temperature of the wafer support. The thermocouple is electrically isolated from the rf signal means.

When practicing an aspect of the present invention, a film may be constructed on a wafer. First, a layer of material is deposited on the wafer. The material may be a binary metal nitride $M_xN_y$ or a ternary metal silicon nitride $M_xSi_yN_z$ (where M may be titanium Ti, Zirconium Zr, hafnium Hf, tantalum Ta, Molybdenum Mo, Tungsten W, and other metals). The deposition of the material may be carried out by a variety of means, such as chemical vapor deposition and physical vapor deposition.

After the material is deposited, the material is plasma annealed, so as to reduce the resistivity of the layer of material. The plasma annealing may include an exposure of the material to an environment containing ions and electrically biasing the layer of the material to cause the ions to impact the material.

Alternatively, the annealing may consist of multiple annealing steps that are performed sequentially with different gases. For example, a first annealing step may employ a mixture of nitrogen and hydrogen, while a subsequent annealing step uses a mixture of nitrogen and helium. The subsequent annealing step removes hydrogen molecules from the material to reduce its resistivity.

Once the annealing is completed, the layer of material may be oxidized. The oxidation enhances the material's ability to inhibit the diffusion of contact metals, such as aluminum. Alternatively, the annealed layer of material may be exposed to a silane gas to enhance the material's ability to inhibit the diffusion of contact metals, such as copper.

In accordance with the present invention, the deposition, annealing, and either oxidation or silane exposure may all be performed in a single chamber, without need for removing the wafer from the chamber before all three operations are completed. Accordingly, the deposition, annealing and either oxidation or silane exposure of the material may be performed in-situ.

BRIEF DESCRIPTION OF THE DRAWINGS

Further details of the present invention are explained with the help of the attached drawings in which:

FIG. 8 illustrates a partial cross-section along lines 6—6 in FIG. 7.

FIG. 9(a) illustrates a top view of the support arm shown in FIG. 6.

FIG. 9(b) illustrates a longitudinal cross-section along line 7—7 in FIG. 9(a).

FIG. 10(a) illustrates a plan view of a thermocouple isolator in the support arm shown in FIG. 6.

FIG. 10(b) illustrates a longitudinal section along line 8—8 in FIG. 10(a).

FIG. 11(a) illustrates a plan view of a rf power strip isolator in the support arm shown in FIG. 6.

FIG. 11(b) illustrates a partially sectioned elevation of the isolator shown in FIG. 11(a).

FIG. 20 illustrates Table I.

FIG. 21 illustrates Table II.

FIG. 22 illustrates Table III.

FIG. 25 illustrates Table IV.

FIG. 32 illustrates Table V.

FIGS. 39(a)–39(b) illustrate Auger electron spectroscopic depth profiles for titanium nitride films formed by successively depositing and annealing layers of titanium nitride.

FIG. 42 illustrates Table VI.

FIG. 44 illustrates the resistance characteristics of diffusion barriers that are formed in accordance with one embodiment of the present invention.

FIG. 47 illustrates a comparison of the resistivity and composition of the films shown in FIG. 45 and FIG. 46.

DETAILED DESCRIPTION OF THE PREFERRED EMBODIMENTS

A. Chambers for Processing Wafers

1. Overview

Figure 1:
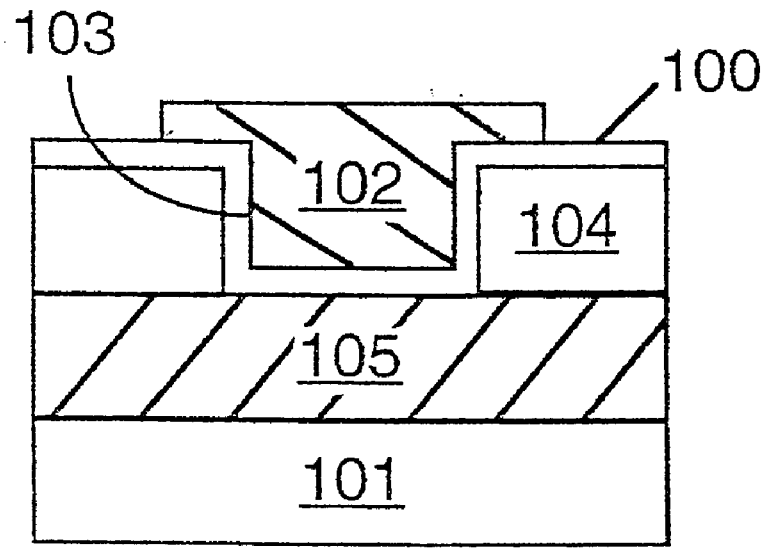
FIG. 1 illustrates a contact plug in an integrated circuit, which includes a diffusion barrier.
Figure 2:
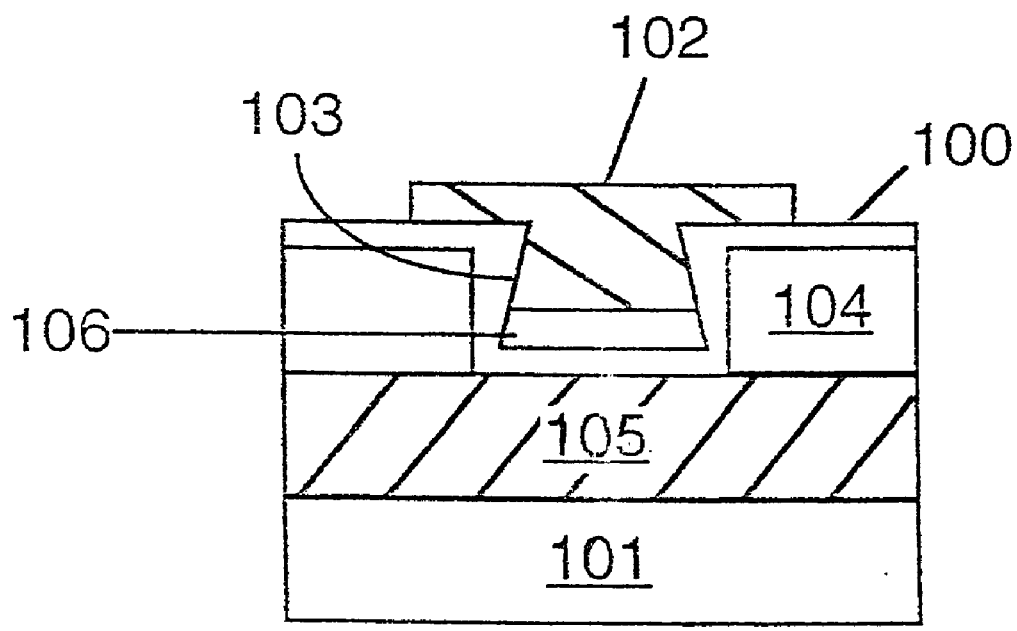
FIG. 2 illustrates a contact hole in an integrated circuit that is obstructed by a diffusion barrier.
Figure 3A:
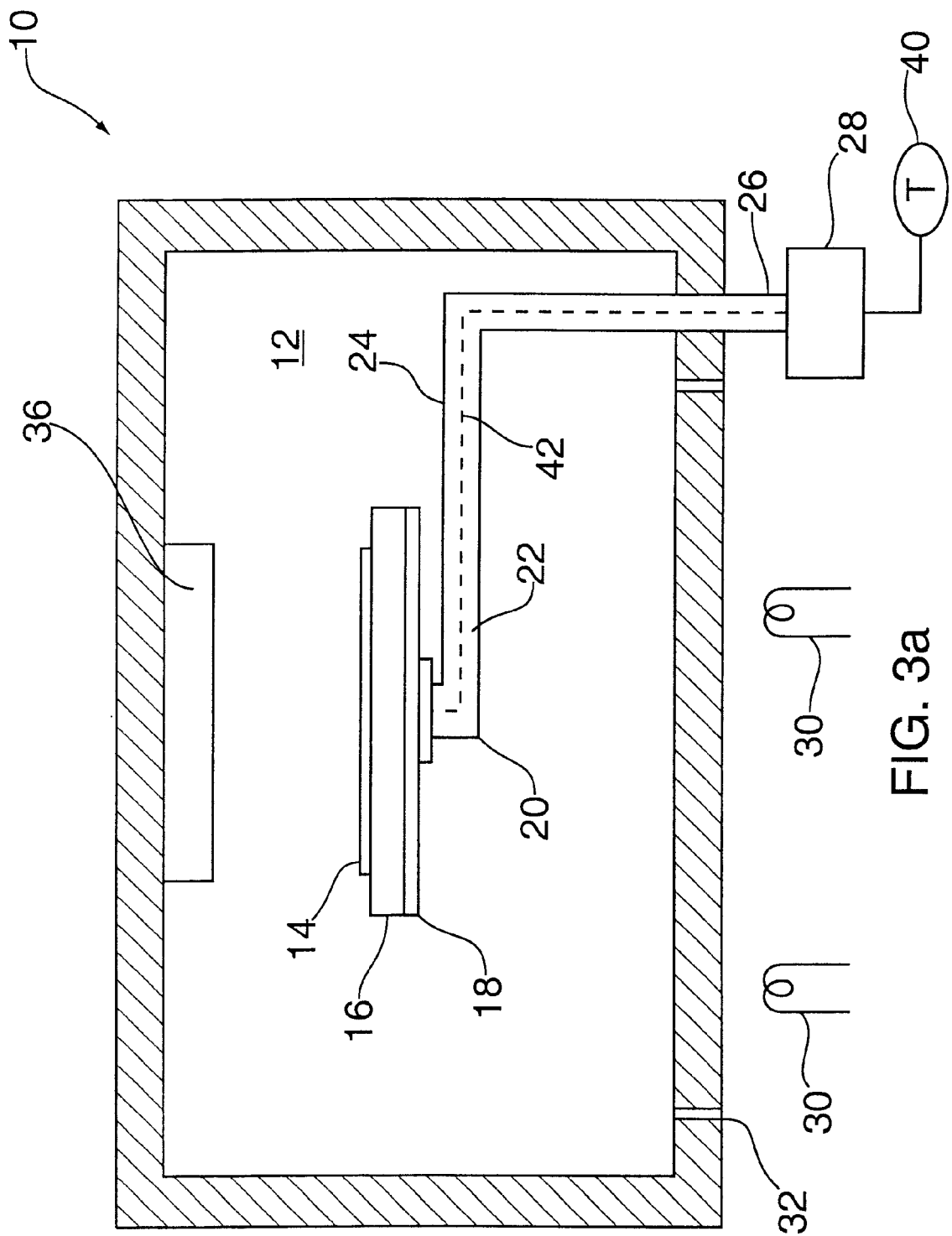
FIG. 3(a) illustrates a chemical vapor deposition chamber.
Figure 3B:
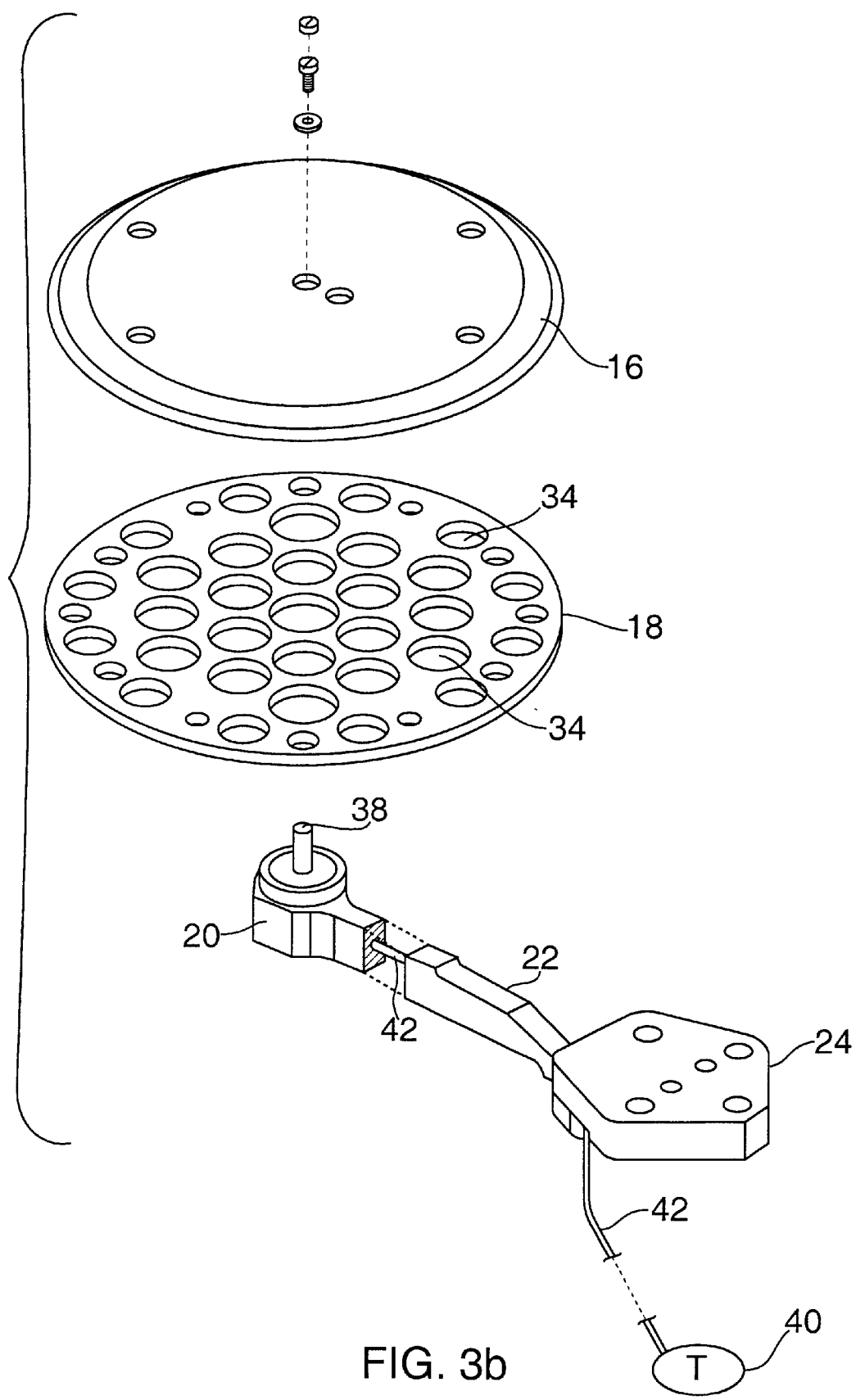
FIG. 3(b) illustrates a wafer support and support arm for the chamber shown in FIG. 3(a).

FIGS. 3(a) and 3(b) jointly depict a traditional CVD chamber 10. The CVD chamber 10 includes a processing chamber 12 in which a wafer 14 is supported by a wafer support 16, such as a susceptor. The wafer support 16 is supported by a circular disk 18, which is typically made of a material such as alumina ceramic. The disk 18 rests on the free end 20 of a support arm 22. The support arm 22 defines a cantilever with its fixed end 24 mounted to a stem 26. The stem 26 is capable of vertical displacement under action of a displacement mechanism 28. The displacement mechanism 28 operates to move the support arm 20 vertically within the processing chamber 12.

During the processing of a wafer 14, gas is injected into the processing chamber 12, via a showerhead 36. The showerhead 36 is typically mounted directly above the wafer 14.

In operation, the interior of the processing chamber 12 is heated by a set of infrared lamps 30 mounted beneath the CVD chamber 10. The lamps 30 irradiate the interior of the processing chamber 12 through a quartz window 32, which is located between the lamps 30 and the interior of the processing chamber 12. The lamps 30 serve to heat both the interior of the processing chamber 12 and the wafer support 16. As a result, a wafer 14 on the wafer support 16 is also heated.

To enhance the heating of the wafer support 16, the ceramic supporting plate 18, as shown in FIG. 3b, includes a number of holes 34 formed therethrough. The typical arrangement of holes 34 shown in FIG. 3b makes it apparent why the plate 18 is often referred to as a "Swiss Cheese" plate.

Thermal CVD wafer processing is very sensitive to the wafer temperature. To ensure that the wafer remains at an appropriate temperature, the temperature of the wafer support 16 is measured by a thermocouple 38. The thermocouple 38 is supported at the free end 20 of the support arm 22 and mounted within the body of the wafer support 16. An electrically conductive cable 42 couples the thermocouple to a temperature determination device 40, which is mounted outside the processing chamber 12. The cable 42 typically runs along a bore formed centrally within the support arm 22.

Figure 4:
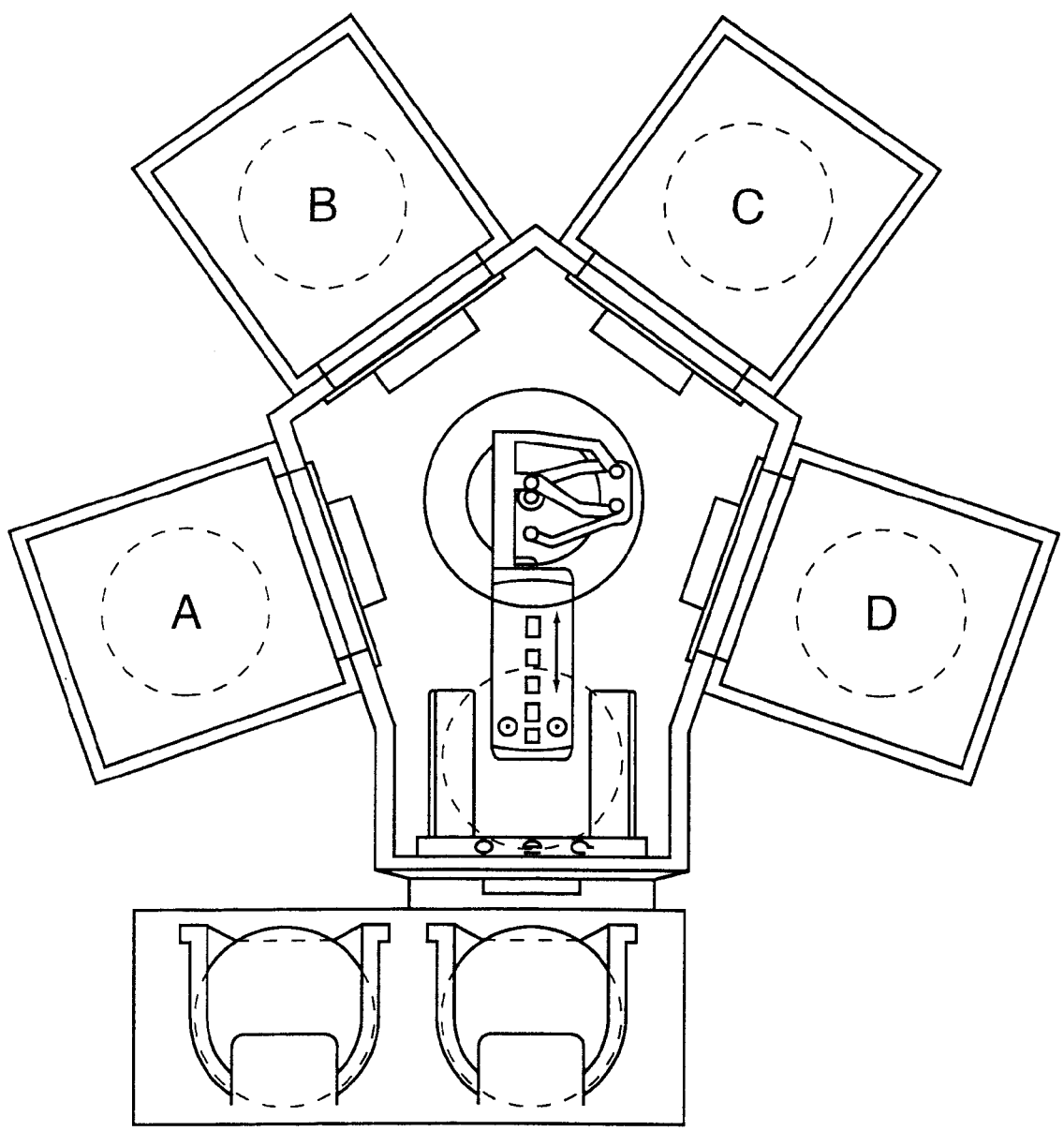
FIG. 4 illustrates a multichamber processing apparatus.

FIG. 4 depicts a multichamber vacuum system, which is suitable for carrying out the manufacture of a wafer including integrated circuits. Chamber A will provide for the pre-cleaning of a substrate upon which the integrated circuits are to be formed. After pre-cleaning, the substrate is transferred to a CVD chamber B, so that a film may be deposited onto the substrate. The substrate will then be transferred to a post-deposition treatment chamber C for improving the quality of the deposited film.

If it is desirable to "stuff" the film with a substance that enhances the film's operation as a diffusion barrier, the substrate may be transferred to chamber D in which such "stuffing" may be performed. For example, the film may be a layer of titanium nitride material, which is to be stuffed with oxygen to reduce the diffusivity of the film for aluminum. The stuffing of a titanium nitride barrier layer with oxygen is disclosed in U.S. Pat. No. 5,378,660, entitled BARRIER LAYERS AND ALUMINUM CONTACTS and issued to Ngan, et al.

Either of the above described systems may be employed for practicing aspects of the present invention. However, neither system provides the ability to deposit a material on a wafer and perform post deposition processing on the material to form a film within a single chamber. Such post deposition processing may include annealing, oxidizing, exposure to silicon, or a combination thereof.

2. A Chamber for In-situ Operations

Figure 5:
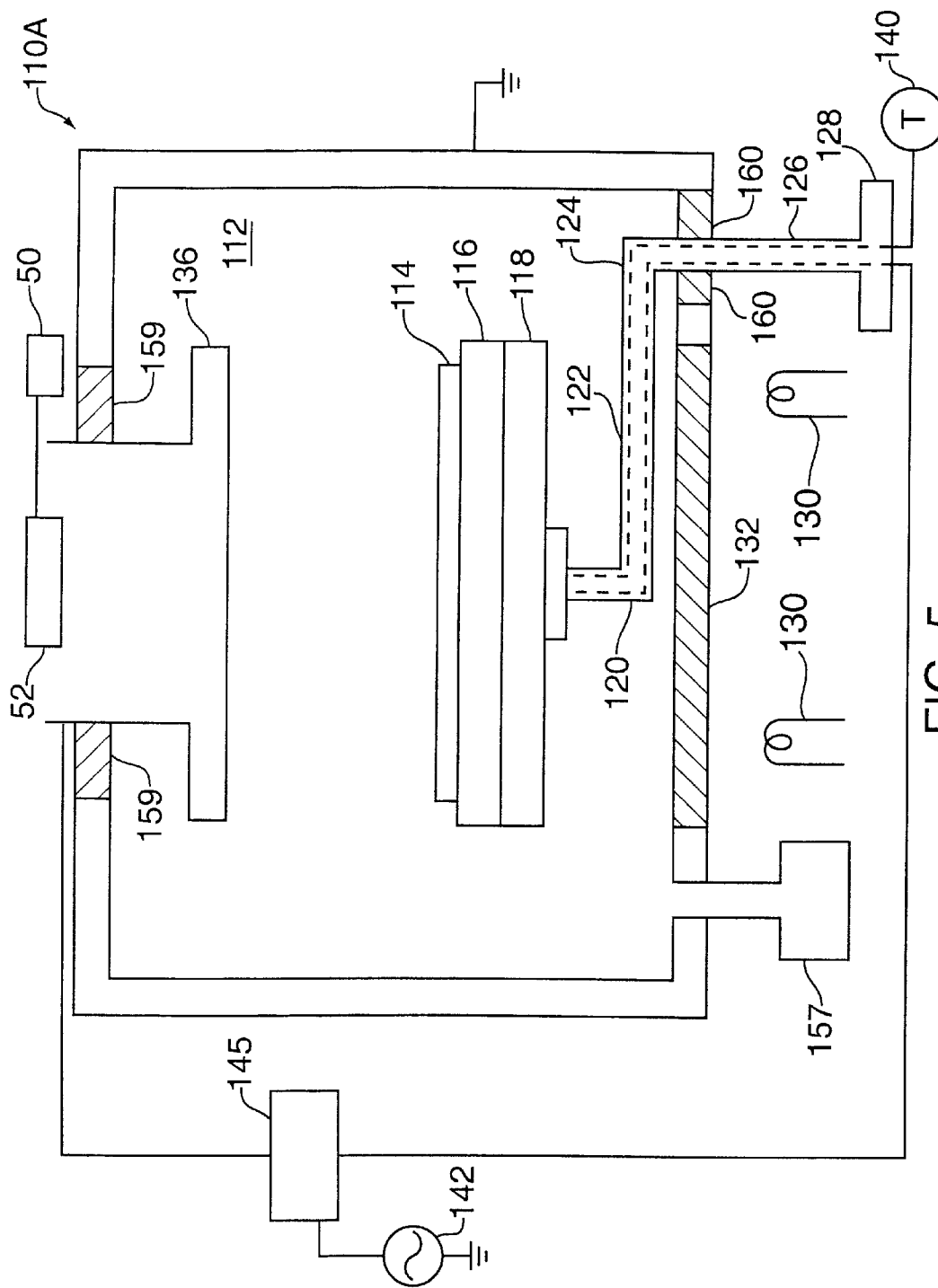
FIG. 5 illustrates one embodiment of a wafer processing chamber in accordance with the present invention.
Figure 6:
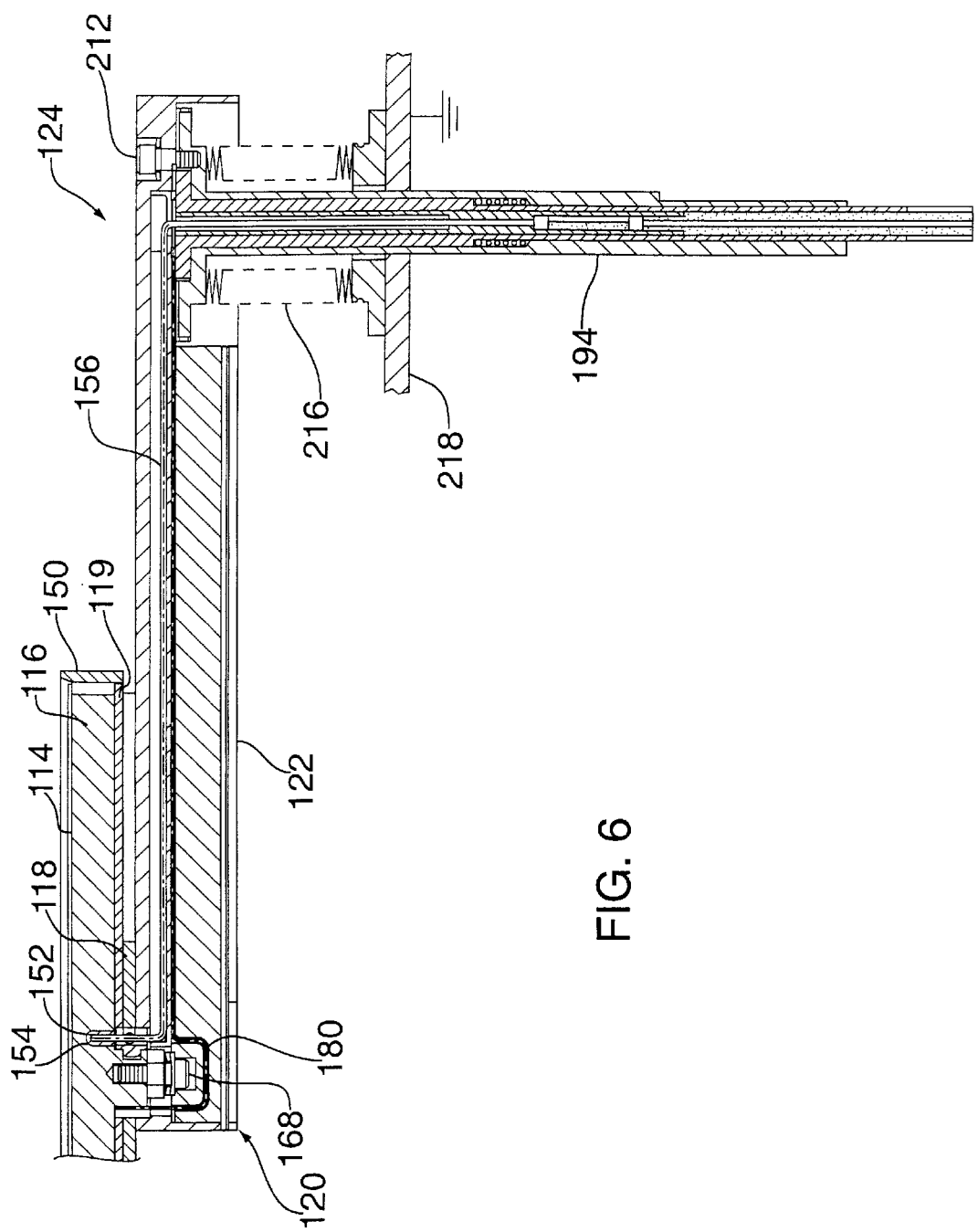
FIG. 6 illustrates a longitudinal cross-section through the wafer support and support arm shown in FIG. 5.

FIG. 5 illustrates a semiconductor wafer processing chamber 110A in accordance with the present invention. The wafer processing chamber 110A provides for performing a series of in-situ deposition and post-deposition processing steps on a semiconductor wafer 114. In accordance with the present invention, the chamber 110A depicted in FIG. 5 may be a chemical vapor deposition chamber as is described in detail in U.S. patent application Ser. Nos. 08/567,461 and 08/677,185.

Wafer processing chamber 110A eliminates the need for employing multiple chambers to deposit and treat a material in accordance with the present invention. For instance, the wafer processing chamber 110A may be employed to form a film on a wafer by depositing a material on the wafer and annealing the deposited material to stabilize and reduce its resistance. As a result, the wafer will not be exposed to damaging impurities that are outside of the chamber 110A during the formation of the film.

As shown in FIG. 5, the semiconductor wafer processing chamber 110A includes a processing chamber 112, which is coupled to ground. A semiconductor wafer 114 may be supported in the processing chamber 112 on a wafer support 116, which may be the same as the wafer support 16 shown in FIGS. 3(a) and 3(b). The wafer support 116 may be a susceptor, a pedestal, a resistive heater, or any other suitable means for supporting the wafer 114.

In FIG. 5, the wafer support 116 is a susceptor, which is the type of wafer support that is often used when lamps are employed to irradiate the wafer support 116. The susceptor is made of anodized aluminum and is supported by a conventional alumina ceramic support plate 118, which is similar to the support plate 18 in FIG. 3b.

The combination of the support plate 118, wafer support 116 and wafer 114 is supported on a free end 120 of a cantilevered alumina support arm 122. A fixed end 124 of the support arm 122 is mounted to a generally vertically moveable stem 126, which is electrically isolated from the processing chamber by isolator 160. The vertically moveable stem 126 is vertically displacable under the action of a displacement mechanism 128.

The processing chamber 112 and its contents are heated by means of conventional lamps 130, which irradiate the wafer support 116 through a conventional quartz window 132. The semiconductor wafer processing chamber 110A further includes a temperature determination device 140. The temperature determination device 140 is coupled to the wafer support 116 to sense the temperature of the wafer support 116. A vacuum pump, pressure gauge and pressure regulator valve are all included in a pressure control unit 157. The pressure control unit 157 adjusts the pressure in the processing chamber 112 and exhausts both carrier gases and reaction by-products from the processing chamber 112.

A showerhead 136 is placed above the wafer support 116 in the processing chamber 112 and is electrically isolated from the chamber 112 by means of isolator 159. The showerhead 136 is supplied with processing gases from a gas panel 52. The gas panel 52 is controlled by a gas panel controller 50 in the form of a computer.

In order to perform post-deposition annealing, the semiconductor wafer processing chamber 110A includes a rf source 142. The rf source 142 applies rf power to the showerhead 136, which operates as a first electrode, and the wafer support 116, which operates as a second electrode. The rf source 142 may be capable of providing signals with frequencies less than 1 MHZ, and preferably providing signals with a frequency of 350 KHz. Providing rf signals to the two electrodes 136 and 116 overcomes challenges that are not present in providing rf signals to two electrodes in other traditional semiconductor wafer processing chambers, such as a PVD chamber.

In embodiments of the present invention, it is possible to prevent the application of excessive negative bias to the showerhead 136. Excessive negative bias on the showerhead 136 can cause increased ion bombardment of the showerhead 136 which results in the generation of contaminant particles.

It is desirable to have a great deal of ion bombardment of a target electrode in a traditional PVD chamber. In a traditional PVD chamber, a target electrode supports a target of material to be deposited. The target electrode is given significant negative bias, so that ions readily collide with the target material to provide for deposition of the target material.

Further, the negative biasing of a wafer support and the control of wafer temperature in a traditional sputtering process are typically not critical. This is not true in embodiments of the present invention. Controlling negative bias on the wafer support 116 is desirable for establishing an optimum level of ion flux towards the wafer 114. Accurately setting the temperature of the wafer 114 is desirable for performing both deposition and post-deposition processing of deposited material.

Accordingly, the wafer support 116 provides the dual function of being coupled to an rf source 142 and housing a thermocouple temperature sensing mechanism (not shown). The rf source 142 provides for controlling the negative biasing of the wafer support 116, and the thermocouple provides for monitoring the temperature of the wafer 114.

The wafer support 116 and support arm 122 are designed to isolate the rf source signals from the thermocouple signals, so that accurate wafer temperature readings may be made. This isolation enables both the rf source signals and thermocouple signals to be accurately transferred within the chamber 110A, so that the wafer 114 is both biased and heated properly. The details of the wafer support arm 122 are described below with reference to FIGS. 6–14.

3. The Wafer Support Arm Referring generally to FIGS. 6–9(b), wafer 114 is supported on the wafer support 116 which is itself supported by a conventional "Swiss Cheese" alumina ceramic support plate 118. A thin quartz plate 119 is located between the support plate 118 and the wafer support 116. The quartz eliminates arcing between the support plate 116 and other components in the wafer processing chamber 110A. The quartz plate 119 is transparent to radiate energy provided by the lamps 130. This allows the lamps 130 to quickly heat the wafer support 116.

The wafer support 116 is encircled by a quartz shield 150. The quartz shield 150 rests on the alumina support plate 118 (partially shown in FIG. 7) to extend above the wafer support 116 and define a wafer receiving pocket within which both the wafer support 116 and the wafer 114 reside. The quartz shield 150 has its upper edge chamfered outwards to receive the wafer 114 more easily when the wafer 114 is transferred to and from the wafer support 116. The quartz shield 150 primarily functions to shield the edge of the wafer support 116 from attracting an arc.

In processing, the temperature of the wafer support 116 is measured by a thermocouple 152 mounted in the wafer support 116. The thermocouple 152 is mounted within an alumina nitride sheath 154 which snugly fits within the body of the wafer support 116. The sheath 154 provides electrical insulation between the thermocouple 152 and the body of the wafer support 116. Although the sheath 154 is electrically highly resistive, it remains a good conductor of heat. The sheath 154 has a low thermal mass and thus low thermal inertia making it suitable for use with the thermocouple 152. Further, the sheath 154 is chemically stable within the processing environment of the processing chamber 112.

The thermocouple 152 is connected to the temperature determination device 140 by an electrically conductive cable 156. As will be described below, the cable 156 passes along a central portion of the support arm 122 and is electrically insulated from any radio frequency energy within the processing chamber 112.

The thermocouple 152 is held in position by a small nickel sphere 158 which is crimped over the conductive cable 156. The sphere 158 is retained in a slot 160 formed in a keyed ceramic retaining element 162. The keyed retaining element 162 keys into a groove 164 formed in a central protruding stub 166 on the underside of the wafer support 116. This arrangement ensures that the thermocouple 152 can be removed relatively easily and replaced once the wafer support 116 is separated from the support arm 122. The above-described arrangement ensures that the thermocouple 152 is held firmly in place within the body of the wafer support 116, while maintaining electrical isolation between the wafer support 116 and the thermocouple 152.

The wafer support 116 is secured to the support arm 122 by a pair of bolts 168, which screw into the central stub 166. FIG. 8 show that the support arm 120 is primarily constituted by an inverted U-shaped ceramic section 170. The bolts 168 pass through respective holes 172 passing through the horizontal portion of the U-shaped section 170. To prevent excessive bearing of the bolts 168 onto the horizontal portion of the U-shaped section 170, each head is spaced from the horizontal portion by means of a Belvedere spring washer 174. Preventing excessive bearing of the head of the bolt 168 onto the ceramic U-shaped section 170 is important, since ceramic, particularly thin section ceramic, is relatively brittle. Excessive bearing force may cause the U-shaped section 170 to break.

An rf conductive strip 180 passes along the support arm 122. The strip 180 is electrically connected to the underside of the wafer support 116 at the stub 166. The rf conductive strip 180 is coated with a high temperature elastomeric dielectric material, such as polyimide, such as materials available from Dupont Electric under the trade name Pyralin.

This polyimide coating provides an electric insulation for the rf conductive strip 180. In addition, the rf conductive strip 180 is electrically isolated from the conductive cable 156 by means of a ceramic isolator 182. The details of the ceramic isolator will be discussed below with reference to FIGS. 10(a) and 10(b). Further, the rf conductive strip 180 is isolated from the interior of the processing chamber 112 by the "legs" of the inverted U-shaped section 170 and by isolator 184. The details of isolator 184 will be described below with reference to FIGS. 11(a) and 11(b).

During assembly, the thermocouple 152 and its associated sheath 154 is inserted into the wafer support 116. The thermocouple's lead cable 156 is then fed into the U-shaped section 170. The wafer support 116 is fastened onto the U-shaped section 170, by means of bolts 168. The isolator 182 is placed over the conductive cable 156 to isolate the conductive cable 156 from the rf strip 180. The rf conductive strip 180 is then laid onto isolator 182, and isolator 184 is positioned over the rf conductive strip 180.

Figure 12:
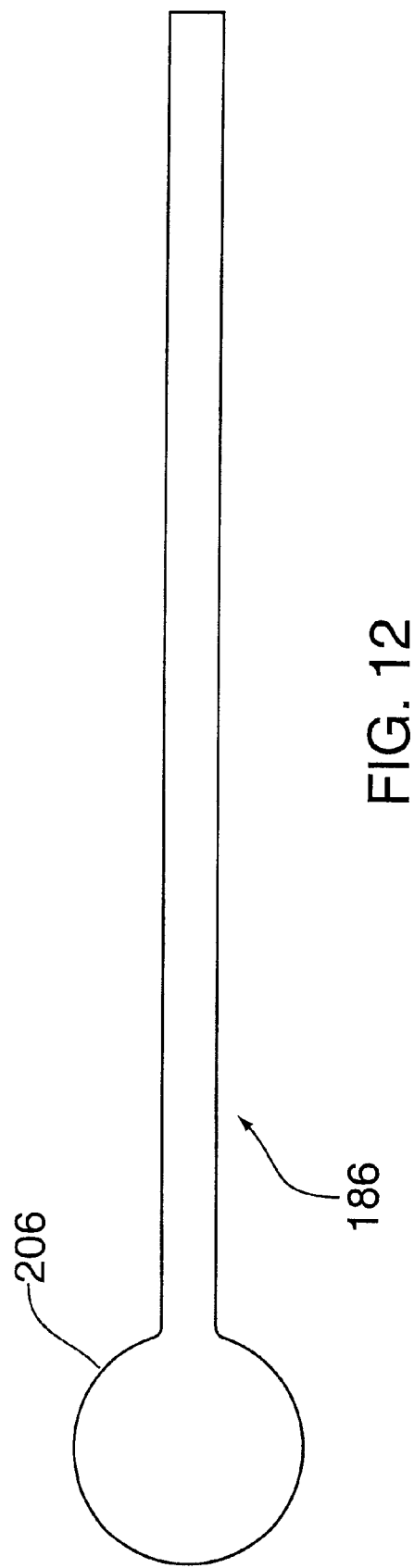
FIG. 12 illustrates a plan view of an underside retaining plate of the support arm shown in FIG. 6.

Thereafter, a flat ceramic retainer 186 is slotted into grooves 188 formed close to the free ends of the "legs" of the U-shaped section 170. The retainer 186 acts as a retainer for all the various pieces which are located within the body of the U-shaped section 170. The details of the retainer 186 are shown in FIG. 12.

As illustrated in FIGS. 9(a) and 9(b), the support arm 122 is constituted by a relatively slender central portion with enlarged portions at its free and fixed ends, 120 and 124, respectively. The free end 120 of the support arm 122 has two bolt holes 172 formed respectively on either side of a slot 190 formed in the upper surface of the free end 120. This slot 190 receives a keyed formation 192 extending downward from the stub 166 on the bottom of the wafer support 116. This keyed formation 192 mates with the slot 190 and further stabilizes the wafer support 116 when it is positioned on the support arm 122. The details of the keyed formation 192 are shown in FIGS. 8 and 14. The fixed end 124 of the support arm 122 is secured to a vertically movable stem 194, the details of which will be described with reference to FIG. 13.

From FIGS. 10(a) and 10(b) it can be seen that the isolator 182 is in the form of a U-shaped channel within which conductive cable 156 rests. The U-shaped channel has an enlarged portion 196 formed at one end. The enlarge portion 196 covers the rf conductive strip 180 at the fixed end 124 of the support arm 122.

Figure 7:
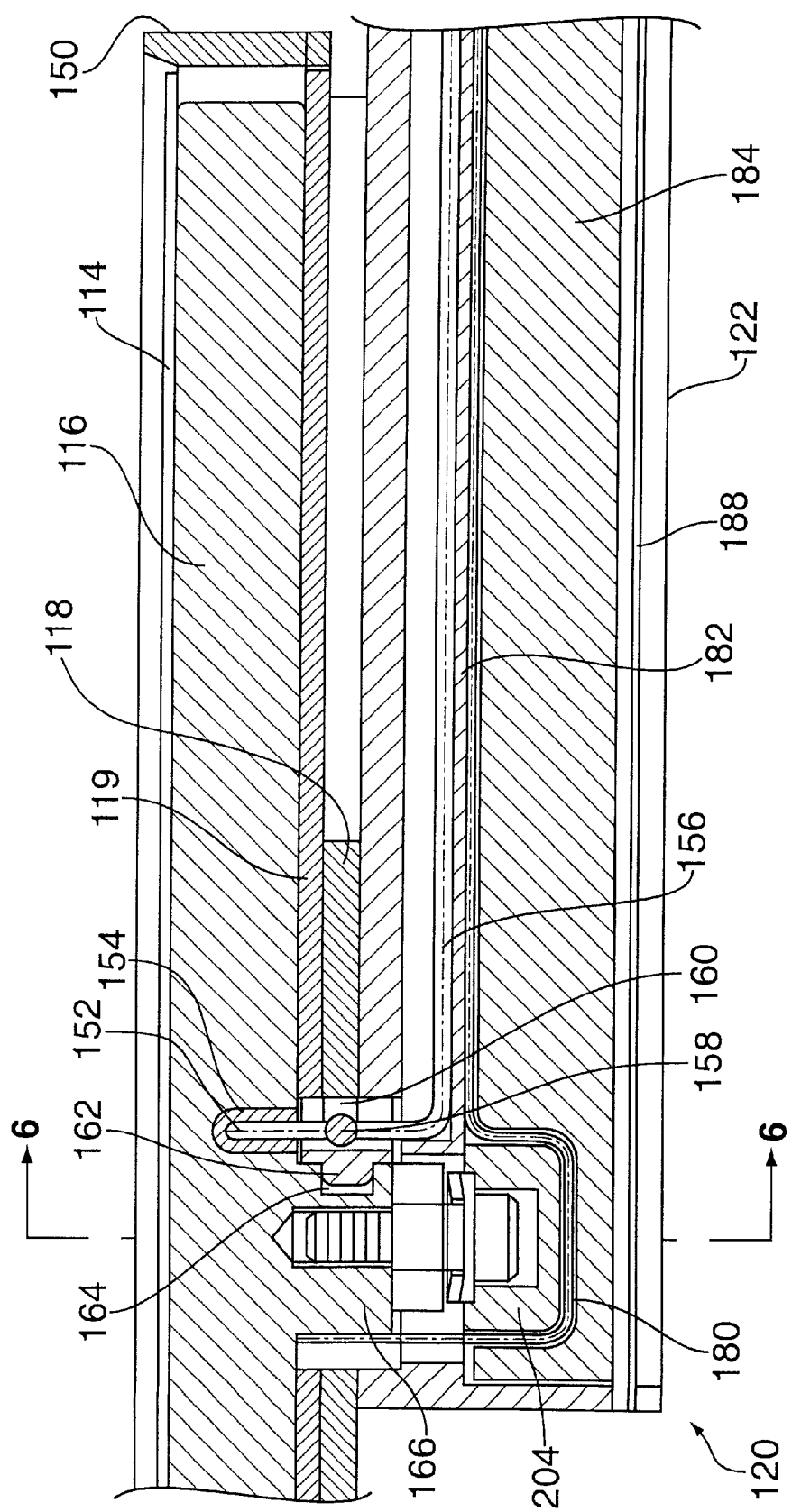
FIG. 7 illustrates an enlarged cross-section of the support arm shown in FIG. 6 at the point where the support arm supports the wafer support.

As shown in FIGS. 11(a) and 11(b), the isolator 184 has an enlarged portion 198 which is sized to fit relatively snugly within the free end 120 of the support arm 122. The enlarged portion 198 has a channel 200 formed therein. When the apparatus is assembled, the rf conductive strip 180 lies on the upper surface 202 of the insulator 184. The rf conductive strip 180 also bends to follow the internal contour of the channel 200. This arrangement is illustrated in FIG. 7 and provides for separating the rf conductive strip 180 from the connecting bolts 168. As can be seen from FIG. 7, a suitable spacer element 204 is provided to fit into the channel 200 and provide isolation between the rf conductive strip 180 and the bolts 168.

The details of the retainer 186 are illustrated in FIG. 12. The retainer 186 is generally spoon-shaped with an enlarged portion 206 sized to be received within the groove formed at the free end 120 of the support arm 122. During assembly, the retainer 186 is inserted into the slot 188 from the free end 120 of the support arm 122.

Figure 13:
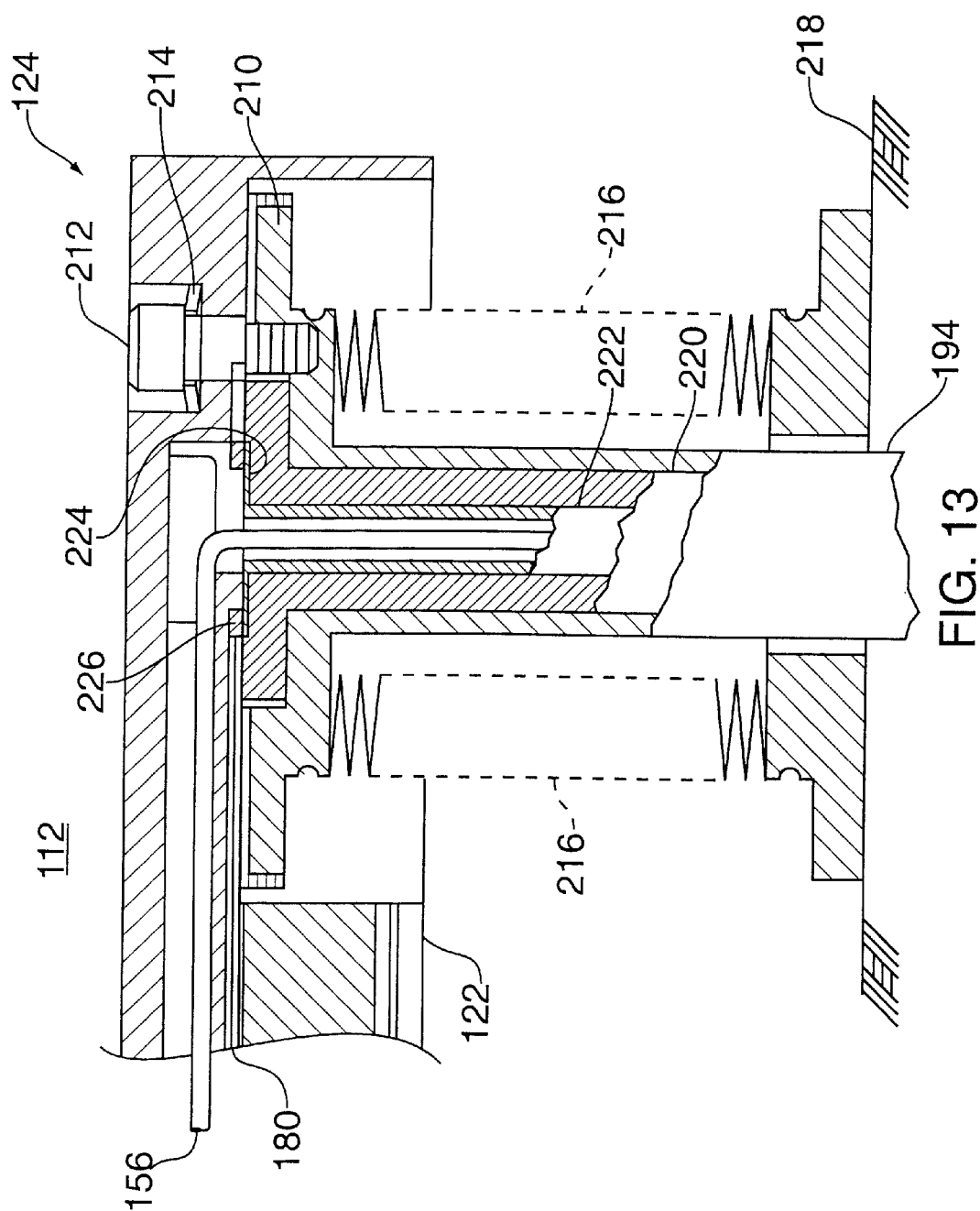
FIG. 13 illustrates a cross-section showing details on the fixed end of the support arm shown in FIG. 6.
Figure 14:
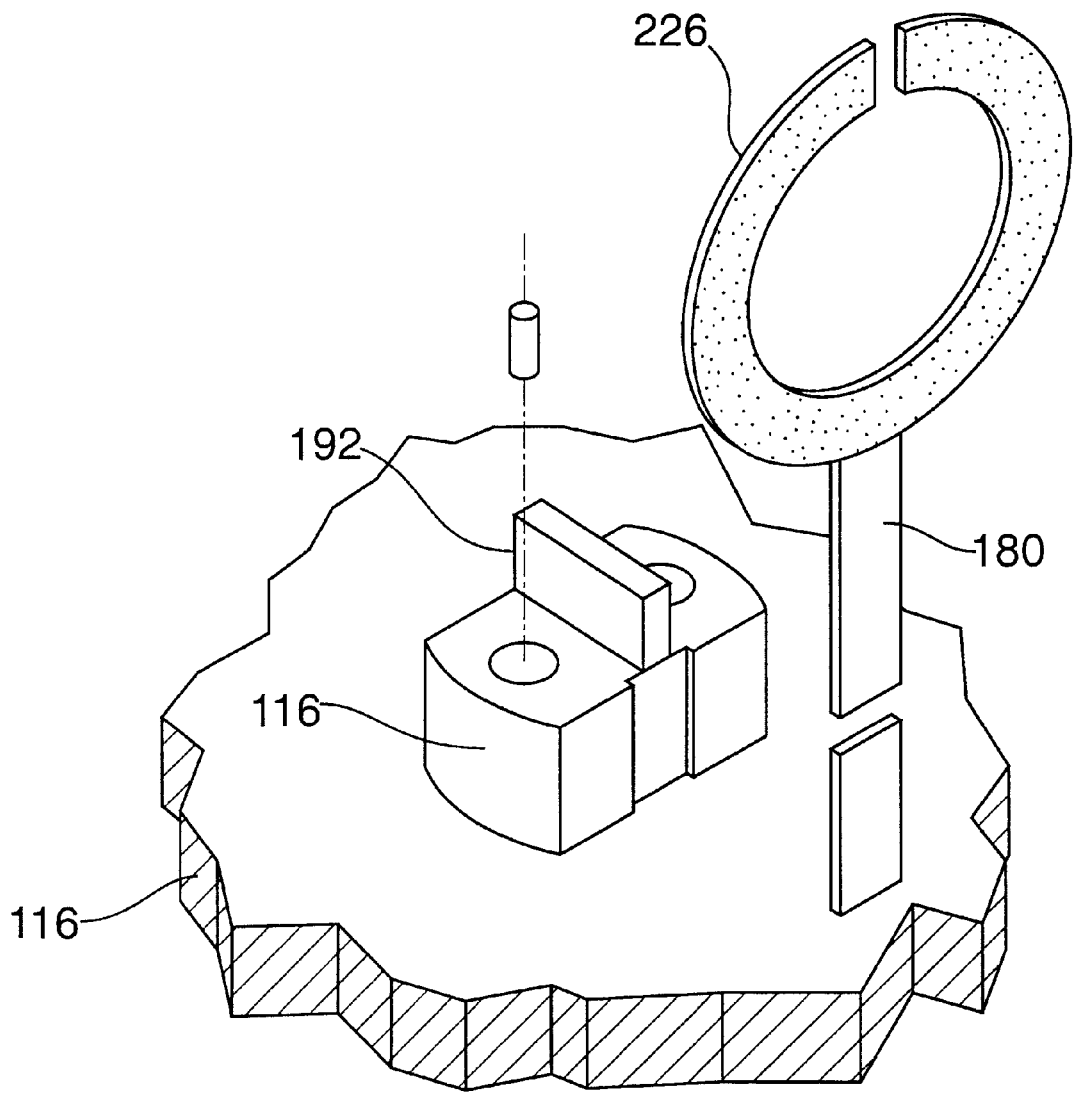
FIG. 14 illustrates connector details of the rf power strip located in the support arm shown in FIG. 6.

The fixed end 124 of the support arm 122 is connected to the stem 194 as illustrated in FIG. 13. The stem 194 is a hollow tube which flares at its upper end to define flanges 210 to which the fixed end 124 of the support arm 122 is bolted by bolts 212. To prevent excessive bearing force between the bolts 212 and ceramic fixed end 124, a Belleville spring washer 214 is provided between each bolt 212 and the fixed end 124 of the support arm 122.

A stainless steel bellows 216 is positioned between the flanges 210 and the lower wall of the processing chamber 112. The bellows 216 allow the support arm 122 to be moved vertically up and down, while at the same time providing a seal around the stem 194 as it passes through the wall 218 of the processing chamber 112.

As indicated previously, the stem 194 is in the form of a hollow tube. An electrically non-conductive tube 220 is located inside the tube forming the stem 194. The non-conductive tube 220 is typically made of a polyimide material and provides electrical isolation between the processing chamber 112 and a hollow rf conducting tube 222. The rf conducting tube 222 is connected to the rf source 142 and the rf conductive strip 180. The conductive cable 156 communicating between the thermocouple 152 and the temperature determination device 140 passes down the central bore formed in the rf conductive tube 222.

FIG. 14, when read with FIG. 13, illustrates how the connection is made between the rf conductive strip 180 and the rf conductive tube 222. As shown in FIG. 13, the rf conductive tube 222 flares at its upper end to define a circular flange 224. The rf conductive strip 180, as illustrated in FIG. 14, ends in a circular conductive hoop 226. When the support arm 122 is assembled, the hoop 226 is placed on the circular flange 224 of the rf conductive tube 222.

This provides a rf conductive connection to the rf conductive strip 180 which is coupled to the wafer support 116. This connection allows for easy assembly and disassembly of the support art 122. The connection also allows for a certain amount of rotational freedom (above the longitudinal access of stem 194) when the fixed end 124 of the support arm 122 is being positioned onto the flange 210 of the stem 194.

4. The Matching Network

In accordance with the present invention, the rf source 142 is coupled to both the wafer support 116 and the showerhead 136 through a matching network 145. The matching network 145 is a resistor/inductor/capacitor network. The matching network 145 matches the load impedance to the source impedance, in order to maximize the power delivered by the source at a given frequency. The matching network 145 also splits rf power between the wafer support 116 and the showerhead 136 and sets the phase shift of the rf signals provided to the showerhead 136 and the wafer support 116.

Figure 15A:
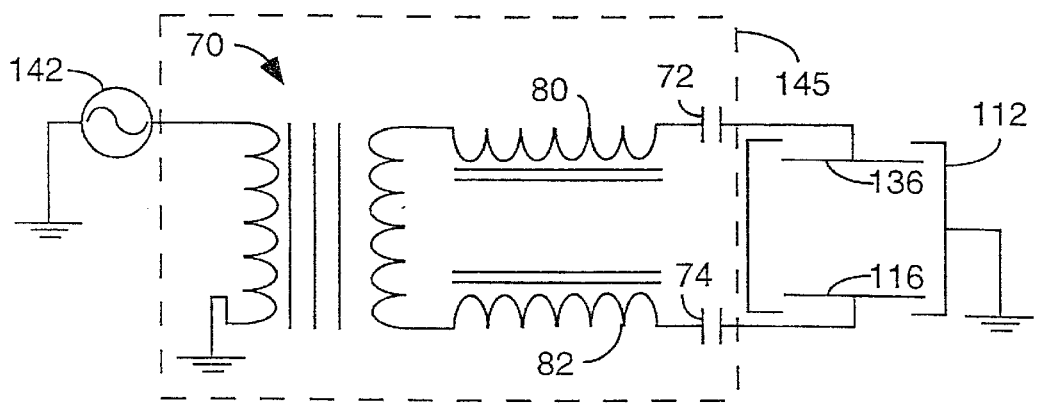
FIGS. 15(a)–15(c) illustrate embodiments of the matching network that is shown in FIG. 5.

A matching network 145 used in one embodiment of the present invention is illustrated in FIG. 15A. The matching network 145 shown in FIG. 15A includes a load match transformer 70, two inductors 80 and 82, and two capacitors 72 and 74. The load match transformer 70 is coupled at one end to the rf source 142 and ground, and on another end to the inductors 80 and 82. The inductors 80 and 82 are coupled to the showerhead 136 and wafer support 116, respectively, through capacitors 72 and 74, respectively.

The load match transformer 70 may have a primary to secondary turns ratio ranging from 1:1 to 1:4, with 1:1.22 being typical. In accordance with the present invention, the primary coil of the load match transformer 70 may have 18 turns, and the secondary coil of the load match transformer 70 may have 47 turns. The inductors 80 and 82 each have an inductance of 50 $\mu$H, and the capacitors 72 and 74 each have a capacitance of 0.01 $\mu$F.

Figure 15B:
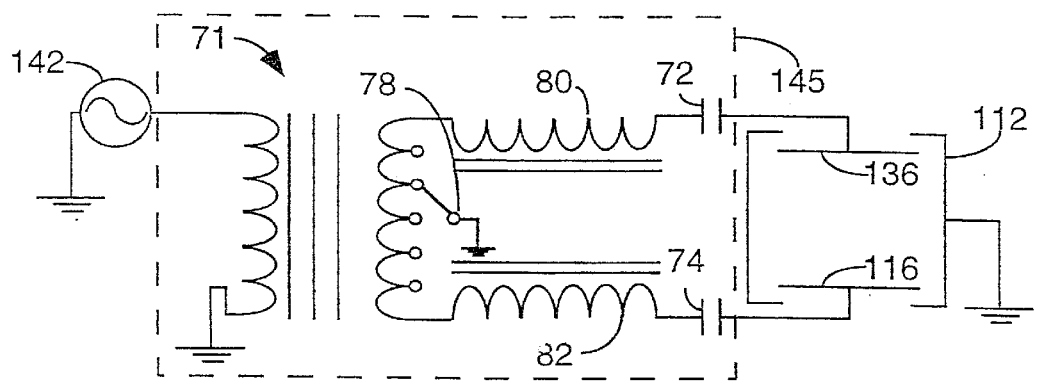

The power split and the phase shift between the rf signals at the showerhead 136 and wafer support 116 may be altered by modifying the turns ratio of the load match transformer 70. Alternatively, as shown in FIG. 15B, a load match transformer 71 may have a selectable ground tap 78. The selectable ground tap 78 allows for the selection of variable ground tap positions to change the power split and phase shift between the rf signals at the showerhead 136 and the wafer support 116.

Figure 15C:
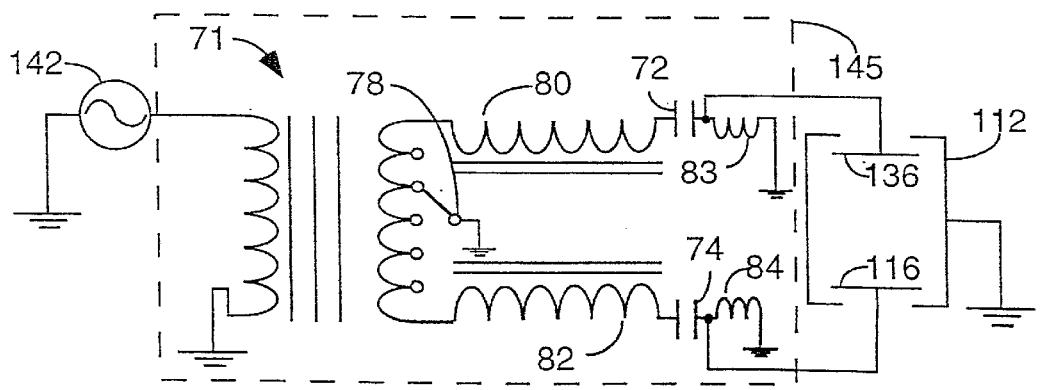

Yet another embodiment of the matching network 145 is shown in FIG. 15C. Capacitor 72 and the showerhead 136 are both coupled to ground through an inductive choke 83. Capacitor 74 and the wafer support 116 are both coupled to ground through an inductive choke 84. Inductive choke 83 and inductive choke 84 may each have a value of 500 $\mu$H. When such an embodiment is employed, the showerhead 136 and the wafer support 116 do not become DC biased.

Coupling both the showerhead 136 and the wafer support 116 to the rf source 142 through the matching network 145 is advantageous when the processing chamber 110 is employed for plasma annealing and/or oxidation. The phase shift between the rf signals at the showerhead 136 and the wafer support 116 may be set to provide for enhancing the uniformity of a plasma generated during post-deposition processing. An out of phase relationship between the showerhead 136 and the wafer support 116 signals causes the ions in the plasma to be more attracted to the wafer support 116 than the grounded processing chamber 112. The out of phase relationship also increases the voltage potential between the showerhead 136 and the wafer support 116, thereby enhancing the uniformity of the ion flux towards the wafer 114.

Adjusting the power split of the signals at the showerhead 136 and the wafer support 116 enables the intensity of ion bombardment of the wafer 114 and the showerhead 136 to be controlled. Negative biasing of the wafer support 116, during plasma generation, generally causes ions to increase their acceleration towards the wafer 114. Excessive negative biasing of the wafer support 116 causes ions to bombard the wafer 114 with such energy that the wafer 114 becomes damaged. Excessive negative biasing of the showerhead 136, during plasma generation, generally causes ions to bombard the showerhead 136 and create contaminant particles.

In embodiment of the present invention, the power split of the rf source's 145 signal may be selected by a chamber 110A operator. The power split may be set so that the negative biases of the showerhead 136 and the wafer support 116 minimize the potential for the aforementioned contamination and wafer damaging ion bombardment.

In accordance with the present invention, the matching network 145 may be configured to supply rf signals to the wafer support 116 and the showerhead 136 having the same power and frequency, but being 180 degrees out of phase. This efficiently couples rf power to the showerhead 136 and the wafer support 116 for transforming gases in the processing chamber 112 into plasma.

Embodiments of an rf split power configuration may be seen by reference to U.S. Pat. No. 5,314,603, entitled PLASMA PROCESSING APPARATUS CAPABLE OF DETECTING AND REGULATING ACTUAL RF POWER AT ELECTRODE WITHIN CHAMBER and issued to Sugiyama, et al., or to U.S. Pat. No. 4,871,421, entitled SPLIT-PHASE DRIVER FOR PLASMA ETCH SYSTEM and issued to Ogle, et al.

5. Chamber Operation

During a deposition process, the gas panel controller 50 causes the gas panel 52 to supply a CVD process gas, such as TDMAT, to the showerhead 136. Through the showerhead 136, the process gas is introduced into the processing chamber 112 and transported to the heated wafer 114. As a result, a thin film of material deposits on the upper surface of the wafer 114. When TDMAT is employed, the thin film of material that is formed is titanium nitride TiN.

During a post-deposition process that is performed in the semiconductor wafer processing chamber 110A, annealing, oxidation, or exposure to silicon may be performed, as will be described below. During a ,plasma annealing process, a plasma gas, such as nitrogen, hydrogen, argon, or a combination thereof is supplied to the showerhead 136 by the gas panel 52 under control of the gas panel controller 50. During a post-deposition oxidation process, an oxygen based gas, such as $O_2$ or a $N_2/O_2$ mixture is supplied to the showerhead 136 by the gas panel 52 under control of the gas panel controller 50. During a silicon exposure process, a silicon based gas, such as silane ($SiH_4$), is supplied to the showerhead 136 by the gas pannel 52 under control of the gas panel controller 50.

In both the plasma annealing process and the oxidation process, the gas supplied by the showerhead 136 is transformed into a plasma containing positively charged ions that react with the wafer 114. In the silicon exposure process, the gas is infused with energy through the heating of the wafer 114 and wafer support 116. Any carrier gas that is employed during either the deposition or post-deposition processing, as well as any by-products from the deposition or post-deposition processing, are exhausted from the processing chamber 112 by the pressure control unit 157.

6. Alternative Chamber Configurations

Figure 16:
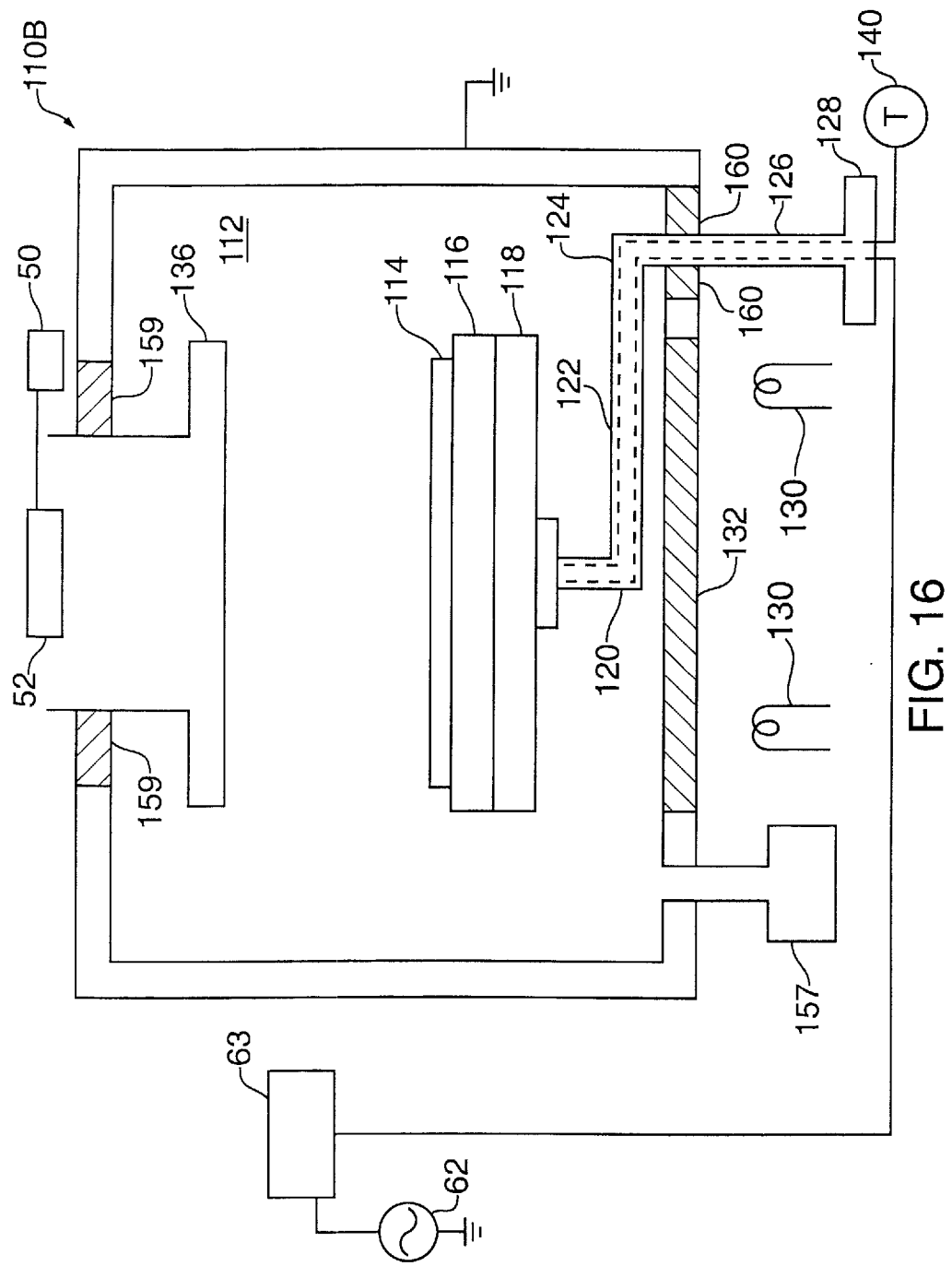
FIG. 16 illustrates an alternate embodiment of a semiconductor wafer processing chamber in accordance with the present invention.

FIG. 16 illustrates a semiconductor wafer processing chamber 110B that incorporates an alternative embodiment of the present invention for carrying out a process in accordance with the present invention. The semiconductor wafer processing chamber 110B shown in FIG. 16 is the same as the chamber 110A depicted in FIG. 5, except that the showerhead 136 is not coupled to an rf source. An rf source 62 is coupled to the wafer support 116 through a matching network 63, and the showerhead 136 is grounded.

The matching network 63 uses conventional means for matching the load impedance of the wafer support 116 to the impedance of the rf source 62. The matching maximizes the power delivered by the rf source 62 at a given frequency. In accordance with the present invention, the matching network 63 and rf source 62 may be configured to supply an rf signal to the wafer support 116, so that sufficient rf energy is provided for plasma annealing or oxidation without causing the wafer 114 to become excessively negative biased.

Figure 17:
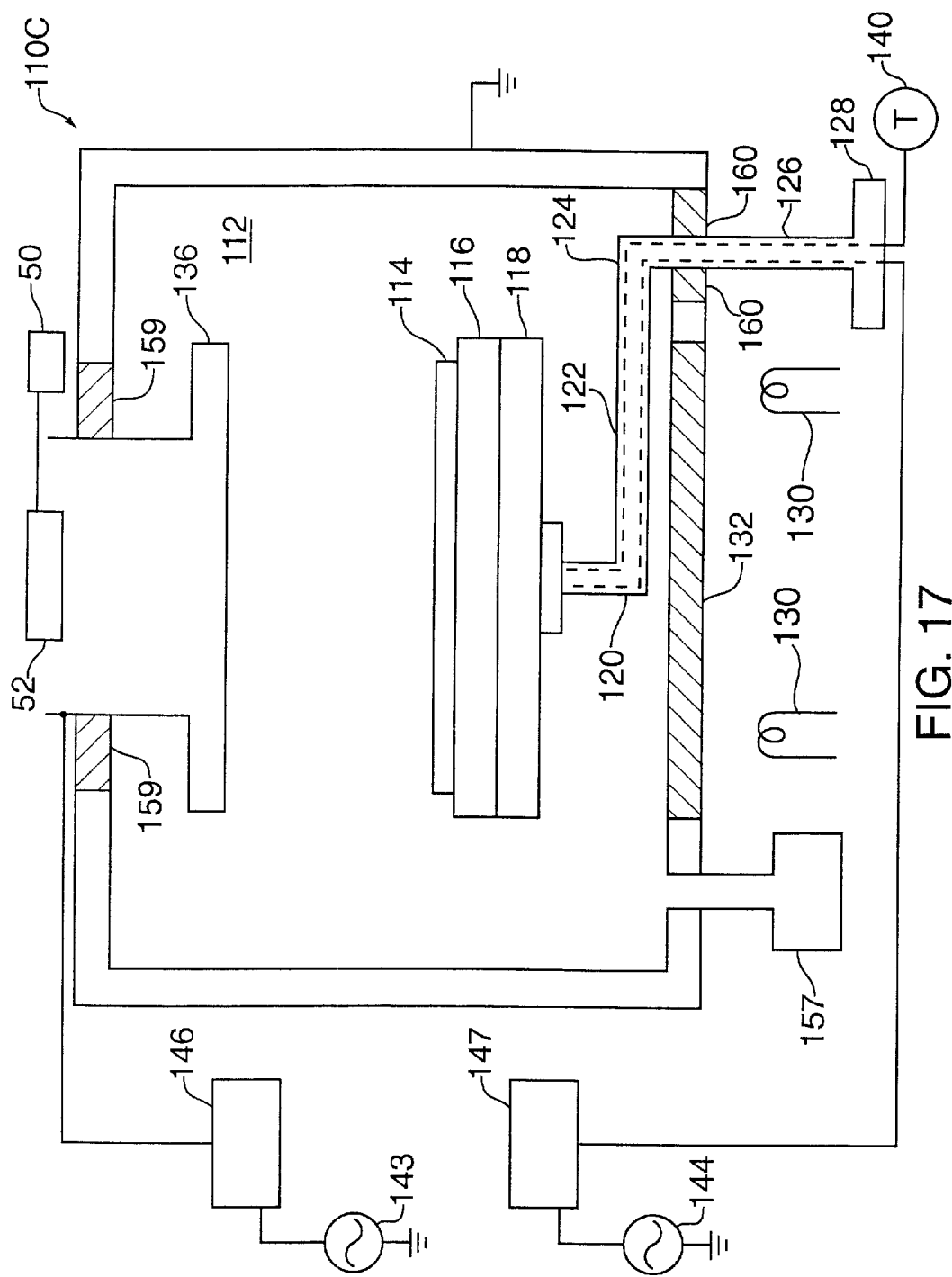
FIG. 17 illustrates an alternate embodiment of a semiconductor wafer processing chamber in accordance with the present invention.

FIG. 17 illustrates a semiconductor wafer processing chamber 110C that incorporates an alternative embodiment of the present invention and is capable of carrying out a process in accordance with the present invention. The semiconductor wafer processing chamber 110C in FIG. 17 is the same as the chamber 110A depicted in FIG. 5, except that the showerhead 136 and the wafer support 116 are each coupled to a different rf source 143 and 144, respectively. Rf source 143 is coupled to the showerhead 136 through matching network 146, and rf source 144 is coupled to the wafer support 116 through matching network 147.

The matching networks 146 and 147 each use conventional means for matching the load impedance of the showerhead 136 and wafer support 116, respectively, to a source impedance. The matching maximizes the power delivered by each source at a given frequency. Preferably, the rf sources 143 and 144 are coupled together (not shown) to provide for controlling the phase shift and power split between the rf signals provided to the showerhead 136 and the wafer support 116. In accordance with the present invention, the matching networks 146 and 147 and rf sources 143 and 144 may be configured to supply rf signals to the wafer support 116 and the showerhead 136 that have the same power and frequency, but are 180 degrees out of phase.

In yet another embodiment of the present invention, the wafer support 116 in any of FIGS. 5, 16, or 17 may be a resistive heater. The resistive heater supports the wafer 114 and incorporates a resistive coil for heating the wafer 114.

The semiconductor wafer processing chambers shown in FIGS. 5, 16, and 17 may be employed to carry out a number of processes. In a further aspect of the present invention, a process is provided for forming a diffusion barrier. It will be recognized that the process of the present invention may be advantageously performed in the aforementioned apparatuses. However, it should be further recognized that the disclosed method may be performed in any number of suitable chambers.

B. Film Construction

1. Overview

Embodiments of the present invention provide for the construction of a film with an improved resistivity value in an integrated circuit. One film that may be constructed is a diffusion barrier. However, other films that are intended to inhibit the diffusion of contact metals, such as aluminum and copper, may also be constructed using embodiments of the present invention.

In accordance with the present invention, a layer of material is deposited on a substrate, such as a semiconductor wafer. The material is then plasma annealed to reduce the resistivity of the deposited material. Subsequently, a new layer of the material is deposited on the previously deposited material. The material is once again annealed to reduce the material's resistivity. The deposition and annealing of the material may be repeated several timed to form a film that resides on the upper surface of the wafer.

Another aspect of the present invention provides for the annealed material on the wafer to be stuffed with molecules.

The stuffing enhances the material's ability to inhibit the diffusion of contact metals, such as aluminum or copper. In order to enhance the film's operation as a barrier to aluminum, the stuffing may be achieved through oxidation of the annealed material. In order to enhance the film's operation as a barrier to copper, the stuffing may be achieved through exposing the annealed material to silane ($SiH_4$). Alternatively, reduced diffusion of copper may be obtained by depositing a material that is a ternary metal silicon nitride.

Yet another aspect of the present invention provides for the deposition, annealing, and stuffing of the material on the wafer to be performed in-situ.

2. Annealing to Lower Film Resistivity

In accordance with the present invention, a film may be formed on a wafer by depositing a layer of material on the wafer and plasma annealing the layer of material, so as to reduce its resistivity.

The layer of material is deposited on a wafer in a chamber that is capable of performing a traditional chemical vapor deposition, such as chamber 10 in FIG. 3(a), chamber 110A in FIG. 5, chamber 110B in FIG. 16 or chamber 110C in FIG. 17. The deposition of a titanium nitride material may be achieved through the use of a metallo-organic titanium compound, preferably tetrakis(dialkylamido) titanium (Ti($NR_2)_4$).

A carrier gas, such as helium, argon, nitrogen, or hydrogen, brings the titanium compound into the chamber. In the chamber, the titanium compound is reacted with remotely generated reactive species, such as halogen, ammonium or hydrogen radicals. To facilitate the deposition of the titanium nitride, the wafer temperature is set to be about 200–600° C., and the processing chamber pressure is set to be about 0.1–100 Torr.

The deposited titanium nitride contains significant amounts of carbon, thereby causing the resulting titanium nitride films to be chemically reactive. Consequently, oxygen is absorbed into the film, when the film is exposed to air or other oxygen containing gases. Since the oxygen absorption is uncontrolled, the stability of the film is impaired and the resistivity of the film is adversely increased. This may result in the reliability of devices formed on the wafer being poor.

After exposure to air, the sheet resistivity of the deposited titanium nitride film can increase to values of about 10,000 $\mu\Omega$-cm/sq up to about 100,000 $\mu\Omega$-cm/sq. This is highly undesirable when the deposited titanium nitride is operating as a barrier layer for conductive contacts and vias. For a barrier layer, a resistivity on the order of about 1,000 $\mu\Omega$-cm or less is desirable.

In accordance with the present invention, the deposited titanium nitride film is plasma annealed with an inert plasma containing high energy ions. The ions are obtained by applying a DC bias voltage to the wafer. The DC bias voltage may be applied to the wafer by a low power rf source coupled to the wafer support and providing sufficient power to form a plasma from a precursor gas. The application of a voltage of about 100 to 1,000 volts to the wafer is sufficient. For example, 400 volts having only 100 watts of rf power may be applied to form a plasma. This is sufficient to produce high energy ions and to passivate or densify a titanium nitride film so that it remains stable overtime.

When titanium nitride films that are annealed in accordance with the present invention are exposed to air, oxygen, or water vapor, the oxygen is either not absorbed or absorbed to a much lesser extent than if no bias voltage had been applied to the wafer. Titanium nitride films deposited and annealed in accordance with the present invention are more crystalline, contain more nitrogen, and have a reduced oxygen and carbon content compared to titanium nitride films that are produced by the conventional thermal CVD of metallo-organic titanium compounds. The deposited titanium nitride films that are annealed according with the present invention also have a low and stable sheet resistivity.

The exact mechanism of the present invention is not known. However, it is believed that the high energy ion bombardment of the deposited material on a biased substrate densifies the film.

a. Nitrogen Plasma

In one embodiment of the present invention, the gas used to form the plasma for the annealing of deposited titanium nitride may be any gas, but is preferably a non-oxygen-and-carbon containing gas such as nitrogen, ammonia, or argon. Nitrogen is the most effective for passivation of the titanium nitride material. Alternatively, the deposited material can be bombarded with ions generated from a nongaseous species, such as ion sources. The plasma treatment of the deposited titanium nitride does not adversely affect particle performance, step coverage, deposition rate or barrier performance of the deposited material.

Titanium nitride has been deposited on a silicon wafer under the following conditions in a conventional vacuum chemical vapor deposition chamber 10. The pressure in the processing chamber 12 was 0.45 Torr, and the wafer support 16 was set to a temperature of 420° C. A helium flow of 400 sccm was used through a bubbler containing Ti($NR_2)_4$, and a flow of nitrogen dilutant was set at 100 sccm. An argon purge gas was flowed in the processing chamber at 200 sccm following the deposition of the titanium nitride. A conventional CVD process for depositing titanium nitride is disclosed in U.S. Pat. No. 5,246,881 issued to Sandhu, et al.

As a result, titanium nitride was deposited at a deposition rate of about 425 Å per minute. The resultant titanium nitride film was very uniform in thickness, having a four wafer thickness variation of only 3.03%. However, the sheet resistivity (average of 4 wafers) was high at 11,360 $\mu\Omega$-cm/sq. The resistivity was also unstable.

Figure 18:
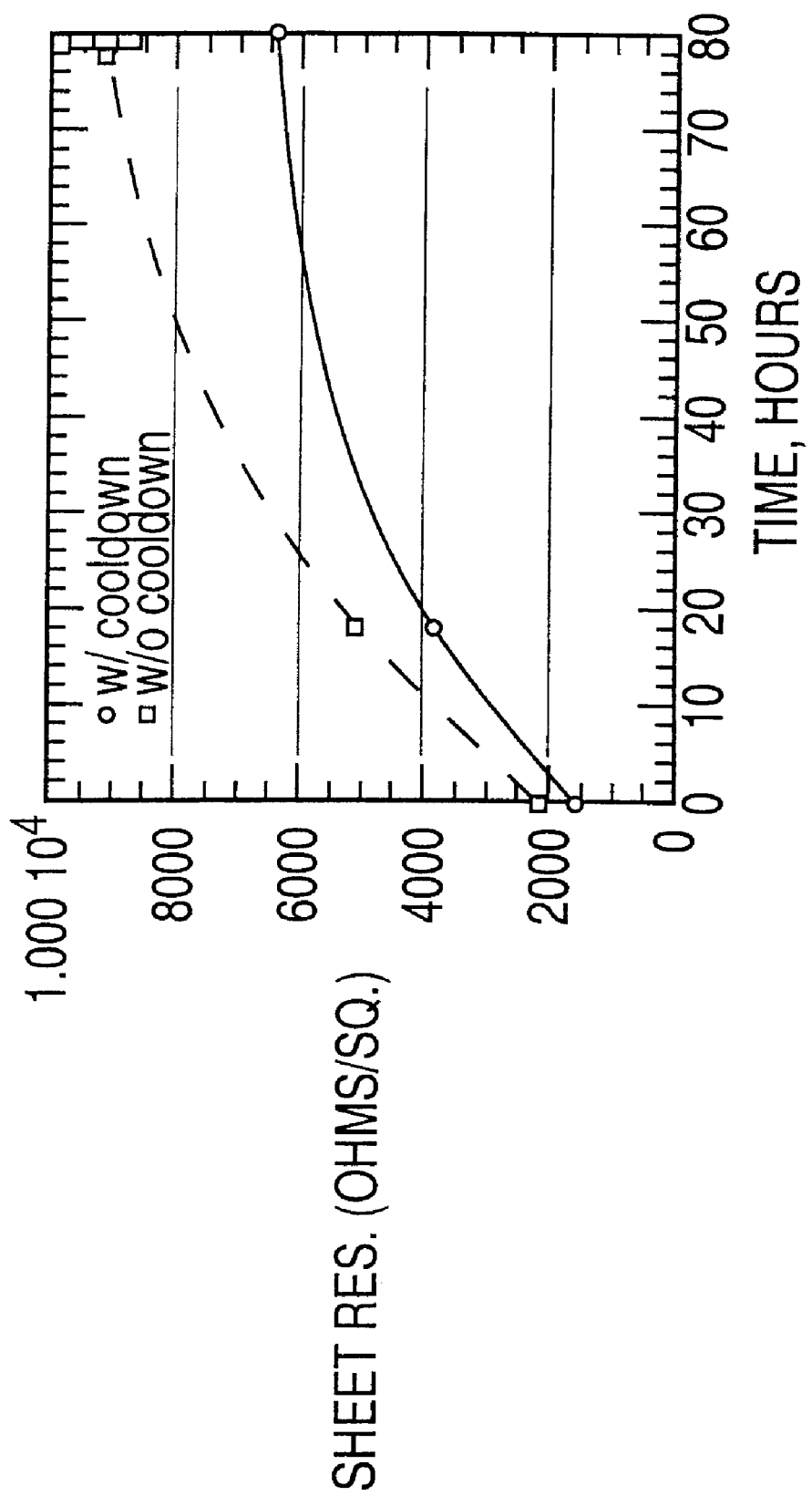
FIG. 18 illustrates a graph of sheet resistance versus time for titanium nitride film deposited by using a conventional deposition process.

FIG. 18 is a graph of sheet resistivity of the deposited titanium nitride in $\Omega$/sq versus time in hours.

The measurements denoted by a □ were taken from films withdrawn from the deposition chamber after the desired film thickness was obtained. The measurements denoted by a ○ were taken from films cooled to a temperature of 150° C. prior to removing them from the deposition chamber. Although the sheet resistivity of the ○ films is lower than those of the □ films, both films are unstable, and the sheet resistivity increases with time. These properties are undesirable for a diffusion barrier.

Figure 19:
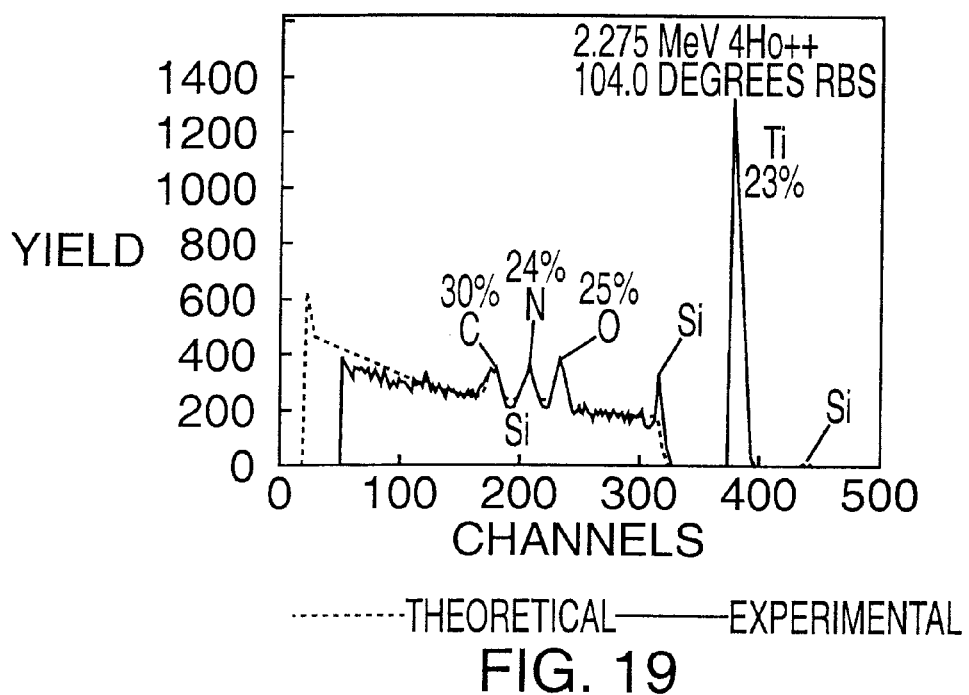
FIG. 19 illustrates a Rutherford backscattering spectrum of a titanium nitrate film deposited on a silicon wafer using a conventional deposition process.

Rutherford backscattering measurements were made on the deposited titanium nitride film. The resulting spectrum is given in FIG. 19. The peaks for carbon, C, nitrogen, N, and oxygen, O, are marked on the spectrum, as is the silicon interface. The content of various material in the titanium nitride is as follows: carbon content about 30%, nitrogen content about 24%, oxygen content about 25%, and titanium content about 23%. This shows that the deposited titanium nitride material contains comparatively high levels of carbon and oxygen impurities.

In an effort to reduce the titanium nitride's sheet resistivity, the deposition method of the titanium nitride was varied by the addition of various gases during the deposition procedure. The results are given in Table I, which appears in FIG. 20. The Control layer of titanium shown in Table I was deposited using the method set forth immediately above.

Figure 23:
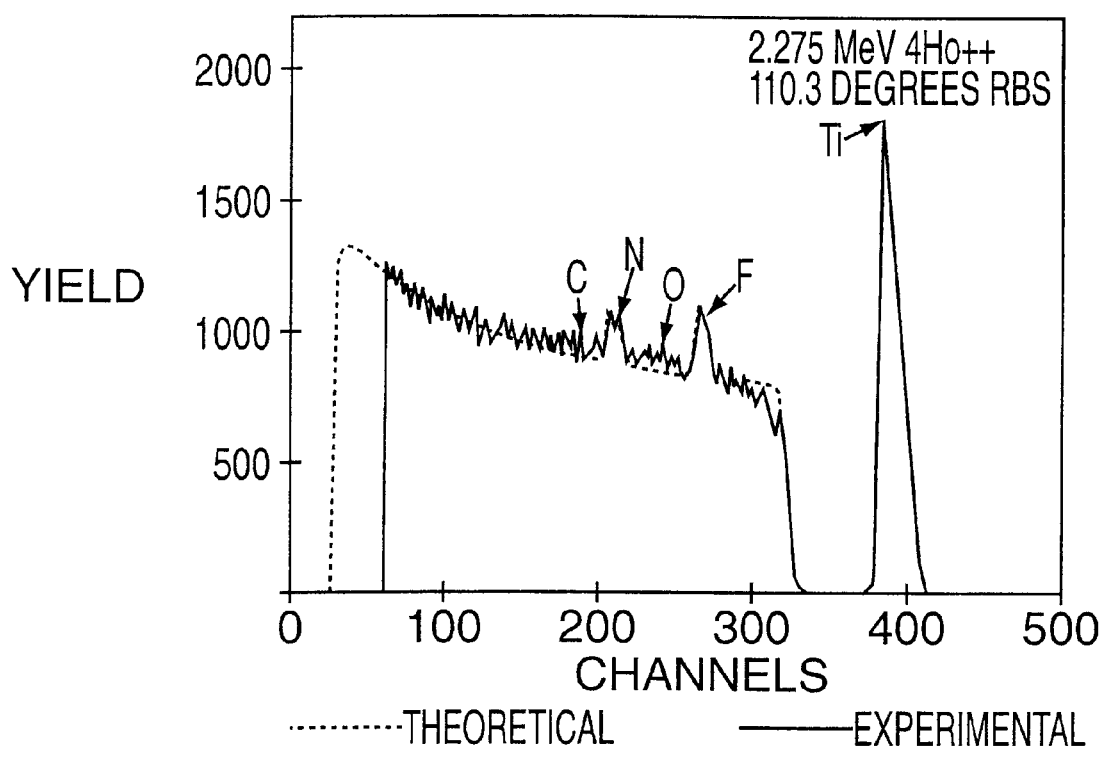
FIG. 23 illustrates a Rutherford backscattering spectrum of a titanium nitride film deposited using chemical vapor deposition with a gas flow of $NF_3$.

The most successful run of reducing the sheet resistivity of the titanium nitride included a flow of $NF_3$ (7 sccm) during deposition. This reduced the sheet resistivity to 2,200 $\mu\Omega$-cm. However, Rutherford backscattering spectra of the $NF_3$ treated material (see FIG. 23) shows that fluorine is incorporated as an impurity in the film. The incorporation of the fluorine is undesirable.

Next, pre- and post-deposition flow of gases and plasma treatment were used to determine whether such treatment would affect the sheet resistivity of a deposited titanium nitride. In two cases, a plasma was initiated before and after chemical vapor deposition of titanium nitride. The plasma was generated using a low power of 100 watts and without biasing the substrate silicon wafer receiving the titanium nitride deposition. The results are summarized in Table II, which appears in FIG. 21. None of the pre- and post-deposition treatments had much effect on the sheet resistivity of the deposited titanium nitride. Thus, it was highly unexpected that the application of a bias voltage to the wafer in a plasma would decrease the sheet resistivity and cause it to remain stable over time.

Aspects of the present invention will be further described by means of the following examples, but the invention is not meant to be limited to the details described therein. A series of tests was conducted in which a bias voltage of 400 volts was applied to a silicon wafer substrate having a layer of titanium nitride thereon. The titanium nitride was deposited on the wafer in a chamber such as chamber 110B of FIG. 16 and annealed with a plasma at an applied rf power of about 100 watts. Deposition and biasing were cycled sequentially. The two steps were cycled up to five times. A summary of depositions thickness, number of cycles and resistivity obtained over time are given Table III, which appears in FIG. 22. The Control was deposited in five uninterrupted steps, but without being annealed in a plasma between depositions.

The data in Table III shows that titanium nitride resistivity can be markedly reduced and stability dramatically improved by a post deposition annealing of the titanium nitride. In each of the Examples in Table III, the resistivity and change in resistivity over time is improved over the Control case. The initial resistivity of the annealed titanium nitride is lower, and the resistivity increases less over time.

Figure 24:
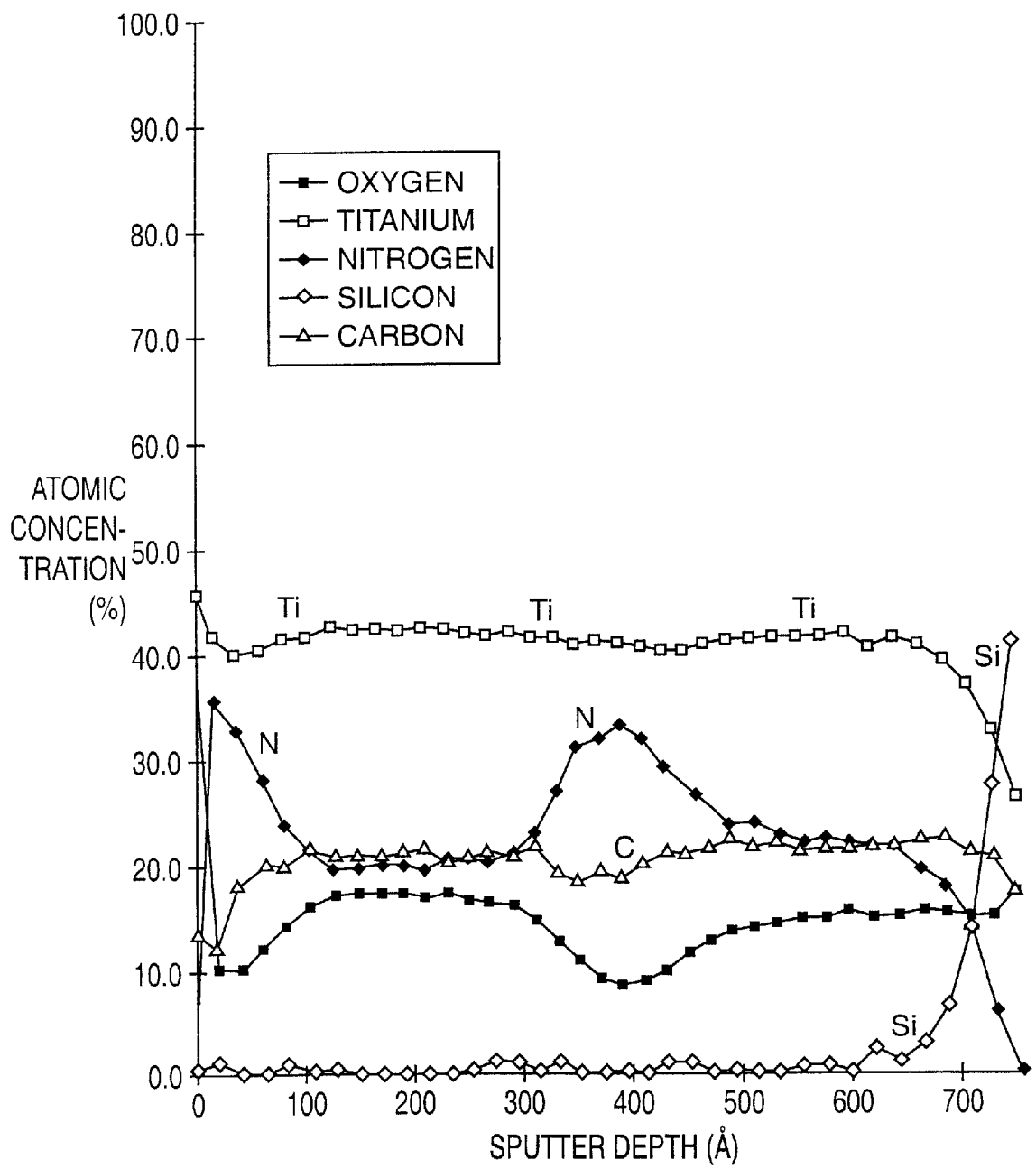
FIG. 24 illustrates an Auger sputter analysis graph of a titanium nitride film in accordance with the present invention.

FIG. 24 is a graph an Auger analysis of the titanium nitride film of Example 1. The graph displays the atomic concentration of elements in the film versus the film's sputter edge depth in angstroms. The titanium nitride was biased twice for 30 seconds (see Table III above). As shown in FIG. 24, the titanium concentration remains steady, but the graph clearly shows that the film surface nitrogen concentration is high, while carbon and oxygen concentrations are low. This reduction in carbon and oxygen impurity levels continues for a depth of about 100 Å. At a 400 Å depth, when the film was first annealed with high energy nitrogen ions, the nitrogen concentration rises, while the carbon and oxygen concentrations decrease. The graph of FIG. 24 also shows a change in the elemental composition of the film after annealing in accordance with the present invention. The change in elemental analysis with depth is shown in Table IV, which appears in FIG. 25.

Figure 26:
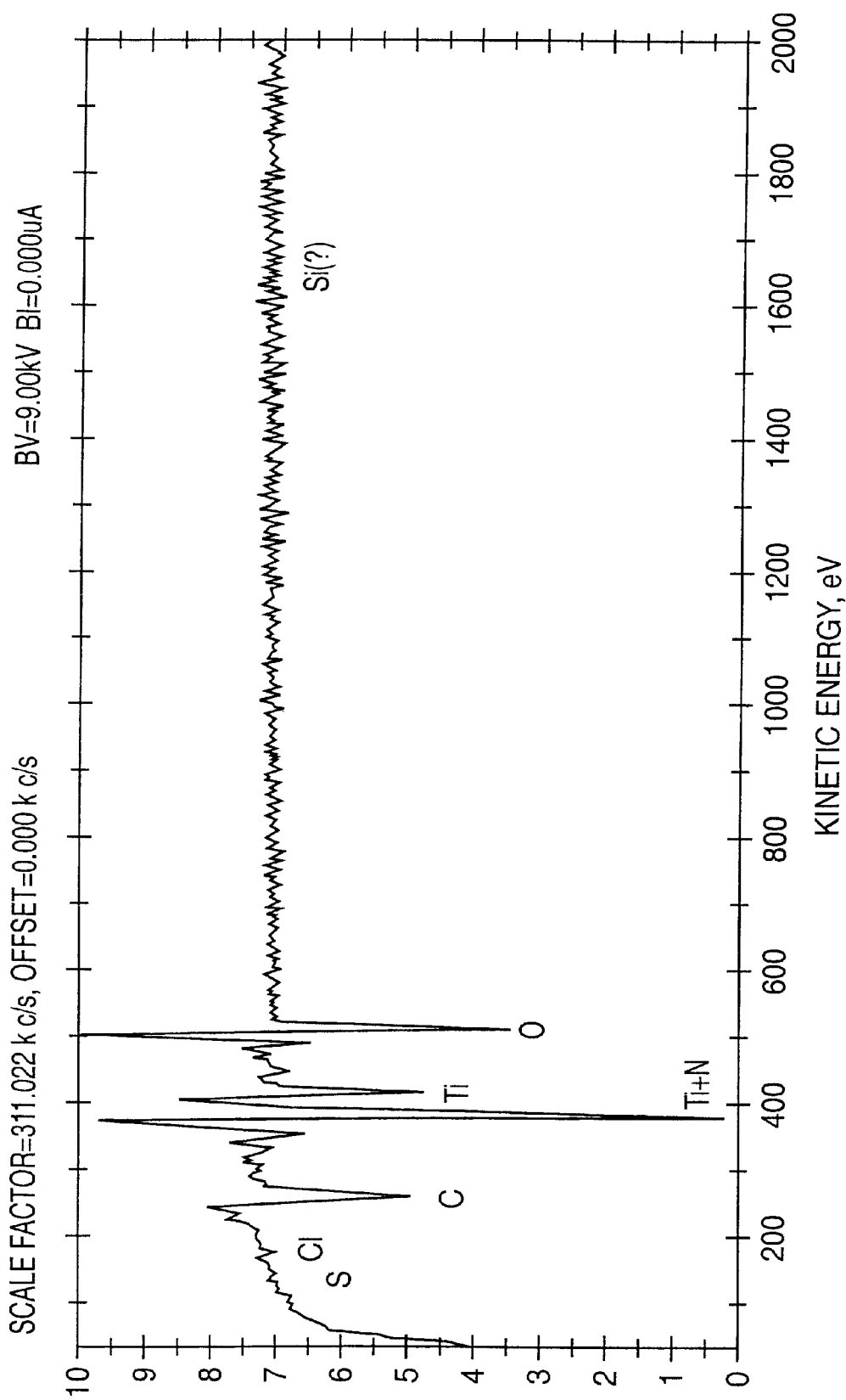
FIG. 26 illustrates an Auger surface spectrum of elements of another titanium nitride film in accordance with the present invention.

Since a 100 Å thick layer of titanium nitride is adequate for a barrier layer, the present post-deposition annealing is ideal for improving the stability and reducing the resistivity of titanium nitride barrier layers. An Auger spectrum showing surface elements present on the post deposition annealed titanium nitride of Example 7 is shown in FIG. 26. This spectrum shows that the bulk of material deposited is titanium nitride with some titanium present. Carbon and oxygen are present at the surface as impurities.

Figure 27:
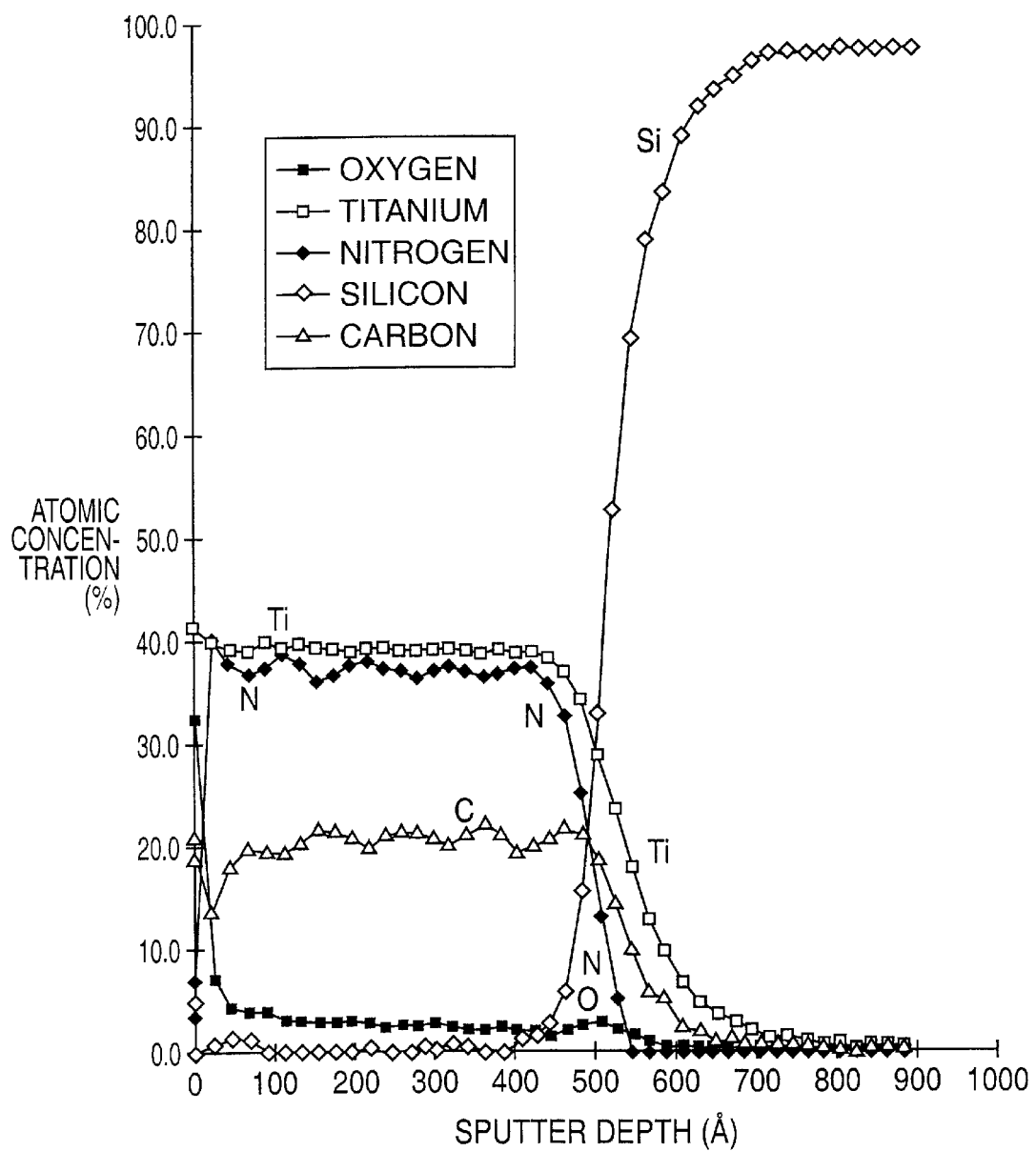
FIG. 27 illustrates a graph of the atomic concentration of various elements in the titanium nitride film of FIG. 26.

However, Auger sputtering analysis of the Example 7 film, as shown in FIG. 27, shows that the oxygen concentration drops markedly in the bulk of the film to a low level. Carbon is the only other major impurity besides oxygen, but it remains unaffected by the present annealing process. In a depth of 200 Å, concentrations of various elements in the film in atomic percent are: oxygen, 2.8%; carbon, 20.9%; titanium 38.8%; and nitrogen, 37.5%. No silicon was present.

Figure 28:
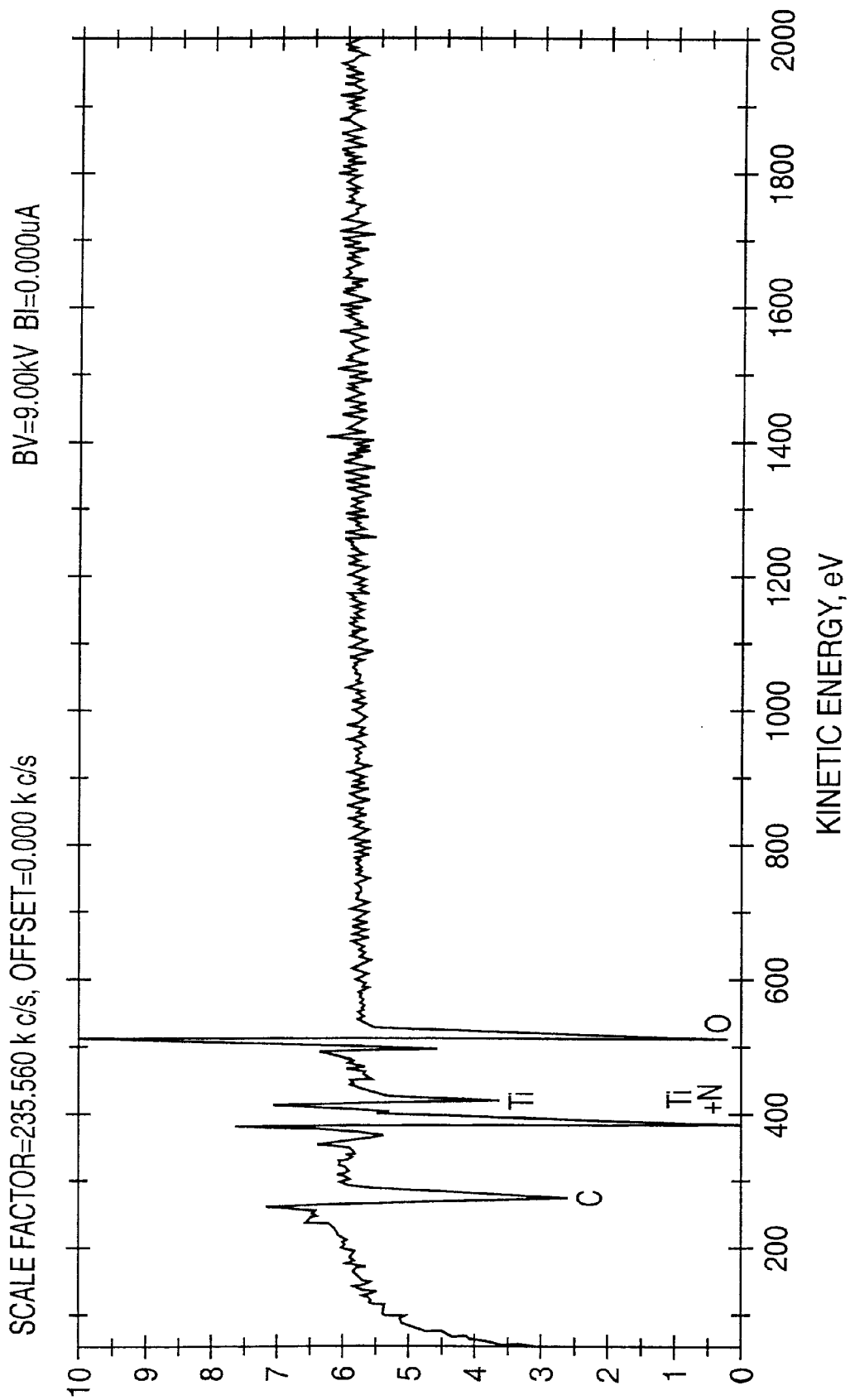
FIG. 28 illustrates an Auger surface spectrum of elements of a Control titanium nitride film.
Figure 29:
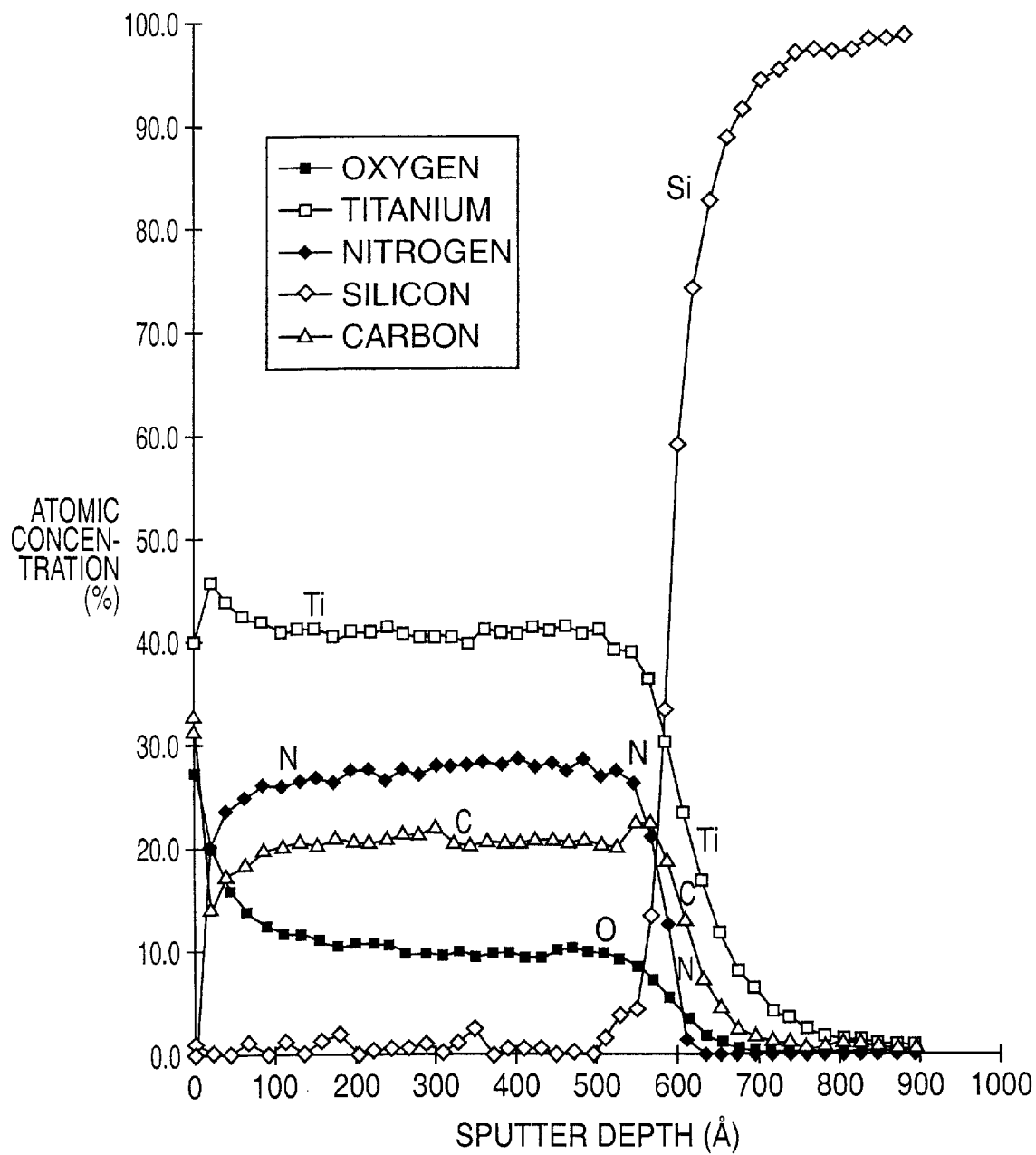
FIG. 29 illustrates a graph of the atomic concentration of various elements in the Control titanium nitride film of FIG. 28.

As a comparison, surface Auger analysis of the Control film is shown in FIG. 28, and sputter Auger analysis of the Control film is shown in FIG. 29. The oxygen content of the Control film is significantly higher. At 200 Å depth, the concentration of elements of the control film in atomic percent are: oxygen, 10.8%; carbon, 20.7%; titanium, 41.0%; and nitrogen, 27.5%. No silicon was present.

Figure 30:
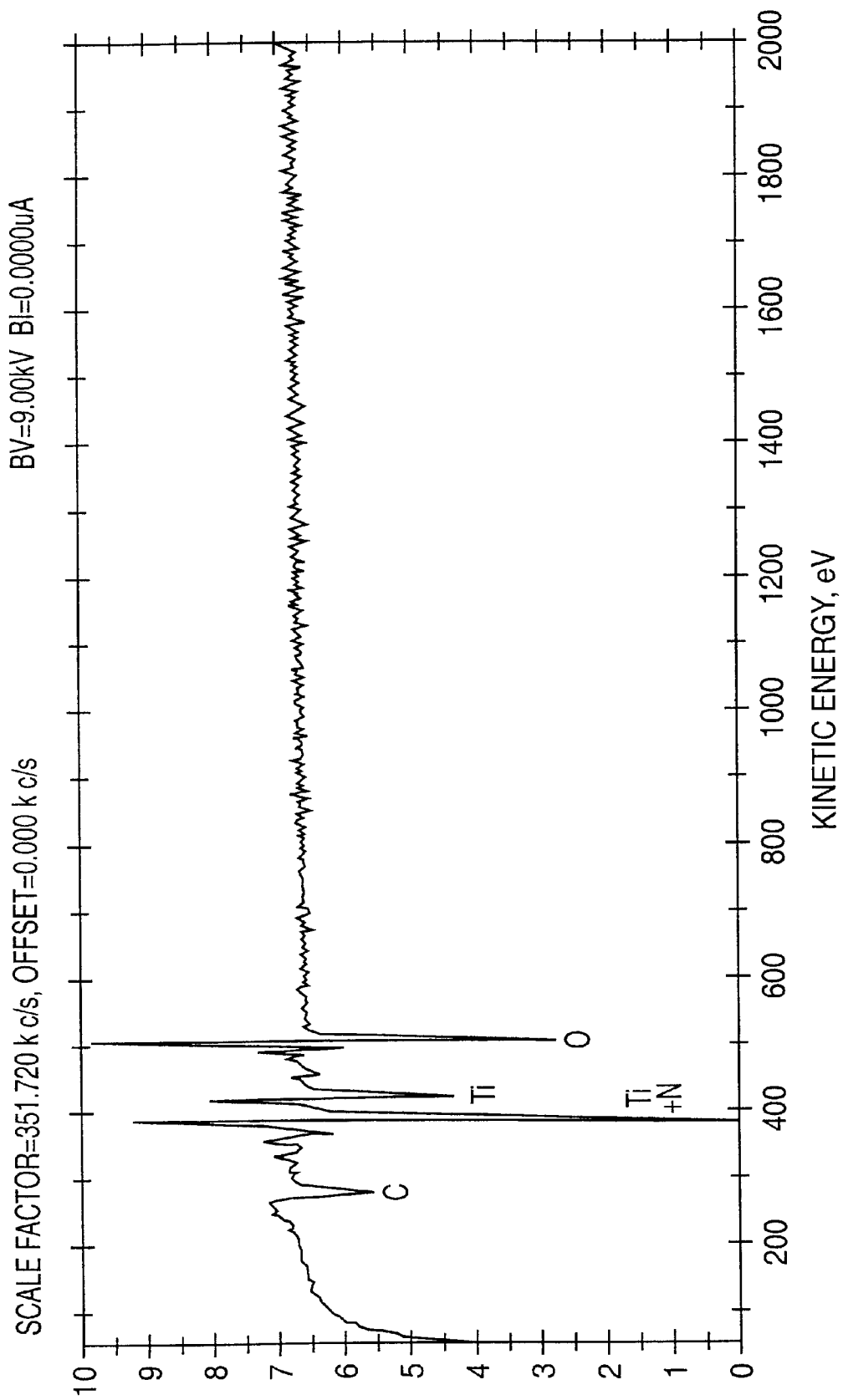
FIG. 30 illustrates an Auger surface spectrum of elements of another titanium nitride film in accordance with the present invention.
Figure 31:
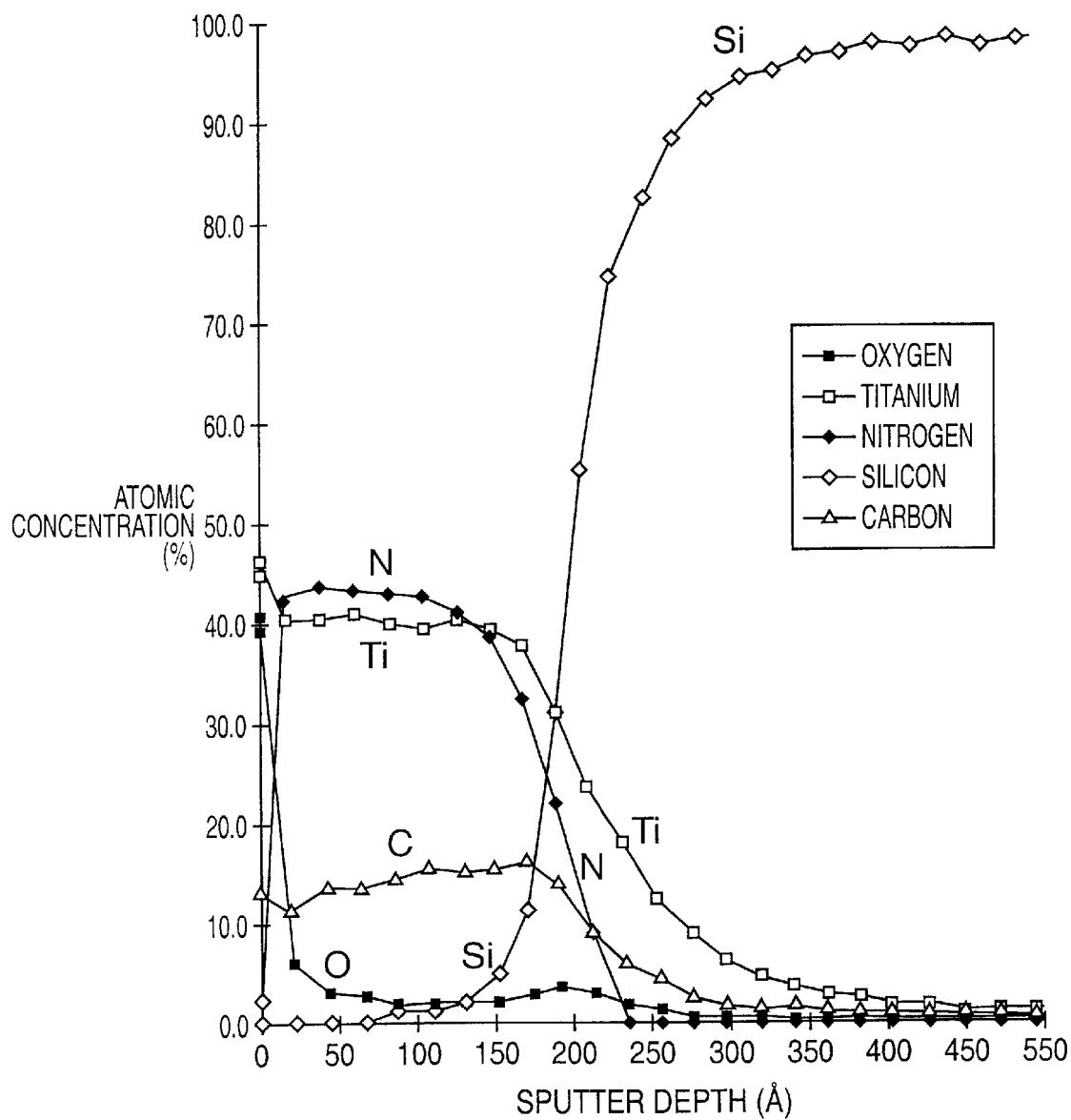
FIG. 31 illustrates a graph of the atomic concentration of various elements in the titanium nitride film of FIG. 30.

Surface Auger analysis of the titanium nitride film of Example 8 is shown in FIG. 30, and sputter Auger analysis versus depth in angstrom is shown in FIG. 31. The oxygen content of this film was low. At 43 Å depth, the concentration of elements in atomic percent are: oxygen, 3.1%; carbon, 13.7%; titanium, 40.0%; and nitrogen, 43.2%. No silicon was present.

Rutherford backscattering was used to determine the density in atoms/cm$^3$ of the Control and Example titanium nitride deposited films. The data is summarized in Table V, which appears in FIG. 32. As seen from the data in Table V, plasma annealing, including the bombardment of the deposited titanium nitride with high energy ions, increases the density of the titanium nitride film as compared to the Control film.

The present invention is not limited to titanium nitride barrier layers. The present invention may also improve properties and chemical compositions of other materials such as aluminum, copper, tantalum, tantalum pantoxide, silicides, other nitrides. For example, properties and chemical compositions of binary metal nitride $M_xN_y$ and ternary metal silicon nitride $M_xSi_yN_z$ (where M may be Ti, Zr, Hf, Ta, Mo, W and other metals) may be improved by practicing aspects of the present invention. Substrates other than a silicon wafer can also be used such as stainless steel, metals, oxides, glasses, and suicides.

The deposition and plasma annealing can be performed in a single CVD chamber fitted with a precursor gas and plasma capability, such as chambers 110A, 110B and 110C. When employing chamber 110A, 110B, or 110C, films of titanium nitride can be deposited and directly thereafter annealed in the same chamber. Alternatively, more than one chamber may be employed when an apparatus such as the one shown in FIG. 3(a) is employed in practicing the present invention. When more than one chamber is employed a vacuum is preferably maintained during the transfer of the substrate from the CVD chamber 10 to an annealing chamber.

The following procedure may be followed when the plasma annealing of deposited titanium nitride is performed in chamber 110B. The wafer 114 resides on the wafer support 116 and is spaced about 0.3 to 0.8 inches, preferably 0.6 to 0.7 inches, from the showerhead 136. Energetic ions are obtained by applying rf energy to the substrate from the rf signal source at about 350 KHz at a power of 100 to 500 watts. This translates to about 0.3 to 1.6 watts of power per square centimeter ($CM^2$) of surface area of the wafer 114.

With the negatively powered wafer support 116 and the showerhead 136 and chamber walls grounded, a DC self-bias voltage between 50 to 1,000 volts is induced. Preferably, the DC self-bias voltage is between 200 to 800 volts, between the wafer 114 and ground. This is sufficient to attract ions to impact the wafer 114 surface at high energy. As a result, the deposited titanium nitride is passivated or densified so that it remains stable over time.

Figure 33:
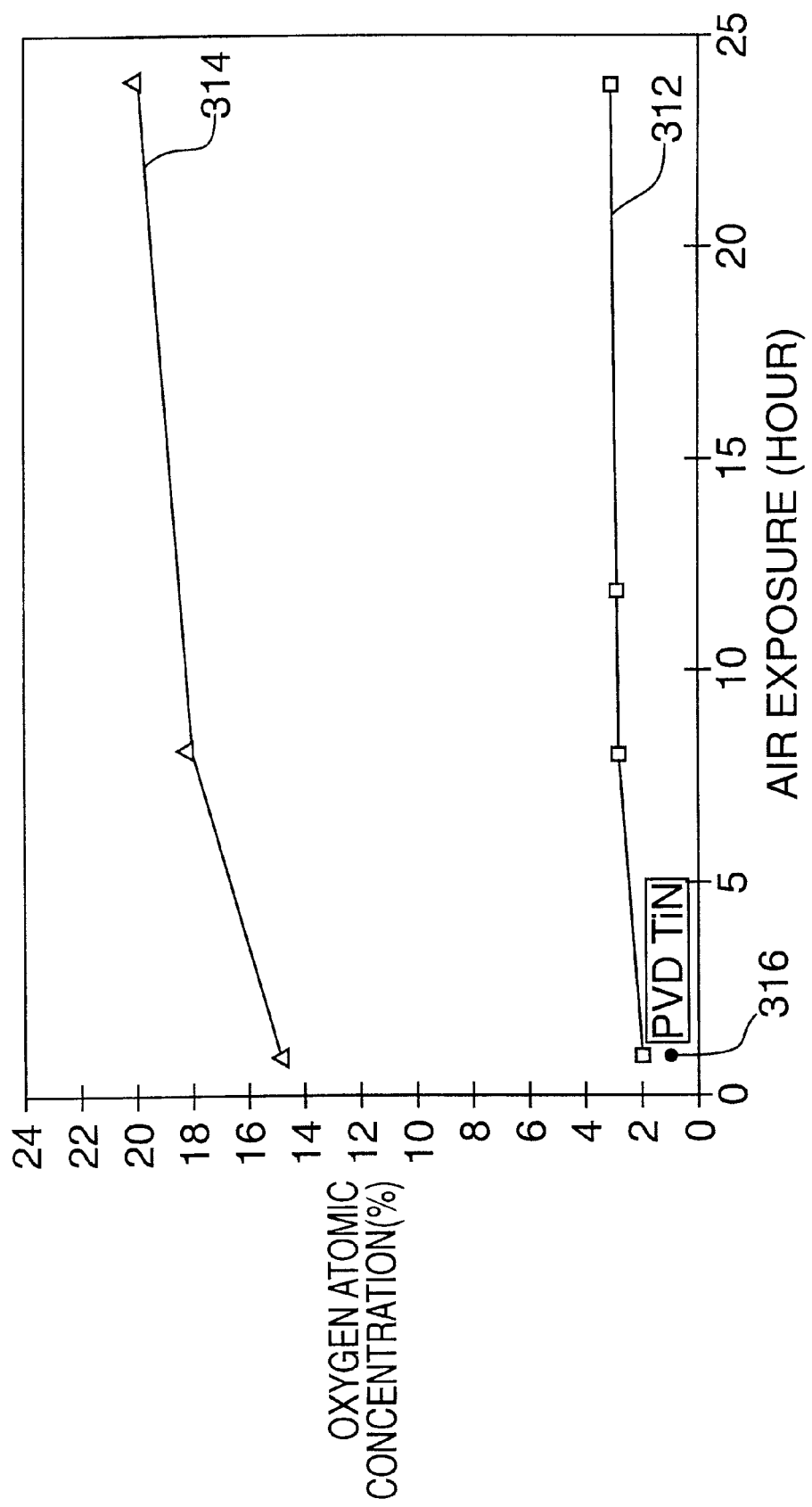
FIG. 33 illustrates the absorption of oxygen by films produced in accordance with the present invention.

FIG. 33 is a graph of atomic oxygen concentration versus air exposure time for two different layers of titanium nitride formed in accordance with the present invention. Both titanium nitride films were deposited and plasma annealed in the same chamber. The chamber was similar to chamber 110B, which is described above.

For each film, a 200 Å thick titanium nitride film was formed by cycling deposition and annealing. To do this, a 100 Å layer was deposited and thereafter annealed, followed by the deposition and annealing of a second 100 Å layer. Annealing was achieved using an $N_2$ plasma. The percentage of atomic oxygen concentration was measured for the two films repeatedly over a period of over 24 hours and is reflected by plot 312.

As can be seen from plot 312, the concentration of oxygen was initially about 2%. After 24 hours, the content was less than 2.5%, indicating that the deposited films were very stable. By comparison, plot 314 illustrates an oxygen concentration measurements taken on titanium nitride films deposited using conventional CVD without annealing. Not only did these films have a higher (15%) initial oxygen concentration, but they also absorbed oxygen at a greater rate. The conventionally formed films were also less stable with marked increases in resistivity over time. For comparison, point 316 in FIG. 34 illustrates the typical oxygen concentration (about 1%) of a titanium nitride film deposited by physical vapor deposition.

Figure 34A:
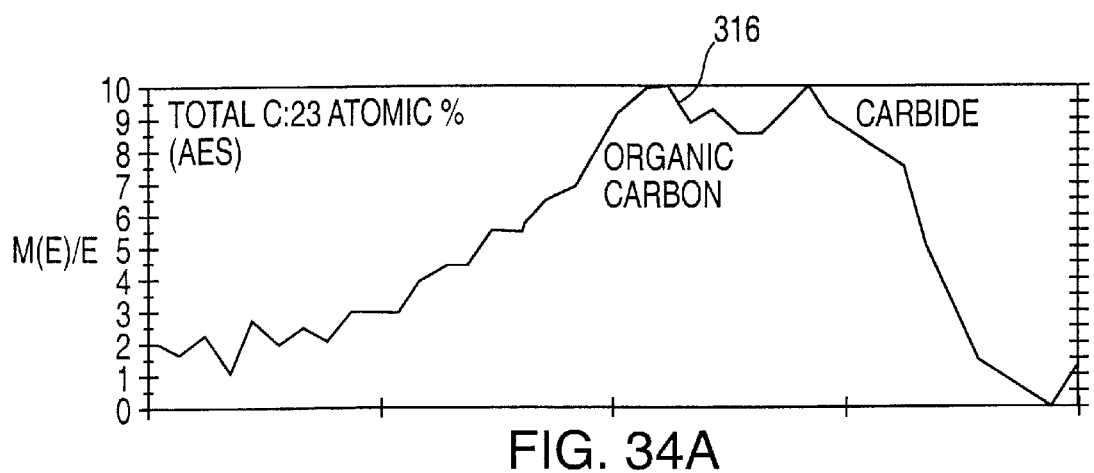
FIGS. 34(a)–34(c) illustrate the reduction of organic carbon content of films produced in accordance with the invention.
Figure 34B:
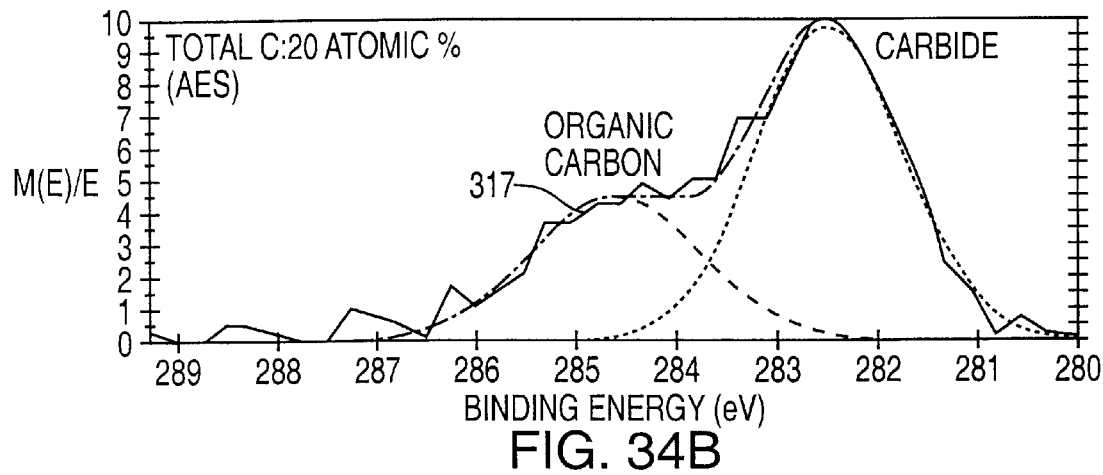
Figure 34C:
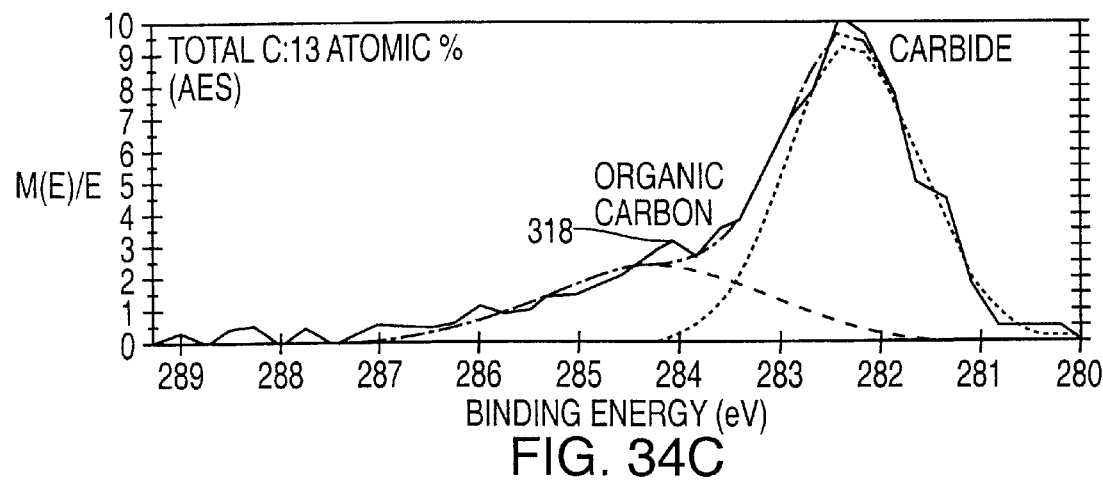

FIGS. 34(*a*)–(*c*) are graphical representations of XPS Spectra on different films. FIG. 34(*a*) represents a spectrum of a 200 Å non-annealed film and shows that the organically bonded carbon level, at 316, is relatively high. By comparison, the measurements on a 200 Å film used to produce FIGS. 34(*b*) and (*c*) show reduced organically bonded carbon content at 317 and 318 respectively. It should be noted that the film used for FIG. 34(*b*) was formed by depositing a 100 Å layer of titanium nitride, plasma annealing it according to the present invention and thereafter depositing and annealing a second 100 Å layer of titanium nitride. FIG. 34(*c*), was formed by successively depositing and annealing four 50 Å thick layers of titanium nitride.

Figure 35A:
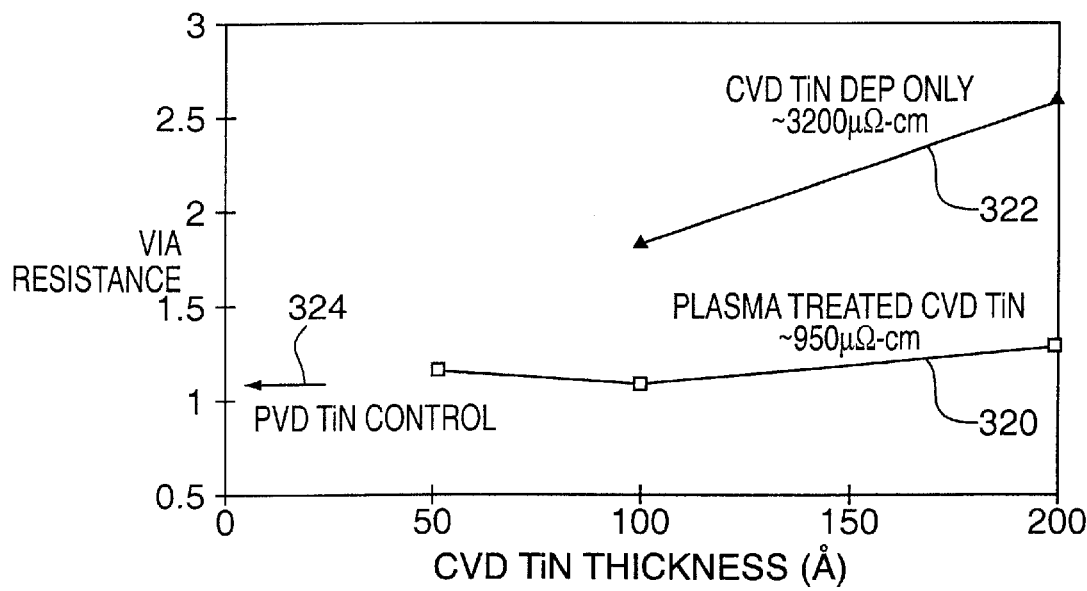
FIGS. 35(a)–35(b) illustrate the improved film resistance in vias and salicide contacts formed in accordance with the present invention.
Figure 35B:
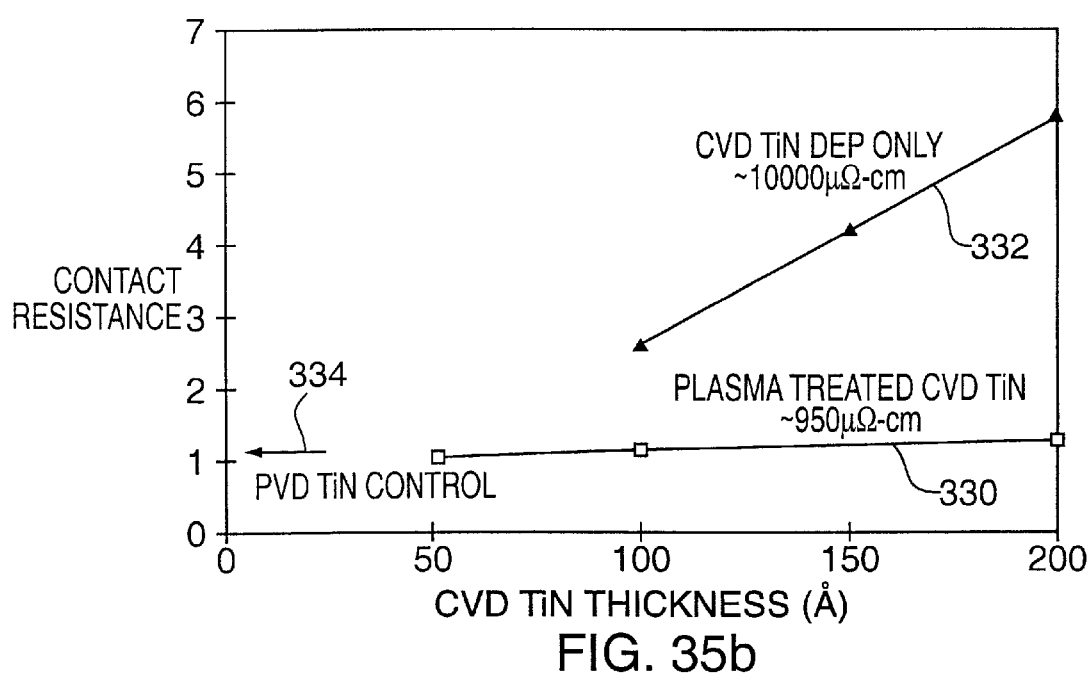

FIGS. 35(*a*) and (*b*) further illustrate the improvements of the present invention. FIG. 35(*a*) shows the resistance of vias employing a CVD titanium nitride film that was deposited and plasma annealed with a $N_2$ plasma. The vias were first lined with a CVD titanium nitride adhesion layer and then filled with a CVD Tungsten plug. FIG. 35(*a*) provides a graph of via resistance versus film deposition thickness. The graph was prepared for a 0.5 μm via with an aspect ratio of approximately 2.5. As shown the via resistance is substantially less for the plasma annealed film (plot 320) than for the non-annealed conventionally deposited film (plot 322). For comparison, the via resistance of a PVD deposited titanium nitride film is illustrated by arrow 324.

Similar improvements are illustrated by the graph in FIG. 35(*b*), which is a representation of salicide contact resistance versus titanium nitride thickness. The graph is plotted for a 0.5 μm contact with an aspect ratio of approximately 2.5. Plot 330 shows a resistance of the contact prepared by an $N_2$ plasma treatment according to the present invention. Plot 330 illustrates a substantially lesser resistance than the resistance illustrated by plot 332, which represents a contact resistance resulting from a conventional prior art CVD deposition. For comparison, a PVD titanium nitride control contact resistance is given by arrow 334.

Figure 36:
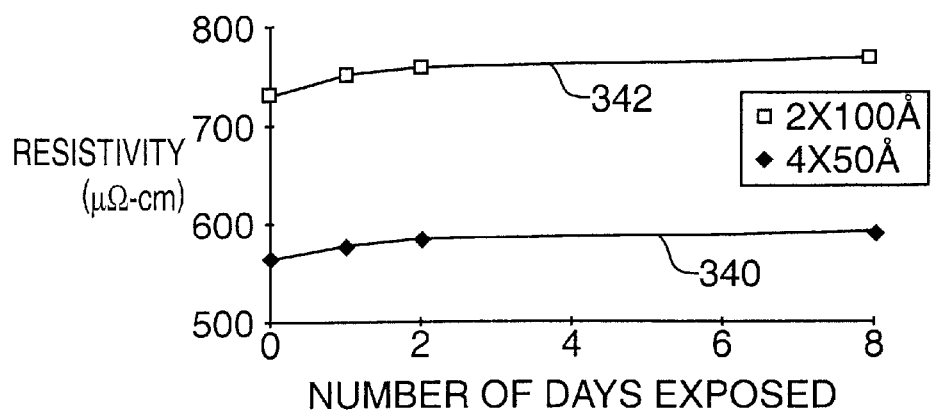
FIG. 36 illustrates the resistivities of films produced using different numbers of cycles of deposition and plasma treatment.

FIG. 36 illustrates the effect of the number of cycles of deposition and annealing used to create a single film of a desired thickness. In FIG. 36, a titanium nitride film having a total thickness of 200 Å was deposited by chemical vapor deposition and annealed with a $N_2$ plasma. In a first case, illustrated by plot 340, the process was cycled four times with each of the four layers being deposited with a 50 Å thickness and plasma annealed prior to the deposition of a subsequent layer. In a second case, illustrated by plot 342, two layers, each of 100 Å, were deposited and individually annealed.

The case represented by plot 340 shows a lower resistivity (500 to 600 μΩ–cm) than the case represented by curve 342 (700 to 800 μΩ–cm). However, the resistivities of the films represented by both plots 340 and 342 are below the upper limit of 1000 μm–cm. Also, the increased resistivity in each case over a period of eight days was approximately the same for both cases at less than 5%.

Figure 37:
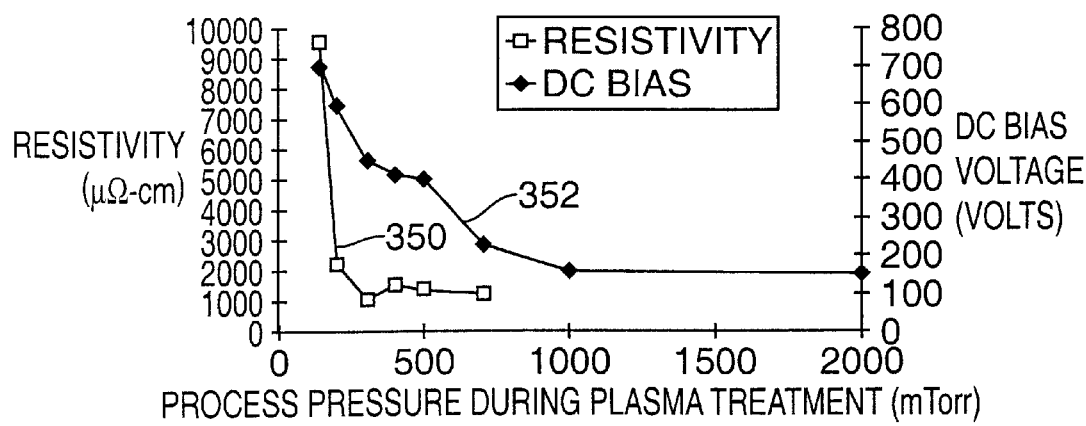
FIG. 37 illustrates a plot of film resistivity and bias voltage as a function of plasma process pressure.

Further tests were conducted to determine the effect of plasma treatment process pressure on a film resistivity and DC bias voltage. The results of these tests are illustrated in FIG. 37. FIG. 37 is prepared for a 200 Å titanium nitride deposition which was treated for 60 seconds in a plasma for which the applied power was approximately 20 watts.

As shown by plot 350, the improved resistivity exhibited by films produced by the process of this invention is generally not dependent on the process pressure. However, it appears that low resistivities were not achieved when process pressures were lower than about 200 mTorr.

As illustrated by plot 352, the DC bias induced across the plasma decreased fairly substantially as the process pressure was increased from about 200 to 1000 mTorr. Thereafter, it remained relatively constant at about 150 volts.

Figure 38:
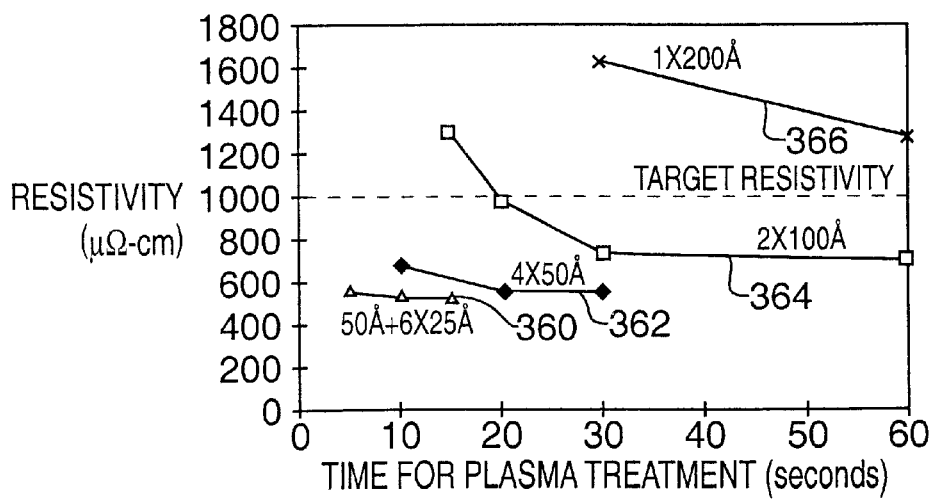
FIG. 38(a) illustrates the effects of annealing duration and frequency on film resistivity.
FIG. 38(b) illustrates a further example of the effects of annealing duration on film resistivity.
Figure 38B:
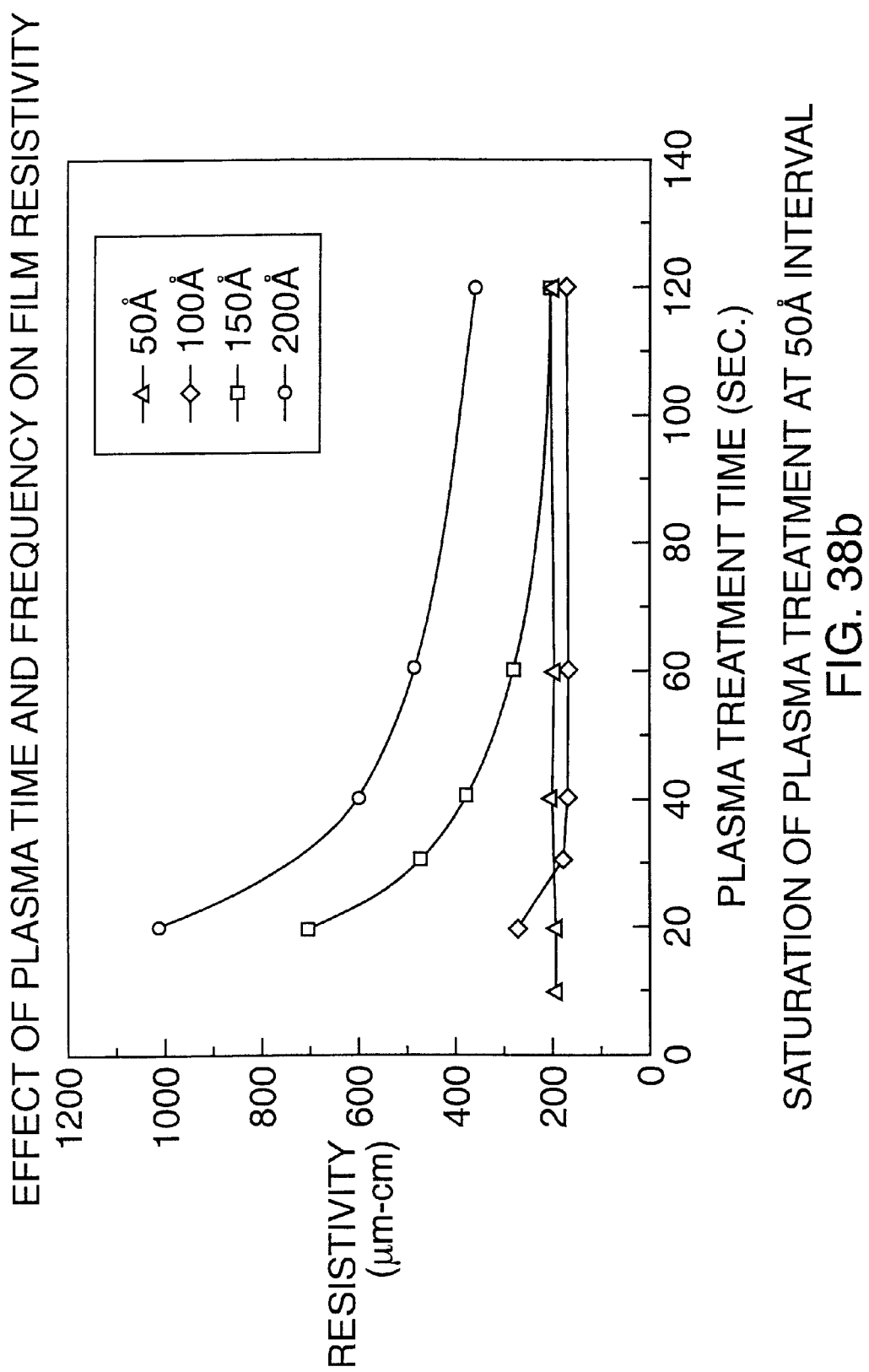

FIG. 38(*a*) illustrates the effects of treatment duration and frequency on film resistivity. Four different films, each having a total thickness of 200 Å, were compared. One film, represented by plot 360, was formed by initially depositing and annealing a 50 Å layer and thereafter depositing and annealing six 25 Å layers. Each of the layers was deposited and thereafter annealed prior to a subsequent layer's deposition. A second film, represented by plot 362, was formed by respectively depositing and annealing four 50 Å layers. The third film, represented by plot 364, was formed by respectively depositing and annealing two 100 Å layers. The final film, represented by plot 366, was formed by depositing a single 200 Å layer which was thereafter annealed according to the invention.

From the plots in FIG. 38(*a*), a number of observations can be made. It appears that lower resistivities are achieved when a greater number of individual layers make up the final layer. Also, the thinner the individual layer is, the less effect the time of plasma treatment has on the resistivity. FIG. 38(*b*) illustrates another example of the effect of plasma treatment time on film resistivity.

In addition to decreasing the resistance and increasing the stability of the films, it may be possible to use the method of the present invention for other purposes. Analysis of films annealed using a $N_2$ plasma have shown an increase in the amount of nitrogen close to the surface of the film. It appears that some of the nitrogen ions have become embedded in and have reacted with the film. Thus, it may be possible to use this annealing process to enrich a film with ions/molecules from the plasma. Further, this process could be used to eject or replace unwanted molecules/ions from the film. FIGS. 34(*b*)–(*c*) show that ions impacting the film eject carbon atoms.

b. Nitrogen/Hydrogen Plasma

In an alternative embodiment of the present invention, a mixture of nitrogen and hydrogen may be employed for generating a plasma during the plasma annealing of a film deposited on a wafer 114. As a first step, a titanium nitride film is deposited on the wafer 114 using conventional thermal CVD processing. Thereafter, the deposited material is annealed using a plasma that is generated from a gas having a mixture of nitrogen and hydrogen.

If any one of chambers 110A, 110B or 110C are employed in performing these steps, the CVD processing and annealing may be performed in the same chamber. Alternatively, titanium nitride can be deposited on the wafer 114 in one chamber, and the wafer 114 can be transferred into another chamber for post-deposition plasma annealing.

When employing chamber 110A, the wafer 114 may be placed on wafer support 116 and spaced about 0.3 to 0.8 inches, preferably 0.6 to 0.7 inches, from the showerhead 136. As described above, a layer of titanium nitride film may be deposited on the wafer 114. The initially deposited titanium nitride layer may be 50 to 200 Å thick. After the deposition has been completed, plasma annealing of the deposited material commences. A gas comprised of a 3:1 mixture of nitrogen and hydrogen is introduced into the processing chamber 112 via the showerhead 136. The mixture of nitrogen and hydrogen is introduced with a nitrogen flow rate of about 300 sccm. The rf source 142 then supplies 350 watts of rf power at 350 KHz through the matching network 145 to produce rf signals to the wafer support 116 and the showerhead 136. Preferably, the rf signals at the showerhead 136 and the wafer support 116 are 180 degrees out of phase.

Although the above-described gas mixture has a nitrogen to hydrogen ratio of 3:1, any ratio between 3:1 and 1:2 may be used. Generally, a higher portion of hydrogen in the mixture results in a film with greater long-term stability. However, too much hydrogen in the plasma may result in bonding between hydrogen and carbon in the film to form polymers, which increases the film's resistivity.

A plasma containing positively-charged nitrogen and hydrogen ions forms under the influence of the rf power supplied to the showerhead 136 and the wafer support 116. The plasma is typically maintained for 10–30 seconds. As described above, the processing chamber 112 is grounded. The showerhead 136 acquires a negative bias between −100 to −400 volts, typically −200 volts. The wafer 114 self-biases to acquire a negative bias of between −100 to −400 volts, typically −300 volts. This negative bias voltage remains approximately constant during a bombardment period.

During the bombardment period, positively charged ions from the plasma are accelerated by the voltage gradient into the surface of the wafer 114. This causes the ions to bombard the wafer surface, penetrating to a depth of 50 to 100 Å. Energetic neutral atomic particles from the plasma also may bombard the wafer 114.

As a result of the ion bombardment, compression of the deposited material occurs and the thickness may be reduced by 20 to 50%. The reduction depends upon the temperature of the wafer and the plasma treatment time and energy. Further layers of titanium nitride may be successively deposited and annealed as desired. Preferably, each of the further layers has a thickness ranging from 50 to 100 Å.

After the annealing is completed, the resulting annealed titanium nitride film exhibits many improved properties. Oxygen content is reduced from 20 to 25%, causing oxygen to comprise less than 1% of the deposited and annealed material. The density of the film increases from less than 3.1 grams per cubic centimeter (g\cm$^3$) to about 3.9 g\cm$^3$. The fraction of carbon incorporated into the deposited film is reduced by 25% or more, so that the carbon comprises 3% of the deposited film. Changes in the structure of the film occur, and the film's resistivity drops from pre-treatment levels of approximately 10,000 $\mu\Omega$–cm to as low as 150 $\mu\Omega$–cm. When the annealed film is exposed to oxygen, air, or water vapor, oxygen is absorbed to a much lesser extent than if the deposited film were not annealed. The plasma annealing causes replacement of carbon and nitrogen in the as-deposited film with nitrogen from the plasma.

The addition of hydrogen to the plasma-forming gas has been found to significantly reduce the amount of carbon that coats the inside of the processing chamber 112 upon being ejected from the film by the ion bombardment. The reduction in the carbon coating of the processing chamber 112 is beneficial, because the carbon coating changes the impedance of the chamber and makes the precise control of the plasma difficult. The reduction in carbon coating results in the processing chamber 112 being used a greater number of times before requiring cleaning.

FIG. 39 (*a*) is an Auger electron spectroscopic depth profile for a titanium nitride film formed by successively depositing and annealing titanium nitride layers 100 Å thick onto a silicon dioxide layer. As may be seen from FIG. 39(*a*), the carbon and oxygen content are uniform throughout most of the film, with carbon being at 9 atomic percent and oxygen being at 2 atomic percent. The resistivity of the annealed titanium nitride film is about 250 $\mu\Omega$–cm.

FIG. 39(*b*) shows that further improvements were obtained by depositing and annealing 50 Å layers of titanium nitride. FIG. 39(*b*) is in Auger electron spectroscopic depth profile for a titanium nitride film formed by successively depositing and annealing titanium nitride layers 50 Å thick on top of silicon dioxide. Once again, the carbon and oxygen content are uniform throughout most of the film, with carbon being less than 3 atomic percent and oxygen being 1 atomic percent. The portions of titanium and nitrogen are higher than in the 100 Å process. The resistivity of this film is only 180 $\mu\Omega$–cm.

c. Nitrogen/Hydrogen/Noble Gas Plasma

In yet another embodiment of the present invention, the nitrogen and hydrogen gas mixture used to form an annealing plasma may also include other gases such as argon, helium, and ammonia. The inclusion of additional noble gases also improves the ion bombardment treatments. Since argon atoms are heavier than helium atoms, the argon atoms may provide superior bombardment capabilities.

Further, it is envisioned that the composition of films composed of materials other than titanium nitride may be altered in a similar manner using the present invention. Other gases may be added to the plasma in order to alter the chemical composition of the film, either by becoming incorporated into the film or reacting with the impurities present therein. For example, $NH_3$ and $CH_4$ may be used. An oxygen-based plasma gas may be more appropriate for treating oxide films such as $Ta_2O_5$.

While this invention has been described in terms of plasma bombarding CVD deposited films, this invention has applicability to PVD-deposited films. Further, this invention finds particular application in the treatment of binary metal nitride $M_xN_y$ and ternary metal silicon nitride $M_xSi_yN_z$ (where M may be Ti, Zr, Hf, Ta, Mo, W and other metals).

The present invention may also be used to modify the morphology of films in an advantageous manner. Thin barrier materials may be subjected to the high density ion bombardment of the present invention in order to enhance the uniformity of their grain orientation. Because the orientation of grains in an underlying layer affects the structure of subsequently deposited layers, the present invention provides for the ability to modify and improve the morphology of sequentially deposited layers by modifying the crystal structure and/or growth orientation of the underlying layer.

It is possible to control the morphology of multiple layers by depositing a thin nucleation interface layer less than 50 Å thick, modifying it by high density ion bombardment, and then depositing the bulk or remaining film by standard techniques. The structure of the overlying layer would be determined by the structure of the underlying previously modified layer.

Figure 40:
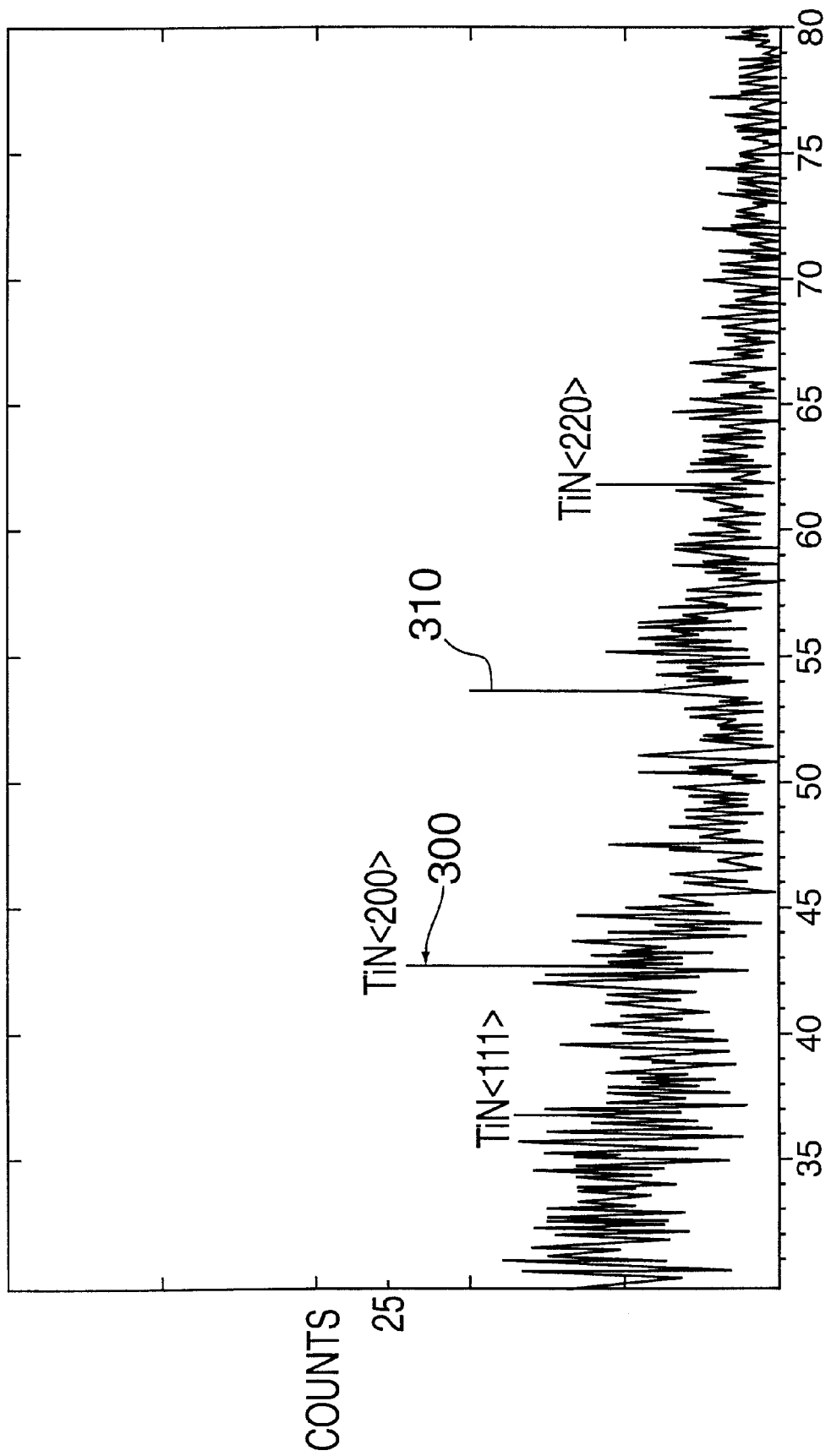
FIG. 40 illustrates an x-ray diffraction glancing angle scan of a 1,000 Å titanium nitride layer deposited on a silicon wafer using conventional chemical vapor deposition.
Figure 41:
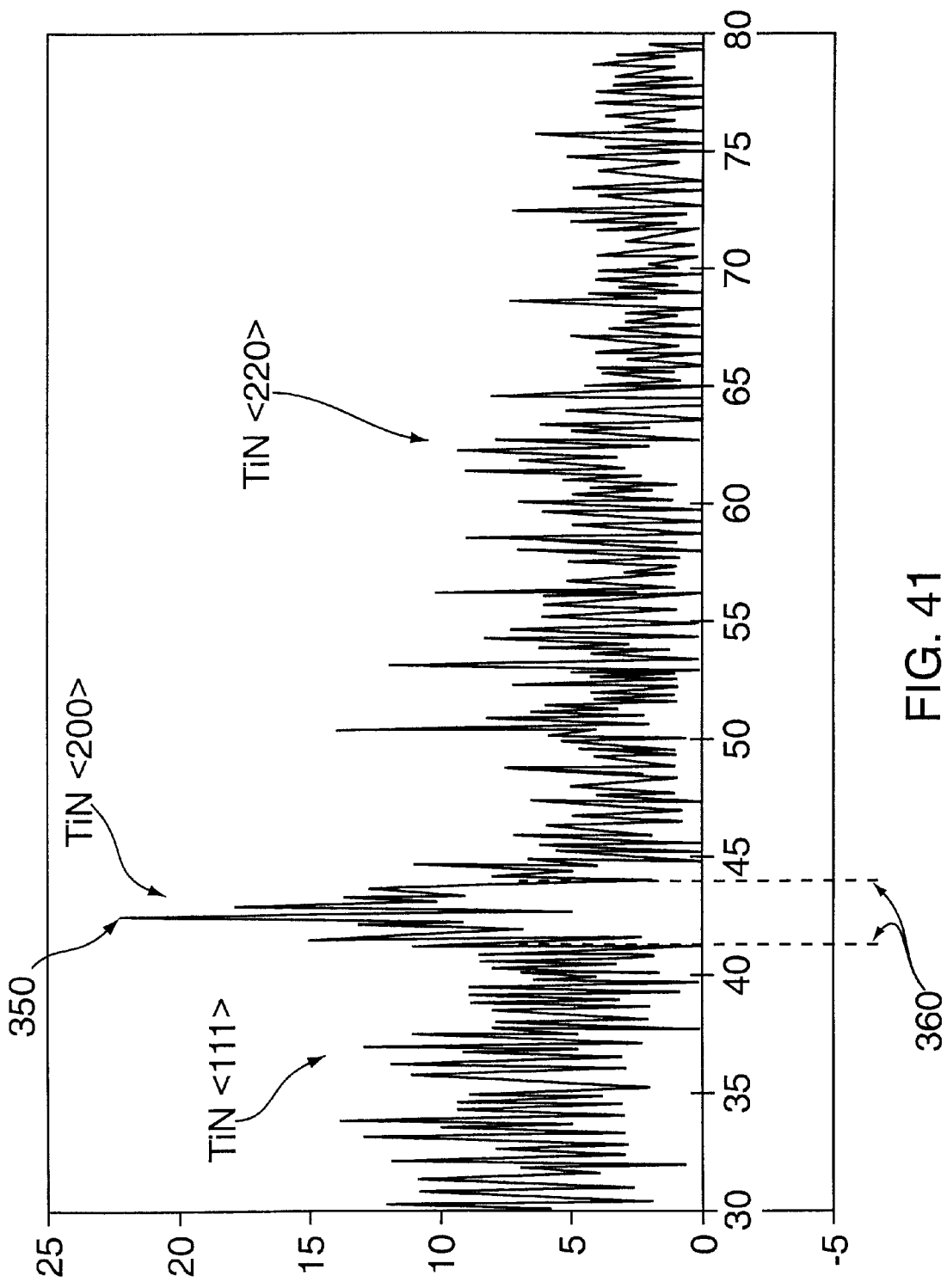
FIG. 41 is an x-ray diffraction glancing angle scan of a 1,000 Å titanium nitride layer deposited on a silicon wafer and annealed in accordance with the present invention.

This can be illustrated with reference to FIG. 40. For a titanium nitride film, it has been determined that the preferred crystal and orientation is <200>. It is speculated that the addition of hydrogen to the plasma may improve the film by making it more crystalline. FIG. 40 is an x-ray diffraction glancing angle scan of a conventional CVD titanium nitride layer, 1000 Å thick, deposited on a silicon wafer. The point on the curve indicating the number of grains oriented in the <200> direction is indicated by the label 300. As can be seen from the graph, there is no obvious TiN <200> peak. This is indicative of weak crystalline TiN <200> in films formed using conventional CVD processes. FIG. 41 is an x-ray diffraction glancing angle scan of a CVD titanium nitride layer, 1000 Å thick, deposited on a silicon wafer and annealed in accordance with the present invention. The diffraction pattern indicates that the film is micro-crystalline with a preferred orientation <200> increased noticeably, as indicated by the label 350. There are more grains oriented in nearly the <200> direction, in the interval between 40 and 45 degrees. Additionally, the peak 310 in FIG. 40 is significantly lower in FIG. 41.

3. Sequential Annealing

In order to further reduce the resistivity of the deposited film, the plasma annealing process may be altered in accordance with the present invention to include two sequential plasma annealing steps. The first annealing step is performed with a plasma that is generated from a gaseous mixture including nitrogen and hydrogen, as described above. The second plasma annealing step is performed to remove hydrogen from the annealed material, since hydrogen's affinity for oxygen results in increased resistivity.

The ions formed in the second plasma bombard the deposited and annealed material, thereby causing hydrogen in the surface of the material to be ejected from the film as a waste by-product. The reduction in hydrogen reduces the material's affinity for oxygen, which enables the film to have a lower resistivity and exhibit improved stability.

The gas used for forming the plasma in the second sequential annealing step may be comprised of nitrogen or a mixture of nitrogen and either helium, argon, or neon. Helium is preferred, since it enhances the ionization of nitrogen molecules and reduces the recombination probability of $N^+$, $N_2^+$, $N_3^+$, and $N_4^+$ ions. The mixture of nitrogen and helium is preferred over the use of nitrogen alone, since the helium based plasma's ions are able to enhance ionization efficiency, thereby promoting ion reactivity and achieving greater penetration depths. The greater penetration depths provide for the displacement of a greater amount of hydrogen, so that the reduction of the deposited material's resistivity may be maximized. Further, helium's small mass enables it to fill vacancies that are left in the deposited material by exiting hydrogen atoms which are too small to be filled by the nitrogen ions.

In accordance with the present invention, a wafer 114 is placed in a chamber, such as chamber 110A, and a layer of material is deposited on the wafer, as described above. The deposited material may be titanium nitride for use as a diffusion barrier.

Once the layer of material is deposited, it undergoes a first annealing process of ion bombardment. While residing on the wafer support 116, the wafer 114 may be about 0.3 to 0.8 inches from the showerhead 136. Preferably, the wafer 114 is between 0.6 and 0.7 inches from the showerhead 136.

The ion bombardment is achieved by first transferring a gas into the processing chamber 112 via the showerhead 136. In one embodiment of the present invention, the gas is a mixture of nitrogen and hydrogen having a 2:3 nitrogen to hydrogen ratio and being introduced into the processing chamber 112 with a nitrogen flow rate of approximately 600 sccm. The pressure in the processing chamber 112 is set to approximately 1.0 Torr., and the wafer temperature is set to be between 350–450° C. In an alternative embodiment of the present invention, the gas may be comprised of a mixture having a nitrogen to hydrogen ratio between 3:1 and 1:2.

Next in the first annealing process, the rf source 142 supplies a rf signal to the showerhead 136 and the wafer support 116. This causes the gas to form a plasma containing positively charged ions. The rf source 142 may supply 350 watts of rf power at 350 kHz, through the matching network 145, to produce rf signals to the showerhead 136 and wafer support 116 that are 180 degrees out of phase. Typically, the plasma is maintained for 20 seconds. The rf source 142 may alternatively supply 350 watts of rf power at a frequency below 1 MHZ.

The repeated cycling of voltage from the rf source 142 results in a surplus of electrons in the vicinity of the wafer 114 that produces a negative bias at the wafer 114. The wafer support 116 may acquire a negative bias between −100 to −400 volts, typically −300 volts, while the showerhead 136 may acquire a negative bias between −100 to −400 volts, typically −200 volts. The processing chamber 112 is grounded, and the negative bias of the wafer 114 is between −100 to −400 volts, typically −300 volts, which remains approximately constant during the period of ion bombardment.

During the ion bombardment, the positively charged ions from the plasma are accelerated by the voltage gradient into the surface of the wafer 114 and penetrate the surface of the wafer to a depth between 100 to 110 Å. Energetic neutral atomic particles from the plasma may also bombard the wafer 114. Once the 20 seconds of the first annealing is completed, the processing chamber 112 is purged.

Next, the second annealing process is initiated. In one embodiment of the present invention, the plasma generating gas is only nitrogen. The gas is introduced into the processing chamber 112 with a nitrogen flow rate of approximately 500–1000 sccm. The pressure in the processing chamber 112 is set to approximately 1.0 Torr., and the wafer temperature is set to be between 350–450° C.

In an alternative embodiment of the present invention, the gas may a mixture of nitrogen and helium with a nitrogen to helium ratio between 0.2 and 1.0. Gases containing other combinations of nitrogen and either argon, neon, helium or combinations thereof may also be used.

Next in the second annealing process, the rf source 142 supplies a rf signal to the showerhead 136 and the wafer support 116. This causes the gas to form a plasma containing positively charged. The rf source 142 may supply 300–1,500 watts of rf power at 300–400 KHz, through the matching network 145, to produce rf signals to the showerhead 136 and wafer support 116 that are 180 degrees out of phase. Typically, the plasma is maintained for 15 seconds. The rf source 142 may alternatively supply 300–1,500 watts of rf power at a different frequency below 13.56 MHZ. The power of the source is scalable based on the need for processing different size wafers.

As in the case of the first annealing, the repeated cycling of voltage from the rf source 142 results in a surplus of electrons in the vicinity of the wafer 114 that produces a negative bias at the wafer 114. The wafer support 116 may acquire a negative bias between −100 to −400 volts, typically −300 volts, while the showerhead 136 may acquire a negative bias between −100 to −400 volts, typically −200 volts. The processing chamber 112 is grounded, and the negative bias of the wafer 114 is between −100 to −400 volts, typically −300 volts, which remains approximately constant during a period of ion bombardment.

During the second ion bombardment, the positively charged ions from the plasma are accelerated by the voltage gradient into the surface of the wafer 114. The ions penetrate the surface of the wafer 114 to displace the hydrogen molecules in the deposited and annealed material. Energetic neutral atomic particles from the plasma may also bombard the wafer 114. Once 15 seconds of the second annealing is completed, the processing chamber is purged.

When a nitrogen gas is employed, the ions penetrate to a depth between 70 to 80 Å. When the gas is a mixture of nitrogen and helium, the ions penetrate to a depth between 100 to 125 Å. Accordingly, the annealing with the mixture of nitrogen and helium provides for the displacement of more hydrogen molecules than the annealing that only employs nitrogen.

In order to form a diffusion barrier having a desirable thickness, such as between 150 to 300 Å, the above described CVD deposition and sequential annealing processes are repeated. Layers of barrier material between 50 to 100 Å thick are successively deposited and sequentially annealed, until the desired film thickness is achieved.

When the sequential annealing process is performed in either chamber 110A, chamber 110B, or chamber 110C, the deposition, first annealing, and second annealing may all be performed in the same chamber. Accordingly, the deposition and sequential annealing may be performed in-situ. However, the process steps of deposition and sequential annealing are not required to be performed in-situ and alternative chambers may be employed.

Table VI, which appears in FIG. 42, reflects experimental results that were obtained to compare the sequential annealing process with the single annealing process. In order to collect the data in Table VI, a set of wafers were each processed in accordance with different embodiments of the present invention. A 200 Å thick layer of titanium nitride was formed on each wafer in accordance with the present invention.

A first wafer was processed in accordance with the single annealing process described above using a gas of nitrogen and hydrogen to generate the annealing plasma. A second wafer was processed using sequential annealing with a plasma gas including only nitrogen. A third wafer was processed using sequential annealing with a plasma gas including nitrogen and helium. A fourth wafer was processed using a three phase sequential annealing with 15 seconds of a nitrogen-hydrogen plasma annealing, 15 seconds of a nitrogen plasma annealing, and 5 seconds of a nitrogen-hydrogen plasma annealing, in that order.

The second wafer, which employed the sequential annealing with nitrogen gas, showed significantly less resistivity than the first wafer which only underwent a single annealing step. The second wafer's resistivity was between 450–500 $\mu\Omega$-cm, while the first wafer's resistivity was between 570–630 $\mu\Omega$-cm. Further, the second wafer's increase in resistivity after 50 hours was only 7–8%, while the first wafer's increase was between 11–12%.

Even better results were seen in the third wafer, which employed a mixture of nitrogen and helium in the second plasma annealing. The third wafer had a resistivity between 440–480 $\mu\Omega$-cm, which only increased by 3–7% over a 50 hour time period. The third wafer also had a smaller concentration of oxygen. The lower levels of oxygen in the third wafer, as compared to the second wafer, may be credited to the nitrogen-helium mixture's superior ability to remove hydrogen from the titanium nitride layer.

The fourth wafer, which underwent a third annealing using a mixture of nitrogen and hydrogen had resistivity and resistivity aging measurements close to those of the first wafer. This shows that the reintroduction of hydrogen to the titanium nitride layer after the second annealing creates a surplus of hydrogen. The surplus of hydrogen negates the benefits achieved in the second annealing.

4. Oxidation to Reduce Diffusivity

In addition to providing a film on a wafer with improved resistivity, the following process enables the film to better impede the diffusion of contact metals into a substrate underlying the film. In particular, the film will be treated to better impede the diffusion of aluminum.

First, a layer of material is formed on an upper surface of a wafer 114 in-situ (i.e. without the wafer being removed from a processing chamber 112 at anytime during the layer's formation). In one embodiment of the present invention, a deposition and subsequent plasma annealing of the material is performed in chamber 110A to form the film. The layer of material may be deposited on the upper surface of the wafer 114 using a thermal CVD process, so that the material conforms to the upper surface of the wafer 114. During the deposition, the pressure control unit 157 may set the pressure in the processing chamber between 0.6 to 1.2 Torr, and the lamps 130 may set the temperature of the wafer 114 to be between 360 to 380° C.

In one embodiment of the present invention, the deposited material may be a barrier material, such as a binary metal nitride, like titanium nitride (TiN). In an alternative embodiment of the present invention, a ternary metal silicon nitride may be used as the barrier material instead of a binary metal nitride. The deposited material may have a thickness of between 50 and 300 Å, preferably being between 50 and 100 Å.

Once the layer of barrier material is deposited, it is annealed through a process of ion bombardment. While residing on the wafer support 116, the wafer 114 may be about 0.3 to 0.8 inches from the showerhead 136. Preferably, the wafer 114 is between 0.6 and 0.7 inches from the showerhead 136.

The ion bombardment is achieved by first transferring a gas into the processing chamber 112 via the showerhead 136. In one embodiment of the present invention, the gas is a mixture of nitrogen and hydrogen having a 2:3 nitrogen to hydrogen ratio and being introduced into the processing chamber 112 with a nitrogen flow rate of approximately 400 sccm. The pressure in the processing chamber 112 is set to approximately 1.0 Torr., and the wafer temperature is set to be between 300 and 400° C., and preferably is 360° C.

In an alternative embodiment of the present invention, the gas may be comprised of a gas having a nitrogen to hydrogen ratio between 3:1 and 1:2. Gases containing other combinations of nitrogen, hydrogen, and either argon, helium or ammonia may also be used.

Next in the annealing process, the rf source 142 supplies a rf signal to the showerhead 136 and the wafer support 116 causing the gas 206 to form a plasma 207 containing positively charged ions. The rf source 142 may supply 350 watts of rf power at 350 KHz, through the matching network 145, to produce rf signals to the showerhead 136 and wafer support 116 that are 180 degrees out of phase. Typically, the plasma is maintained for 10 to 30 seconds. The rf source 142 may alternatively supply 350 watts of rf power at a different frequency below 1 MHZ.

A negative bias is produced at the wafer 114. The wafer support 116 may acquire a negative bias between −100 to −400 volts, typically −300 volts, while the showerhead 136 may acquire a negative bias between −100 to −400 volts, typically −200 volts. The processing chamber 112 is grounded, and the negative bias of the wafer 114 is between −100 to −400 volts, typically −300 volts, which remains approximately constant during the period of ion bombardment.

During the ion bombardment, the positively charged ions from the plasma are accelerated by the voltage gradient into the surface of the wafer 114 and penetrate the surface of the wafer to a depth between 50 to 200 Å. Energetic neutral atomic particles from the plasma 207 may also bombard the wafer 114.

The ion bombardment causes the thickness of the deposited layer of barrier material to be reduced by 20% to 50% depending on the temperature of the substrate and the plasma treatment time and energy. As described above, the CVD deposition and annealing processes may be repeated using layers of barrier material between 50 to 100 Å thick to form a layer of material with a desired thickness.

Alternatively, the deposition and annealing of the material on the wafer 114 may be carried out by a number of different means. U.S. patent application Ser. No. 08/339,521, entitled IMPROVED TITANIUM NITRIDE LAYERS DEPOSITED BY CHEMICAL VAPOR DEPOSITION AND METHOD OF MAKING, U.S. patent application Ser. No. 08/498,990, entitled BIASED PLASMA ANNEALING OF THIN FILMS, U.S. patent application Ser. No. 08/567,461, entitled PLASMA ANNEALING OF THIN FILMS, and U.S. patent application Ser. No. 08/680,913, entitled PLASMA BOMBARDING OF THIN FILMS, each disclose a process for forming a layer of barrier material on an upper surface of a wafer through the use of a CVD process and plasma annealing. Each of these applications is hereby incorporated by reference. Each of the processes disclosed by these applications may be employed in embodiments of the present invention to form a layer of material on a wafer.

In one embodiment of the present invention, the wafer is placed in an apparatus that can perform physical vapor deposition, and the layer of material is formed by a conventional sputtering process. In an alternative embodiment of the present invention, the wafer is placed in a chamber that can perform chemical vapor deposition, and the layer of material is formed through a CVD process, without additional plasma annealing.

In the manufacture of integrated circuits, aluminum is frequently employed as a contact metal. Since aluminum has an affinity for oxygen, the diffusivity of aluminum may be reduced in oxygen rich materials. Therefore, the layer of material formed on the wafer 114 can be processed to act as an enhanced diffusion barrier to an aluminum contact metal by infusing the material with oxygen.

In order to infuse the material with oxygen, the material on the wafer 114 is oxidized in-situ (i.e. without being removed from the processing chamber 112 after the layer of material is formed, until the oxidation is completed). Hence, the entire process of forming the layer of material and oxidizing the layer of material may be performed in-situ in a single chamber. The oxidation is performed so that the grain boundaries of the material become oxidized, while the material's grains themselves experience very little oxidation.

The oxidation of the material's grain boundaries may be achieved in-situ through the use of the semiconductor wafer processing chamber 110A shown in FIG. 5. Once the layer of material is formed (deposited and annealed) on the wafer 114, the wafer 114 remains in the processing chamber 112. The pressure control unit 157 sets the pressure in the processing chamber 112 to be between 0.5 and 1.0 Torr. The wafer 114 temperature is set to be between 300 and 400° C., and is preferably 360° C.

The layer of material is exposed to an oxygen bearing gas, such as a $N_2/O_2$ mixture or $O_2$. The gas is transferred into the processing chamber 112 through the showerhead 136 at a flow rate between 100–1000 sccm. The gas 208 may include both nitrogen and oxygen and have a mixture ratio of nitrogen to oxygen of 4:1. Next, the rf source 142 supplies a signal through the matching network 145 to both the wafer support 116 and the showerhead 136 to convert the gas into a plasma containing positively charged oxygen ions.

The rf source 142 supplies 350 watts of rf power at 350 KHz through the matching network 145 for approximately 20 seconds to produce rf signals at the showerhead 136 and the wafer support 116 that are 180 degrees out of phase. The showerhead 136, wafer support 116 and wafer 114 each acquire a negative bias, as described above for the annealing process. As a result, the positively charged oxygen ions accelerate toward the wafer 114 and penetrate the surface of the layer of material and attach to the grain boundaries of the material.

Once this oxidation is completed in one embodiment of the present invention, the oxidized layer of material is oxidized titanium nitride. The oxidized titanium nitride is able to operate as an enhanced diffusion barrier to contact metals that have an affinity for oxygen, such as aluminum. Alternatively, an enhanced diffusion barrier may also be formed in accordance with the present invention, when the layer of material is another binary metal nitride $M_xN_y$ or a ternary metal silicon nitride $M_xSi_yN_z$ (where M may be Ti, Zr, Hf, Ta, Mo, W and other metals).

In an alternative embodiment of the present invention, the same semiconductor wafer processing chamber 110A is employed to perform a thermal oxidation of the material. An oxygen bearing gas, such as oxygen, ozone, air or water, is transferred into the processing chamber 112 via the showerhead 136 at a flow rate between 100 and 1000 sccm. The lamps 130 then heat the wafer 114 to a temperature between 300 and 400° C., while the pressure in the processing chamber is set to be between 0.5 and 1000 Torr., and is preferably 1.0 Torr.

As a result, oxygen in the oxygen bearing gas penetrates the surface of the layer of barrier material and attaches to the grain boundaries of the barrier material. One process for oxidizing a barrier material's grain boundaries is disclosed in U.S. Pat. No. 5,378,660, entitled BARRIER LAYERS AND ALUMINUM CONTACTS, issued to Ngan, et al., and hereby incorporated by reference. Once the layer of material 200 is formed and oxidized, the wafer 114 is removed from the processing chamber 112.

Although the formation and oxidation of the layer of material on the wafer 114 has been specifically described to be performed in the semiconductor wafer processing chamber 110A in FIG. 5, the process is not restricted to being performed in chamber 110A. The process may also be carried out in any semiconductor wafer processing chamber that provides for carrying out the in-situ formation and oxidation processing in accordance with the present invention, such as the chambers 110B and 110C depicted in FIGS. 16 and 17, respectively.

Traditionally, diffusion barriers have been made thicker to provide greater protection against the diffusion of contact metals. As a result of embodiments of the present invention, diffusion barriers do not have to be made thicker to inhibit the diffusion of contact metals. In embodiments of the present invention, the oxidation of the barrier material reduces the diffusivity of contact metals with an affinity for oxygen, such as aluminum. As such contact metals begin to diffuse into an oxidized layer of barrier material, such as titanium nitride, the contact metals bond with the oxygen ions that are attached to the grain boundaries of the barrier material. As a result, the contact metals are unable to reach the region underlying the diffusion barrier.

Figure 43A:
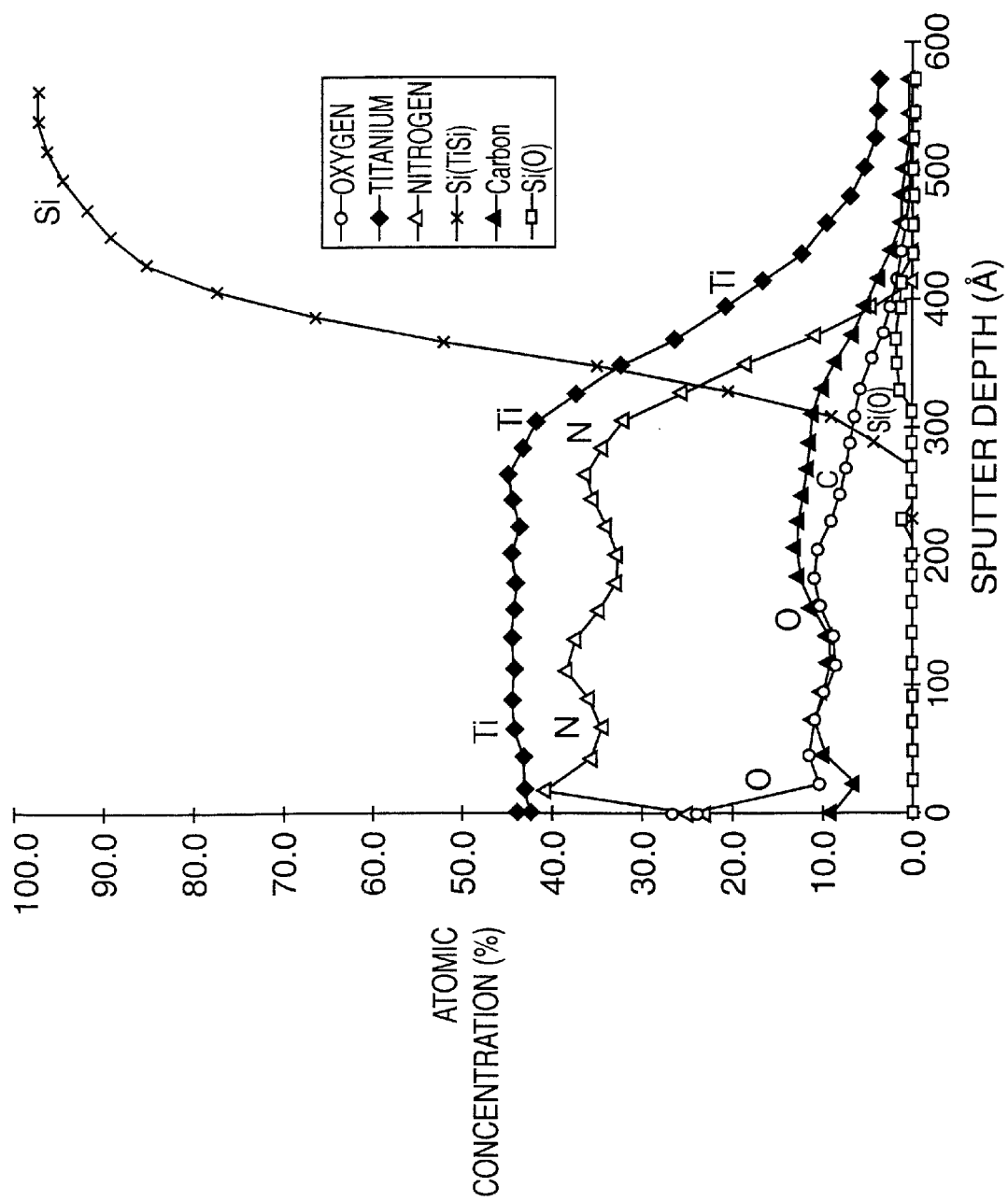
FIGS. 43(a)–43(b) illustrate the chemical composition of non-oxidized and oxidized diffusion barriers, respectively, that are formed in accordance with one embodiment of the present invention.
Figure 43B:
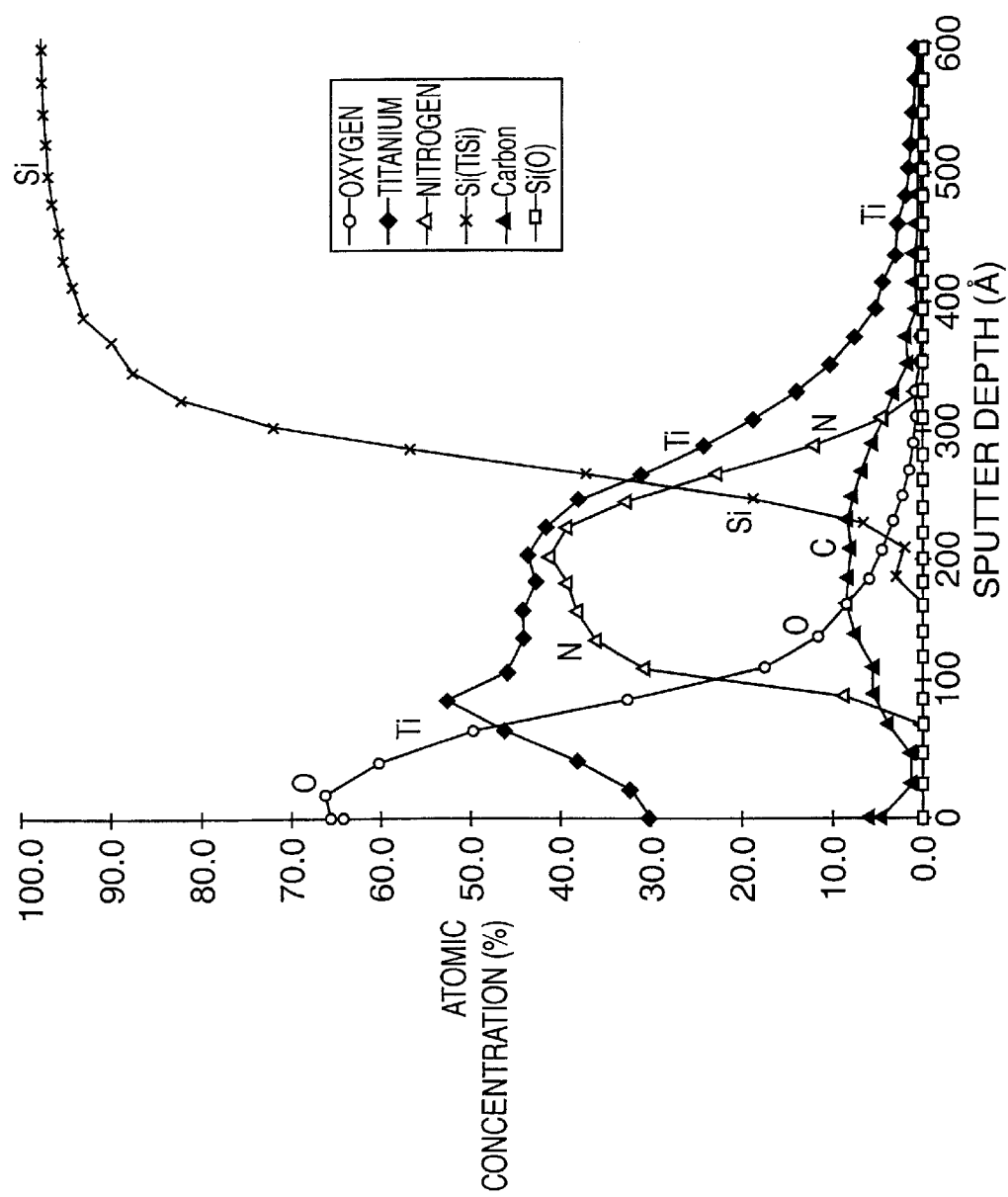

The chart in FIG. 43(a) shows the chemical composition at different depths of a wafer, after a layer of barrier material has been deposited and plasma annealed in accordance with the present invention, but not oxidized. FIG. 43(b) includes a chart that shows the chemical composition at different depths of a wafer, after a layer of barrier material has been deposited, plasma annealed, and oxidized in accordance with the present invention.

Each of these charts represents data that was taken from a wafer having a silicon substrate overlaid by a barrier layer of titanium nitride. The wafer was probed by Auger electron spectroscopy. Each chart shows the atomic concentration of different chemicals in the wafer at different depths of the wafer. As can be seen by comparing the two charts, the oxygen level in the top portion of the wafer, which constitutes the barrier material, is significantly higher in the oxidized barrier material (FIG. 43(b)) than in the non-oxidized barrier material (FIG. 43(a)).

The presence of the oxygen in the barrier material causes a contact metal, such as aluminum, to have its diffusivity greatly decreased, by bonding with the oxygen ions in the barrier material. Accordingly, the oxidized barrier material (FIG. 43(b)) provides a better diffusion barrier between a contact metal, such as aluminum, and an underlying silicon substrate than does the non-oxidized barrier material (FIG. 43(a)).

Additionally, the sheet resistance of diffusion barriers formed by embodiments of the present invention are not unacceptably compromised by the oxidation process. FIG. 44 shows a table that illustrates this fact. As shown in the table, a 200 Å layer of titanium nitride barrier material, which is deposited and plasma annealed in accordance with the present invention, but not oxidized, may have a sheet resistance of 410 Ω/sq. and a sheet resistance uniformity standard deviation of 2.2%. The resulting resistivity of such a layer of barrier material is 820 $\mu\Omega$–cm. A 200 Å layer of titanium nitride barrier material, which is deposited, plasma annealed, and oxidized for 20 seconds in accordance with the present invention, may have a sheet resistance of only 630 Ω/sq. and a sheet resistance uniformity standard deviation of 3.7%. The resulting resistivity of such a layer of barrier material is 1260 $\mu\Omega$–cm.

The table in FIG. 44 also shows the sheet resistance for a 300 Å layer of titanium nitride barrier material. After being deposited and plasma annealed in accordance with the present invention, the 300 Å layer of titanium nitride barrier material may have a sheet resistance of 235 $\mu\Omega$/sq. and a sheet resistance uniformity standard deviation of 2.0%. After deposition, plasma annealing, and oxidation for 20 seconds in accordance with the present invention, the 300 Å layer of titanium nitride barrier material may have a sheet resistance of 250 Ω/sq. and a sheet resistance uniformity standard deviation of 2.7%. Accordingly, the non-oxidized 300 angstrom layer of barrier material may have a resistivity of 705 $\mu\Omega$–cm, while the oxidized 300 Å layer of barrier material may have a resistivity of only 750 $\mu\Omega$–cm.

The relative effectiveness of the non-oxidized and oxidized layers of titanium nitride barrier material that appear in the table in FIG. 44 were evaluated as follows. A 1,000 Å layer of aluminum was deposited on wafers having upper surfaces comprised of either the non-oxidized or the oxidized layers of titanium nitride barrier material. After being deposited on the wafers, the aluminum was annealed in a furnace for one hour at 550° C. Wafers having the 200 Å and 300 Å layers of titanium nitride barrier material, which was not oxidized, experienced severe defects from diffusion of the aluminum into the wafer's substrate. Wafers having the 200 Å and 300 Å layers of titanium nitride barrier material, which was deposited, plasma annealed and oxidized in accordance with the present invention, suffered only minor defects or no defects, respectively, from the diffusion of aluminum.

The data in FIGS. 43(a), 43(b) and 44 is only one possible set of results that can be achieved from practicing embodiments of the present invention. The results set forth in these figures are in no way meant to limit embodiments of the present invention to achieving the same or substantially the same results.

5. Silicon Enrichment to Reduce Diffusivity

In another embodiment of the present invention, the oxidation step is replaced by a silicon stuffing procedure. The silicon stuffing procedure reduces the diffusivity of contact metals, such as copper, in a layer of material, such as titanium nitride, overlying a substrate. The ability of silicon to bond with nitrogen to fill grain boundaries of deposited titanium nitride is the mechanism that promotes the enhancement of the titanium nitride's barrier properties.

In accordance with the present invention, a deposition and annealing of a material, such as titanium nitride, on a wafer is performed in the same manner as described above for the process including an oxidation step. Preferably, a 100 Å layer of titanium nitride is deposited. After annealing the material with a plasma that includes a mixture of nitrogen and hydrogen, the thickness of the titanium nitride layer is approximately 50 Å.

The deposition and annealing of the titanium nitride material may be performed in any one of chambers 110A, 110B, or 110C. Alternatively, another chamber or set of chambers capable of performing the deposition and annealing steps may be employed. If either chamber 110A, 110B, or 110C is employed, the silicon stuffing may be performed in the same chamber as the deposition and annealing. As a result, the entire silicon stuffing process may be performed in-situ.

After the deposition and annealing, silicon stuffing is performed by exposing the annealed titanium nitride to silane ($SiH_4$). Silane is flowed into the processing chamber 110A at a rate of 30 sccm for approximately 30 seconds. During the silane exposure, the chamber pressure is set to 1.2 Torr; the wafer support 116 is heated to a temperature of 420° C., and nitrogen is flowed into the chamber 110A at a rate of 140 sccm. An argon purge flow of 200 sccm is employed. The exposure to silane is followed by an exhaustive purge to sweep the residual SiH$_4$ from the chamber 110A and delivery lines.

During the exposure, the silicon bonds with the titanium nitride surface to fill the grain boundaries in the deposited material. The stuffed silicon will impede the diffusion of later deposited contact metals, such as copper.

The steps of depositing, annealing, and silicon stuffing the titanium nitride material are repeated successively until the film being constructed has a desired thickness. In constructing a 200 Å film, the depositing, annealing, and exposure of the titanium nitride is preferably performed a total of three times, with a 100 Å layer of titanium nitride being deposited each time. As a result, a silicon stuffed titanium nitride film having a thickness of 50 Å is built. In order to reach the desired thickness of 200 Å, a final 100 Å cap layer of titanium nitride is deposited and annealed to a thickness of 50 Å. The cap layer of titanium nitride may be annealed using a plasma containing both nitrogen and hydrogen, as described above. This final deposited and annealed cap layer of material is not exposed to silane.

The final section of material that is deposited and annealed is not exposed to silane because of silane's affinity for oxygen. If silicon were introduced into the final surface cap of the titanium nitride film through exposure to silane, the resistivity of the film may become unacceptably high. After capping the film with an annealed layer of titanium nitride, the resistivity of the film is approximately 520 $\mu\Omega$-cm. If the top layer of titanium nitride was exposed to silane, the resistivity of the film could possibly be much higher.

Figure 45:
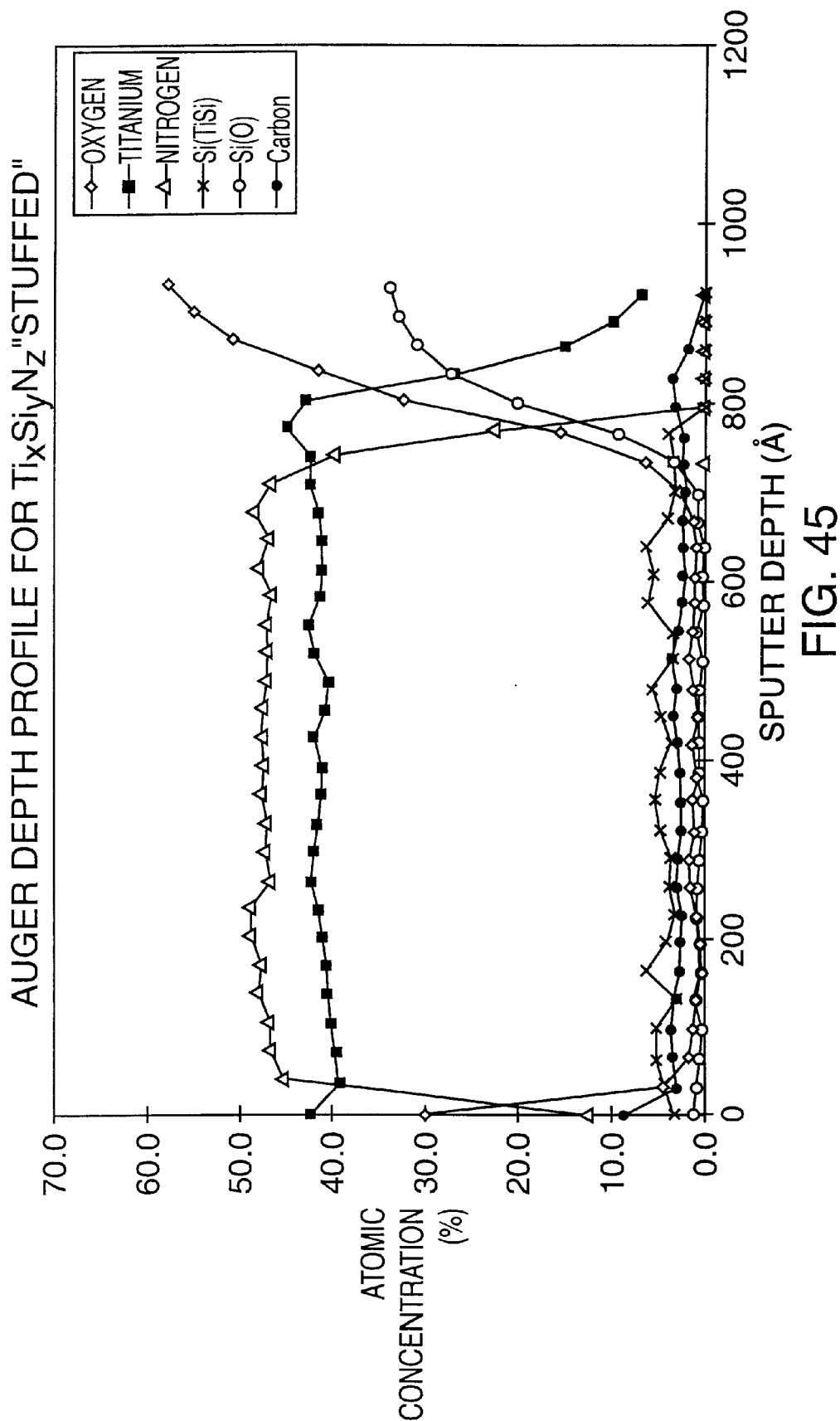
FIG. 45 illustrates an Auger depth profiling of a film formed using silicon stuffing in accordance with the present invention.

Rutherford backscattering spectroscopy revealed that the film stuffed with silicon in conformance with the present invention had the following profile: Si content of 5 atomic percent, Ti content of 35.2 atomic percent, N content of 52.8 atomic percent and H content of 7 atomic percent. An Auger depth profile of the film formed in accordance with the present invention is shown in FIG. 45. The Auger depth profile shows a uniform nitrogen and titanium content with an oscillating silicon content that is in line with the 50 Å of silicon containing material being capped by titanium nitride.

It should be noted that the above measurements and procedures are provided as a non-limiting example of how silicon stuffing may be performed in accordance with the present invention. In an alternate embodiment of the present invention, the steps of annealing the layer of material deposited on the substrate and exposing the material to silane may be interchanged. As a result, the deposited material, such as titanium nitride, would first be exposed to silane for the purpose of silicon stuffing and then be annealed using a plasma to reduce the material's resistivity. Additionally, deposition processes other than chemical vapor deposition, such as sputtering, may be employed.

As an alternative to silicon stuffing, a ternary metal silicon nitride material, such as titania silica carbo nitride (TiSiCN), may be deposited instead of a titanium nitride material. The deposited silicon rich material would then be annealed to reduce its resistivity. As in the above described processes, the deposition and annealing could be performed repeatedly to form a film having a desired thickness.

In accordance with such an embodiment of the present invention, a wafer is placed in a chamber that is capable of performing a deposition process. The chamber may be either chamber 110A, 110B, or 110C, which enable the silicon rich film to be constructed in-situ. Alternatively, a different chamber or set of chambers may be employed to carry out the following steps of forming the silicon rich film.

Once the wafer is placed in a chamber, a titania silica carbo nitride (TiSiCN) material is deposited on the wafer. The deposition may be performed using conventional thermal CVD employing TDMAT. In order to introduce the silicon, a volume of silane is flowed into the chamber. An equal volume of nitrogen dilutant is withheld, as compared to the volume used when depositing titanium nitride using CVD with TDMAT.

In performing the deposition, the chamber pressure is set to 1.2 Torr; the wafer support temperature is set to 420° C., and silane, He/TDMAT, and nitrogen dilutant are flowed into the chamber with the flow rates of 10 sccm, 70 sccm, and 90 sccm, respectively. An argon purge is performed at a flow rate of 200 sccm. The deposition may be performed for 32 seconds to form a layer of material that is 100 Å thick. In the chemical vapor deposition of titanium nitride, no silane would have been employed and the nitrogen flow rate would have been 100 sccm.

The deposition is followed by the annealing of the TiSiCN with a plasma of nitrogen and hydrogen, as described above for the process including oxygen stuffing. The annealing includes an ion bombardment that takes place for 20 seconds when the deposited material has a beginning thickness of 100 Å and a 50 Å thick layer of material is desired. The deposition and annealing may be repeated successively to construct a film having a desired thickness. In one embodiment of the present invention, a 200 Å film is desired. A 100 Å layer of TiSiCN is deposited and then annealed to become a 50 Å layer of material. The 100 Å deposition and annealing of TiSiCN is performed a total of four times to obtain the desired 200 Å film.

Figure 46:
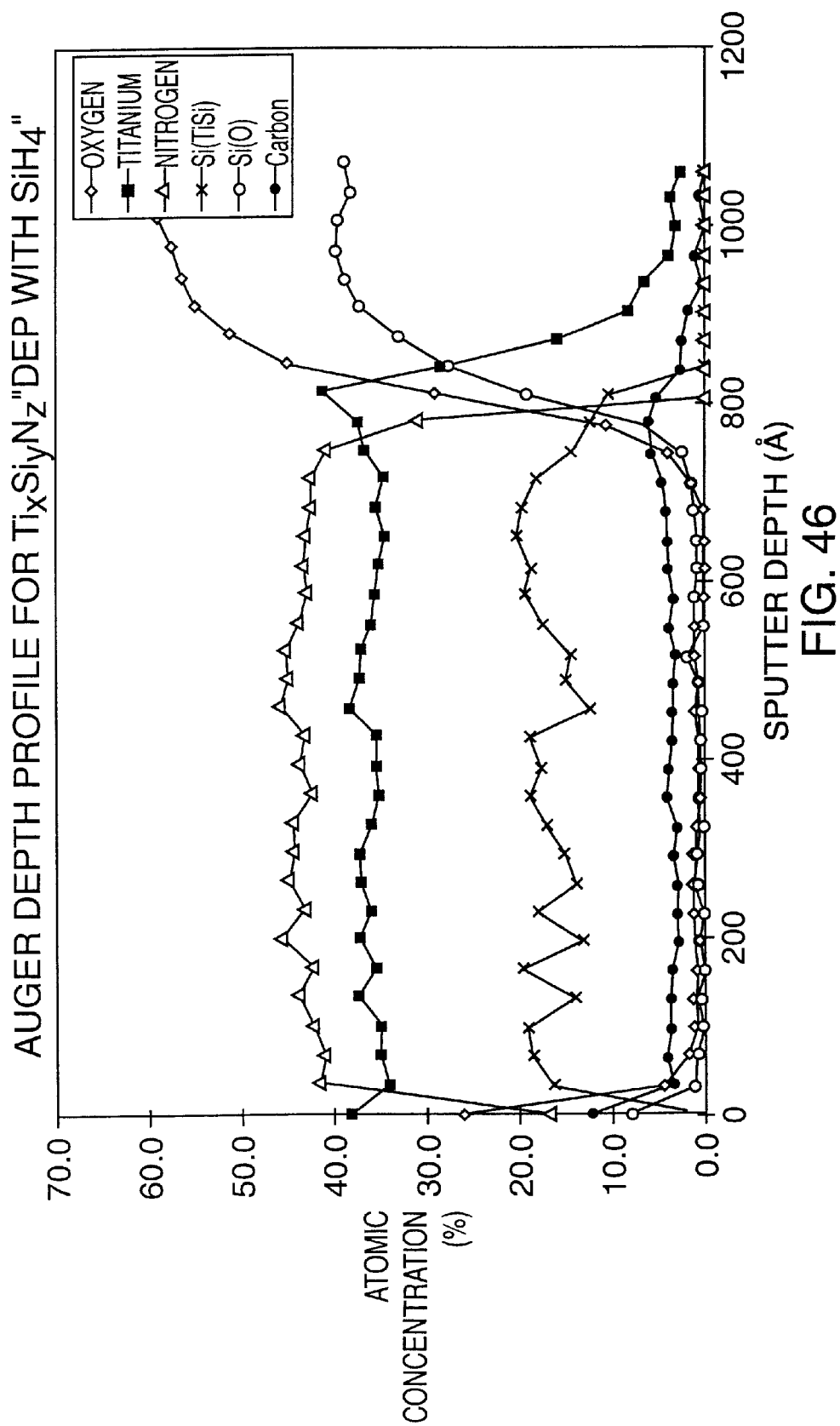
FIG. 46 illustrates an Auger depth profiling of a film formed by deposition of a material containing silicon in accordance with the present invention.

In one instance, Rutherford backscattering spectroscopy showed that the resulting 200 Å film contained 15 atomic percent Si, 25.3 atomic percent Ti, 49.7 atomic percent N, and 10 atomic percent H. Auger depth profile of the film is shown in FIG. 46. The Auger depth profile shows a uniform composition with a low carbon content of approximately 5 atomic percent and an oxygen content of 1 atomic percent. The resistivity of the film is 2,400 $\mu\Omega$-cm. FIG. 47 shows a comparison of the resistivity and composition of the 200 Å film that is formed using silicon stuffing and the 200 Å film that is formed by depositing titania silica carbo nitride.

The high resistivity is a trade-off that is incurred for obtaining a very silicon rich film to operate as a diffusion barrier. A resistivity of 1,000 $\mu\Omega$-cm is more acceptable for a diffusion barrier. The amount of silane used in the deposition step may be reduced to lower the film's resistivity. The best resistivity is achieved by stuffing the silicon into a layer of material after deposition and annealing, as described above. However, a silicon stuffed diffusion barrier does not provide as strong a deterant to the diffusion of copper as a film that is constructed by depositing a silicon containing material. For example, a silicon stuffed binary metal nitride, such as titanium nitride, does not prevent the diffusion of copper as well as a film constructed by depositing a ternary metal silicon nitride, such as TiSiCN. An integrated circuit manufacturer may select the method of silicon enrichment that best meets the manufacturer's needs in constructing a film.

It should also be noted that the deposition process employed in each of the above described silicon enrichment procedures may be varied. In place of chemical vapor deposition, other deposition processes, such as sputtering, may be employed. Ternary metal silicon nitride other than TiSiCN may also be used in embodiments of the present invention.

Further, the annealing steps described above are not restricted to using plasmas consisting only of nitrogen and hydrogen. Other plasma compositions which serve to lower the resistivity of a deposited material may be used. An example of such a plasma is the one described above containing nitrogen, hydrogen, and argon. Sequential annealing may also be employed.

In the process including silicon stuffing by exposure to silane, the exposure step is not limited to being thermally energized. In alternative embodiments of the present invention, a plasma containing silicon ions may be generated by an rf signal energizing a silicon rich gas. A wafer containing the material to be silicon stuffed may also be biased to enhance the impact of the silicon into the material. When performing silicon stuffing using plasma, the silicon stuffing may also be performed either before or after the step of annealing the material to reduce its resistivity.

C. Processor Controlled Film Construction

Figure 48:
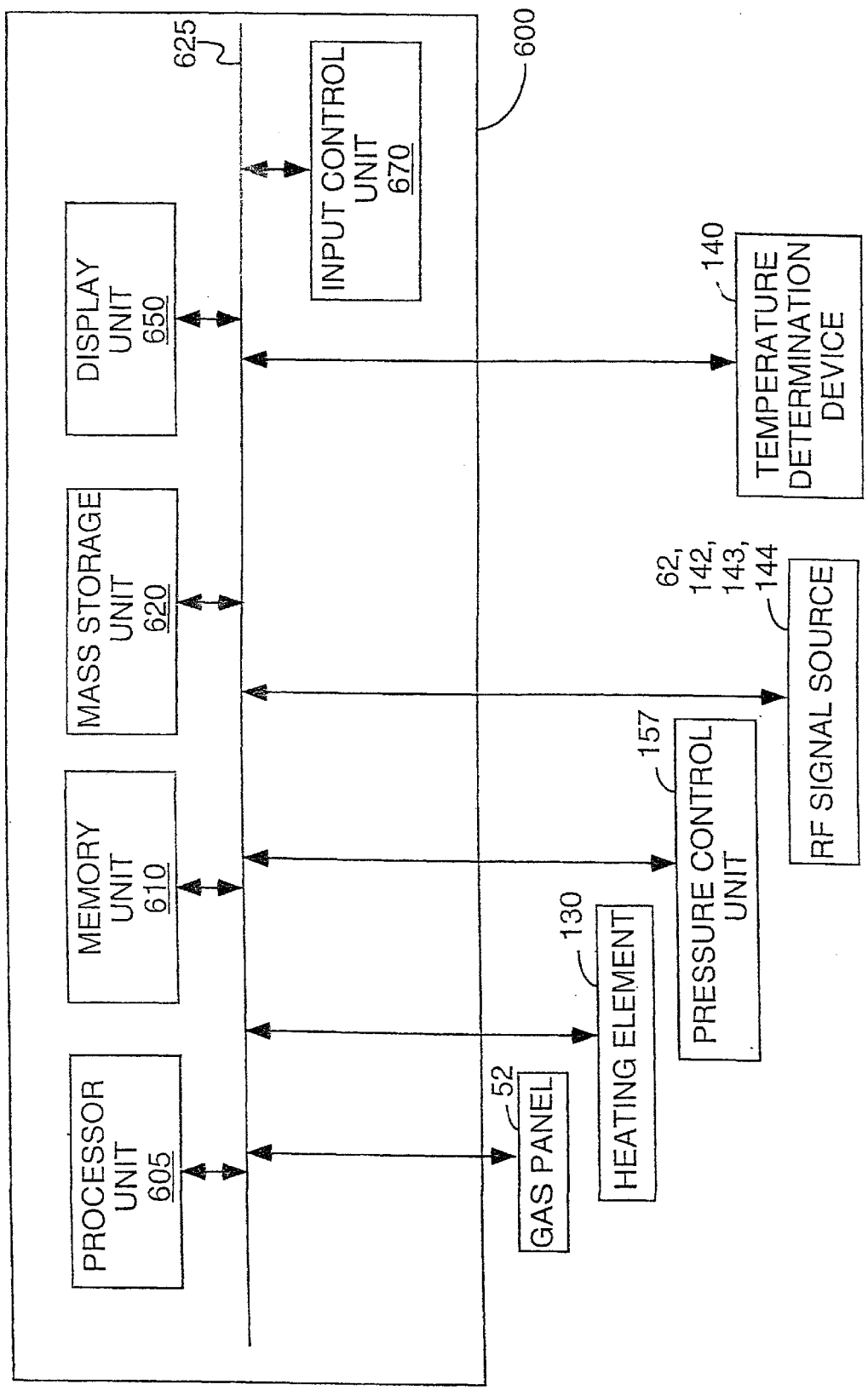
FIG. 48 illustrates a control unit for controlling a chamber that is used for constructing a film on a substrate in accordance with the present invention

The above-described process steps of depositing, annealing, oxidizing, and silicon stuffing a material may be performed in a chamber that is controlled by a processor based control unit. FIG. 48 shows a control unit 600 that may be employed in such a capacity. The control unit includes a processor unit 605, a memory 610, a mass storage device 620, an input control unit 670, and a display unit 650 which are all coupled to a control unit bus 625.

The processor unit 605 may be a microprocessor or other engine that is capable of executing instructions stored in a memory. The memory 610 may be comprised of a hard disk drive, random access memory ("RAM"), read only memory ("ROM"), a combination of RAM and ROM, or other memory. The memory 610 contains instructions that the processor unit 605 executes to facilitate the performance of the above mentioned process steps. The instructions in the memory 610 may be in the form of program code. The program code may conform to any one of a number of different programming languages. For example, the program code may be written in C+, C++, BASIC, Pascal, or a number of other languages.

The mass storage device 620 stores data and instructions and retrieves data and instructions from a processor readable storage medium, such as a magnetic disk or magnetic tape. For example, the mass storage device 620 may be a hard disk drive, floppy disk drive, tape drive, or optical disk drive. The mass storage device 620 stores and retrieves the instructions in response to directions that it receives from the processor unit 605. Data and instructions that are stored and retrieved by the mass storage device 620 are employed by the processor unit 605 for performing the above mentioned process steps. The data and instructions may first be retrieved by the mass storage device 620 from a medium and then transferred to the memory 610 for use by the processor unit 605.

The display unit 650 provides information to a chamber operator in the form of graphical displays and alphanumeric characters under control of the processor unit 605. The input control unit 670 couples a data input device, such as a keyboard, mouse, or light pen, to the control unit 600 to provide for the receipt of a chamber operator's inputs.

The control unit bus 625 provides for the transfer of data and control signals between all of the devices that are coupled to the control unit bus 625. Although the control unit bus is displayed as a single bus that directly connects the devices in the control unit 600, the control unit bus 625 may be a collection of busses. For example, the display unit 650, input control unit 670 and mass storage device 620 may be coupled to an input-output peripheral bus, while the processor unit 605 and memory 610 are coupled to a local processor bus. The local processor bus and input-output peripheral bus may be coupled together to form the control unit bus 625.

The control unit 600 is coupled to the elements of a chamber that are employed to form a film on a substrate. Each of these elements may be coupled to the control unit bus 625 to facilitate communication between the control unit 600 and the element. These elements include the gas panel 52, heating elements, such as lamps 130, pressure control unit 157, rf source or sources 62, 142, 143, 144, and temperature determination device 140 of the chamber. In one embodiment of the invention, the control unit 600 is the gas panel controller 50 called for in chambers 110A, 110B, and 110C.

The control unit 600 provides signals to the elements that cause the elements to perform the operations described above for the process steps of depositing, annealing, oxidizing, and silicon stuffing material on a substrate. The control unit 600 may also receive signals from these elements to determine how to proceed in controlling the execution of the aforementioned process steps. For example, the control unit 600 receives signals from the temperature determination device 140 to determine the amount of heat that the lamps 130 should provide to the chamber.

Figure 49:
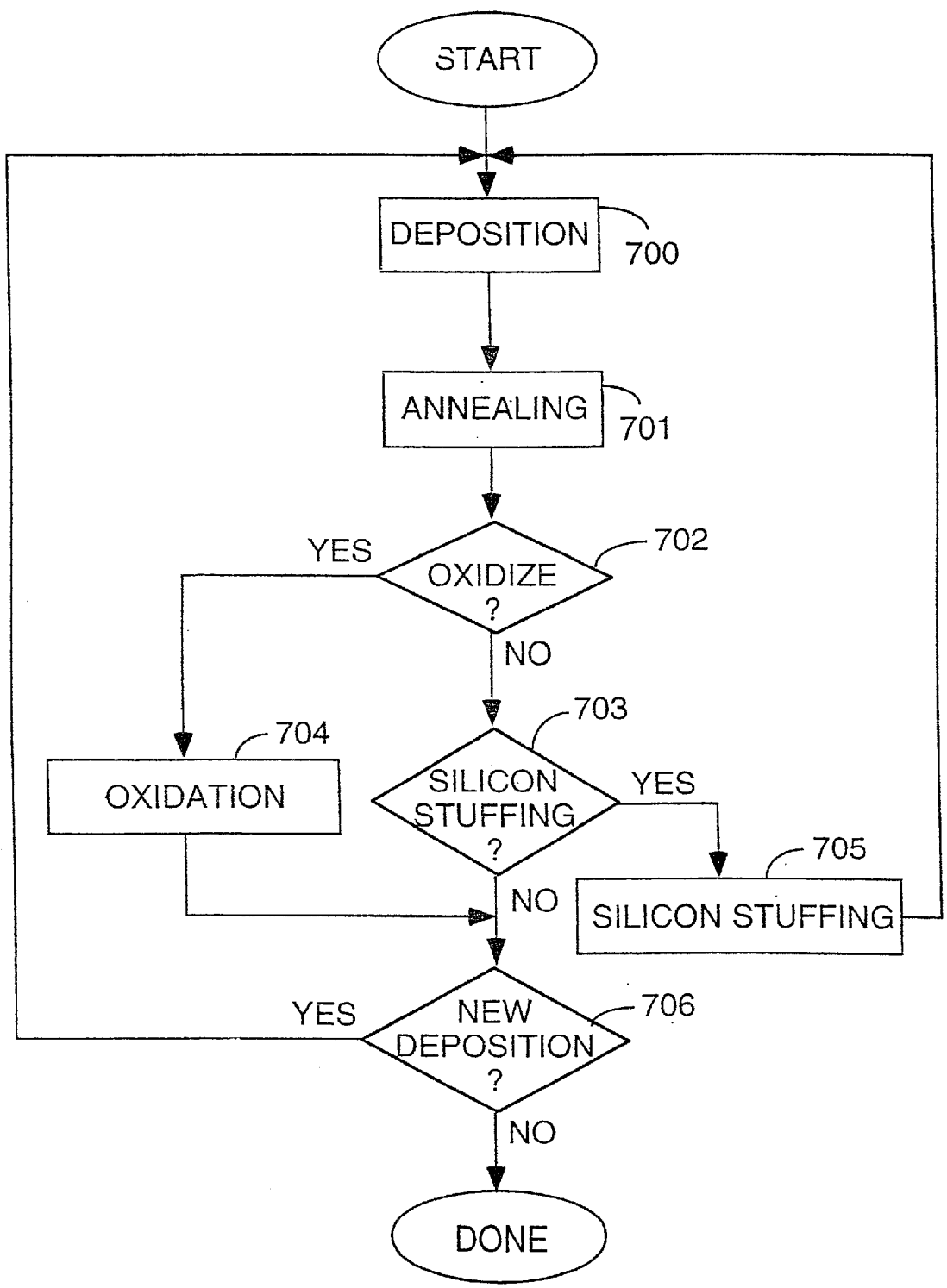
FIG. 49 illustrates a sequence of operations performed by the control unit in FIG. 48 in one embodiment of the present invention.

FIG. 49 illustrates a sequence of process steps that may be performed by the processor unit 605 in response to the program code instructions that it retrieves from the memory 610. Upon initiating the formation of a film on a substrate, a deposition step 700 is performed. In the deposition step 700, the processor unit 605 executes instructions retrieved from the memory 610. The execution of these instructions results in the elements of the chamber being operated to deposit a layer of material on a substrate as described above. For example, the processor unit 605, in response to the retrieved instructions, causes the gas panel to provide precursor gases in the chamber, the lamps 130 to heat the chamber, and the pressure control unit 157 to set the pressure in the chamber.

Once the deposition step 700 is completed, instructions retrieved from the memory 610 instruct the processor unit 605 to cause the elements of the chamber to perform an annealing step 701, such as one of the above described annealing procedures. The annealing may include plasma annealing with either nitrogen, a mixture of nitrogen and hydrogen, or a mixture of nitrogen, hydrogen, and another gas such as argon. Alternatively, the annealing step 701 may cause a sequential annealing to be executed as described above.

After completing the annealing step 701, an oxidation determination step 702 is performed in which the control unit 600 determines whether an oxidation process step is to be executed. If no oxidation is to be performed, instructions are retrieved from the memory 610 in step 703 to cause the processor unit 605 to determine whether silicon stuffing is to be performed. If no silicon stuffing is to be performed, the control unit 600 determines whether another deposition is to be performed in step 706. A deposition is performed, unless the already deposited material has a thickness substantially equal to a desired film thickness. If the desired film thickness has been reached, the process of constructing a film on a substrate is complete. Otherwise, a new deposition step 700 is performed.

If it is determined in the oxidation determination step 702 that an oxidation is to be performed, then the processor unit 605 executes an oxidation step 704. In the oxidation step 704, the retrieved instructions cause the processor unit 605 to instruct the elements of the chamber to perform the operations necessary to carry out the above described process step of oxidizing the deposited material. The oxidation may be either plasma based or thermal. Upon completion of the oxidation step 704, the processor unit 605 determines whether a new deposition step 700 should be performed in step 706.

If it is determined in step 703 that silicon stuffing is to be performed, then the processor unit 605 executes a silicon stuffing step 705. The processor unit 605 retrieves and executes silicon stuffing instructions in the memory 610. In response to these instruction, the processor unit 605 causes the elements of the chamber to operate in a manner that enables the above described silicon stuffing procedure to be executed. The silicon stuffing may be achieved through an exposure of the deposited material to a silane gas that is thermally infused with energy. Alternatively, the silicon stuffing may be achieved by exposing the deposited material to an environment containing silicon ions that are created by generating a plasma using an rf signal. Upon completion of the silicon stuffing step 705, the deposition step 700 is repeated.

Figure 50:
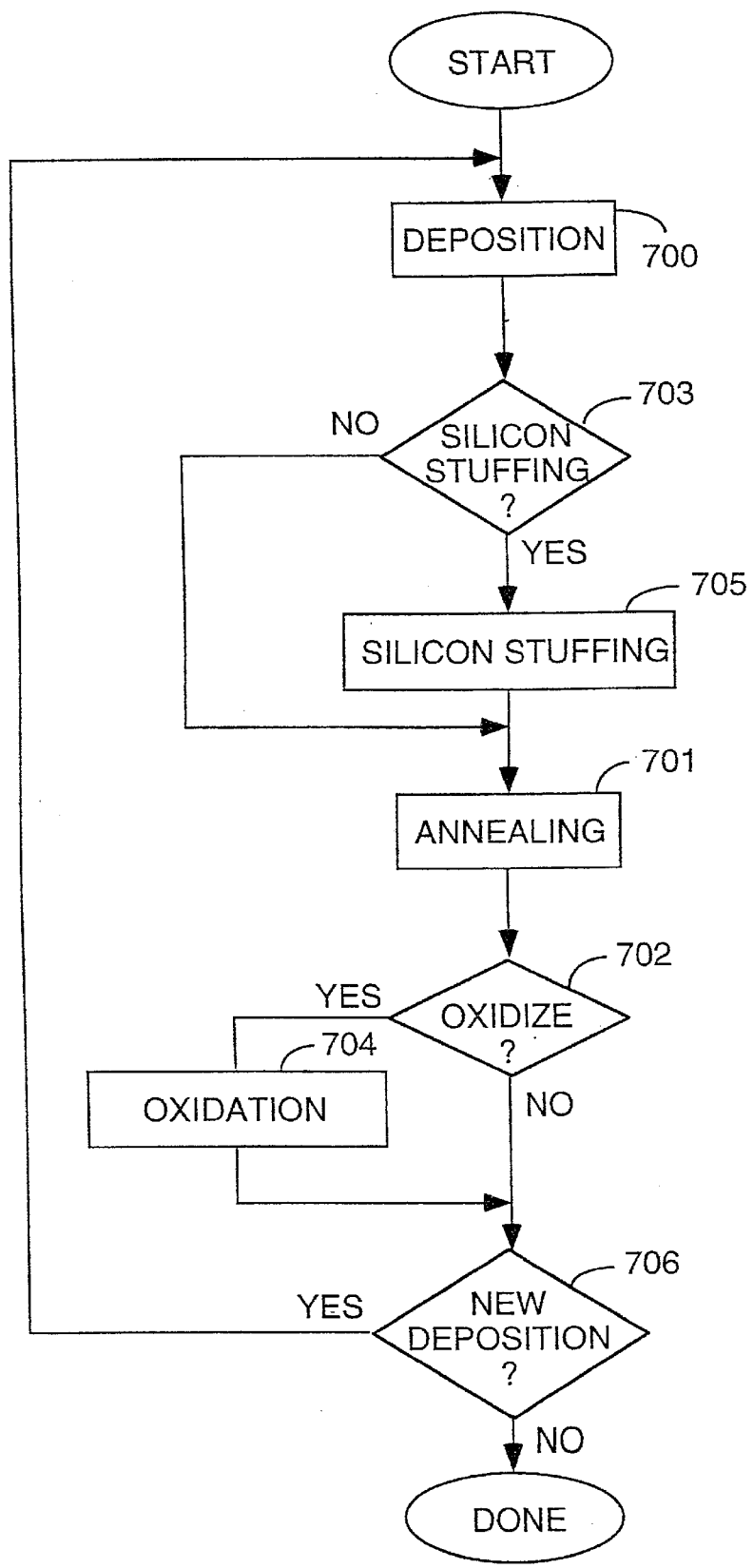
FIG. 50 illustrates a sequence of operations performed by the control unit in FIG. 48 in an alternate embodiment of the present invention.

FIG. 50 illustrates an alternate sequence of process steps that may be performed by the processor unit 605 in response to the program code instructions that it retrieves from the memory 610. This sequence of process steps includes the same steps as shown in FIG. 49. However, the order of the steps is altered to provide for performing the silicon stuffing step 705 prior to the annealing step 701.

Immediately after the deposition step 700 is performed, the processor unit 605 executes instructions in step 703 to determine whether silicon stuffing is to be performed. If it is, then the silicon stuffing step 705 is performed and followed by the annealing step 701. Otherwise, the annealing step 701 is performed. After the annealing step 701, the processor unit 605 determines in step 702 whether oxidation is to be performed. If it is, then the oxidation step 704 is executed. Otherwise, a determination is made, in step 706, whether to perform a new deposition. The determination in step 706 is also made once the oxidation step 704 is completed. If a new deposition is required, the deposition step 700 is executed. Otherwise, the film construction process is completed.

Although the present invention has been described in terms of specific exemplary embodiments, it will be appreciated that various modifications and alterations might be made by those skilled in the art without departing from the spirit and scope of the invention as specified in the following claims.

What is claimed is:

1. A computer readable storage medium having program code embodied therein, said program code for controlling a chamber during a construction of a film on a semiconductor wafer, wherein said chamber includes a gas panel, a heating element, a pressure control unit and an rf signal source, said program code including:

a first program code, said first program code instructs a processor to provide signals to said gas panel, said heating element and said pressure control unit to cause a layer of material to be deposited on a wafer in said chamber;

a second program code, said second program code instructs said processor to provide signals to said gas panel, said heating element, said pressure control unit, and said rf signal source to cause said layer of material to be plasma annealed for a first time; and a third program code, said third program code instructs said processor to provide signals to said gas panel, said heating element, said pressure control unit, and said rf signal source to cause said layer of material to be plasma annealed for a second time.

2. A computer storage medium containing a software routine that, when executed, causes a general purpose computer to control a process chamber using a method of processing a layer on a substrate, where said layer includes carbon, comprising the steps of:

biasing the substrate while exposing the layer to a plasma to reduce an amount of carbon is the layer.

3. The computer storage medium of claim 2 further comprising the step of:

igniting said plasma by applying rf power to an electrode positioned above the substrate and an electrode positioned below the substrate.

4. The computer storage medium of claim 2 wherein the plasma comprises one or more gases selected from nitrogen, argon, neon, and helium.

5. The computer storage medium of claim 4 wherein the plasma comprises a mixture of hydrogen gas and nitrogen gas.

6. The computer storage medium of claim 2 wherein the layer is a nitride layer.

7. A computer storage medium containing a software routine that, when executed, causes a general purpose computer to control a deposition chamber using a method of thin film deposition comprising the steps of:

(a) depositing a first layer of material on a substrate;

(b) applying a bias to the substrate;

(c) exposing the first layer of material to a first plasma to plasma treat the first layer;

(d) depositing a second layer of material on the treated first layer;

(e) applying a bias to the substrate; and (f) exposing the second layer to a second plasma.

8. The computer storage medium of claim 7 further comprising the step of:

igniting said first and second plasmas by applying rf power to an electrode positioned above the substrate and an electrode positioned below the substrate.

9. The computer storage medium of claim 7 wherein the plasma comprises one or more gases selected from nitrogen, argon, neon, and helium.

10. The computer storage medium of claim 8 wherein the plasma comprises a mixture of hydrogen gas and nitrogen gas.

11. The computer storage medium of claim 7 wherein the first layer of material and the second layer of material are nitride layers.

* * * * *